(12) United States Patent
Liu et al.

(10) Patent No.: US 12,145,952 B2
(45) Date of Patent: Nov. 19, 2024

(54) HETEROATOM- AND CYCLOALKYL-CONTAINING ORGANIC COMPOUND AND ORGANIC ELECTROLUMINESCENT DEVICE CONTAINING COMPOUND

(71) Applicant: Shijiazhuang Chengzhi Yonghua Display Material Co., Ltd., Hebei (CN)

(72) Inventors: Songyuan Liu, Hebei (CN); Zaifeng Xie, Hebei (CN); Zhe Shao, Hebei (CN); Jiacheng Zhang, Hebei (CN); Jian Zhang, Hebei (CN); Tianyu Wei, Hebei (CN)

(73) Assignee: SHIJIAZHUANG CHENGZHI YONGHUA DISPLAY MATERIAL CO., LTD., Hebei (CN)

( * ) Notice: Subject to any disclaimer, the term of this patent is extended or adjusted under 35 U.S.C. 154(b) by 0 days.

(21) Appl. No.: 18/535,534

(22) Filed: Dec. 11, 2023

(65) Prior Publication Data
US 2024/0158419 A1    May 16, 2024

(30) Foreign Application Priority Data
Apr. 12, 2023  (CN) .......................... 202310388728.5

(51) Int. Cl.
| C07F 5/02 | (2006.01) |
| H10K 50/12 | (2023.01) |
| H10K 50/15 | (2023.01) |
| H10K 50/16 | (2023.01) |
| H10K 85/60 | (2023.01) |

(52) U.S. Cl.
CPC .............. *C07F 5/02* (2013.01); *H10K 50/12* (2023.02); *H10K 50/15* (2023.02); *H10K 50/16* (2023.02); *H10K 85/658* (2023.02)

(58) Field of Classification Search
CPC .......... C07F 5/02; H10K 50/12; H10K 85/658
See application file for complete search history.

(56) References Cited

FOREIGN PATENT DOCUMENTS

| CN | 113416206 A | 9/2021 | |
| CN | 115746039 A | 3/2023 | |
| WO | WO-2021107680 A1 * | 6/2021 | .............. C07F 5/027 |

OTHER PUBLICATIONS

Machine-generated English-language translation of WO-2021107680-A1.*

(Continued)

*Primary Examiner* — Vu A Nguyen
(74) *Attorney, Agent, or Firm* — Paratus Law Group, PLLC

(57) ABSTRACT

The present invention discloses a heteroatom- and cycloalkyl-containing organic compound and an organic electroluminescent device containing the compound. The general structural formula of the organic compound is as represented by Formula I. The organic compound has a boron-nitrogen structure with multiple resonance effect, wherein a cycloalkyl-containing fluorenyl structure is introduced on the basis of the boron-nitrogen structure. The molecular size is greatly expanded by means of the cycloalkyl group, thereby effectively avoiding a concentration quenching effect, while the molecular orientation is enhanced due to the planarity of the fluorenyl group. In order to further improve the efficiency, a heteroatom is introduced to improve the spin coupling effect, and the oscillator strength is enhanced to improve the energy transfer between a host and a guest; furthermore, by means of the heavy atom effect, the conjugation of a luminous moiety is extended while the efficiency is further improved, avoiding excessive photochromic blue shift, so that the organic compound of the present invention has a good efficiency and lifetime performance. Therefore, an organic electroluminescent device manufactured by using the organic compound of the present invention has a good performance in terms of external quantum efficiency and lifetime.

(Continued)

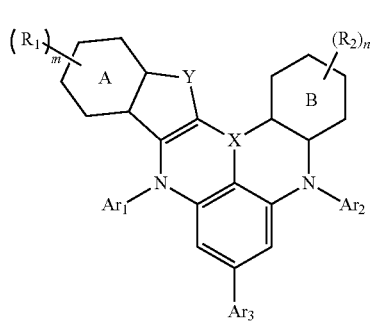

3 Claims, 1 Drawing Sheet

(56) References Cited

OTHER PUBLICATIONS

Jan. 16, 2024, Chinese Office Action issued for related CN Application No. 202310388728.5.
Feb. 23, 2024, Chinese Decision to Grant Patent issued for related CN Application No. 202310388728.5.

* cited by examiner

HETEROATOM- AND CYCLOALKYL-CONTAINING ORGANIC COMPOUND AND ORGANIC ELECTROLUMINESCENT DEVICE CONTAINING COMPOUND

CROSS REFERENCE TO PRIOR APPLICATION

This application claims priority to Chinese Patent Application No. 202310388728.5 (filed on Apr. 12, 2023), which is hereby incorporated by reference in its entirety.

TECHNICAL FIELD

The present invention belongs to the technical field of OLEDs and in particular involves a heteroatom- and cycloalkyl-containing organic compound and an organic electroluminescent device containing the compound.

BACKGROUND ART

In recent years, optoelectronic devices based on organic materials have become more and more popular. Examples of such organic optoelectronic devices include organic light-emitting diodes (OLEDs), organic field effect transistors, organic photovoltaic cells, organic sensors, etc. Among them, OLEDs are developing particularly rapidly and has achieved commercial success in the field of information display. OLEDs can provide red, green and blue colors with high saturation, and full-color display devices made thereof do not need an additional backlight source and have the advantages of dazzling colors, short response time, wide color gamut, high contrast, etc.

The core of an OLED device is a thin film structure containing a variety of organic functional materials. Common functional organic materials include hole injection materials, hole transport materials, hole blocking materials, electron injection materials, electron transport materials, electron blocking materials, light-emitting host materials, light-emitting guests (dyes), etc. When energized, electrons and holes are respectively injected into, transported to and recombined in a light-emitting region, thus generating excitons and emitting light. Organic luminescent materials, the core of OLED display technologies, realize full color gamut based on mixed red-light, green-light and blue-light materials. The development of new luminescent materials is the driving force to promote the continuous progress of electroluminescent technologies and is also a research hotspot in the organic electroluminescent industry. The development of new blue-light organic electroluminescent materials realizes high luminous efficiency and better lifetime of devices. In addition, the development of blue-light luminescent materials focuses on blue-light luminescent materials with a narrow peak width at half height and a high color purity.

In the field of OLED display, red luminescent materials and green luminescent materials are usually phosphorescent materials, while blue-light materials are usually fluorescent materials. On the one hand, since 25% of singlet excitons and 75% of triplet excitons are produced during electroluminescence, which means that even the maximum efficiency of ordinary blue fluorescent materials is only 25%, so other mechanisms are needed in order to utilize 75% of triplet excitons. In recent years, the theoretical internal quantum efficiency can be improved to 100% by means of triplet-triplet fusion, thermally activated delayed fluorescence, etc.; however, larger-plane conjugated groups used by such molecules simultaneously cause significant concentration quenching effect. On the other hand, organic photoelectric materials show isotropic characteristics during film formation, so that lost of the light emitted by the materials easily occurs inside the device. Hence, it is urgent to develop a material with a high efficiency and a long lifetime.

SUMMARY OF THE INVENTION

In view of the above problems existing in the prior art, the present invention provides a heteroatom- and cycloalkyl-containing organic compound and an organic electroluminescent device containing the compound.

In order to achieve the above objective, the technical solution used by the present invention comprises the following content:

In a first aspect of the present invention, there is provided a heteroatom- and cycloalkyl-containing organic compound. The organic compound has a general structural formula as represented by Formula I:

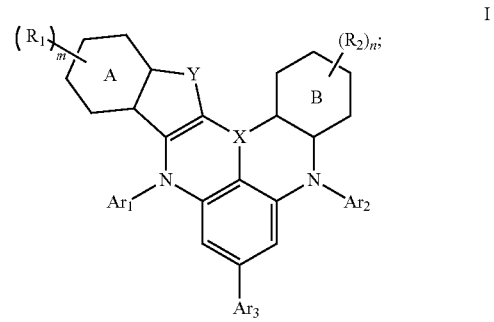

wherein ring A represents a substituted or unsubstituted aryl group with a carbon atom number of $C_6$-$C_{60}$ or a substituted or unsubstituted fused cycloaryl group with a carbon atom number of $C_6$-$C_{60}$;

ring B represents any one of a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, and a substituted or unsubstituted fused heterocycloaryl group with a carbon atom number of $C_5$-$C_{60}$;

X represents B or P=O; Y represents $NR_3$, O, or S;

$R_1$ and $R_2$ each independently represent any one of hydrogen, deuterium, halogen, a substituted or unsubstituted alkyl group with a carbon atom number of $C_1$-$C_{30}$, a substituted or unsubstituted alkenyl group with a carbon atom number of $C_2$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, a substituted or unsubstituted fused heterocycloaryl group with a carbon atom number of $C_5$-$C_{60}$, and a substituted or unsubstituted amino group, and two or more $R_1$ and $R_2$ can be connected to each other to form a ring structure;

$R_3$ represents any one of a substituted or unsubstituted alkyl group with a carbon atom number of $C_1$-$C_{30}$, a substituted or unsubstituted alkoxy group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, and a substituted or unsubstituted fused heterocycloaryl group with a carbon atom number of $C_5$-$C_{60}$;

m and n each independently represent 0, 1, 2, 3, or 4; and when m is 2, 3, or 4, $R_1$ can be the same or different, and when n is 2, 3, or 4, $R_2$ can be the same or different;

one of $Ar_1$ and $Ar_2$ represents a substituted or unsubstituted cycloalkyl-containing fluorenyl group, and the other one of $Ar_1$ and $Ar_2$ represents any one of a substituted or unsubstituted alkyl group with a carbon atom number of $C_1$-$C_{30}$, a substituted or unsubstituted alkenyl group with a carbon atom number of $C_2$-$C_{30}$, a substituted or unsubstituted alkoxy group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, and a substituted or unsubstituted fused heterocycloaryl group with a carbon atom number of $C_5$-$C_{60}$;

when $Ar_2$ does not represent a substituted or unsubstituted cycloalkyl-containing fluorenyl group, $Ar_2$ and ring B can be connected to each other to form a ring; that is, if $Ar_1$ represents a substituted or unsubstituted cycloalkyl-containing fluorenyl group, $Ar_2$ is a structure as defined above other than the substituted or unsubstituted cycloalkyl-containing fluorenyl group, and $Ar_2$ and ring B can be connected to each other to form a ring; on the contrary, if $Ar_2$ represents a substituted or unsubstituted cycloalkyl-containing fluorenyl group, $Ar_1$ is a structure as defined above other than the substituted or unsubstituted cycloalkyl-containing fluorenyl group, and $Ar_2$ and ring B cannot be connected to each other to form a ring;

$Ar_3$ represents one of hydrogen, deuterium, halogen, a substituted or unsubstituted alkyl group with a carbon atom number of $C_1$-$C_{30}$, a substituted or unsubstituted alkoxy group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, a substituted or unsubstituted fused heterocycloaryl group with a carbon atom number of $C_5$-$C_{60}$, and a substituted or unsubstituted amino group;

substituents in ring A, ring B, $R_1$, $R_2$, $R_3$, $Ar_1$, $Ar_2$, and $Ar_3$ can be the same or different and are each independently selected from one of deuterium, halogen, cyano, an alkyl group with a carbon atom number of $C_1$-$C_{10}$, an aryl group with a carbon atom number of $C_6$-$C_{60}$, a heteroaryl group with a carbon atom number of $C_5$-$C_{60}$, a fused cycloaryl group with a carbon atom number of $C_6$-$C_{60}$, a cycloalkyl group with a carbon atom number of $C_3$-$C_{30}$, and an amino group, wherein two or more substituents can be connected to each other to form an aliphatic ring, an aromatic ring, or a condensed ring; and each hydrogen on the compound represented by Formula I can be independently replaced by deuterium.

Furthermore, the compound of Formula I is selected from one of the following structures represented by Formulas I-1 to I-11:

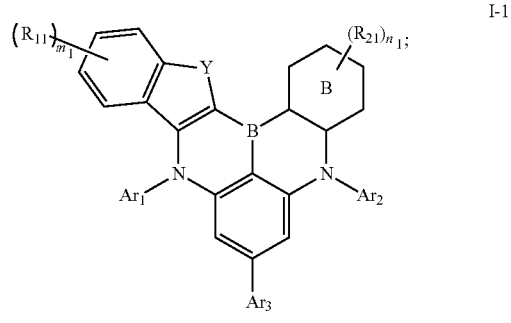

I-1

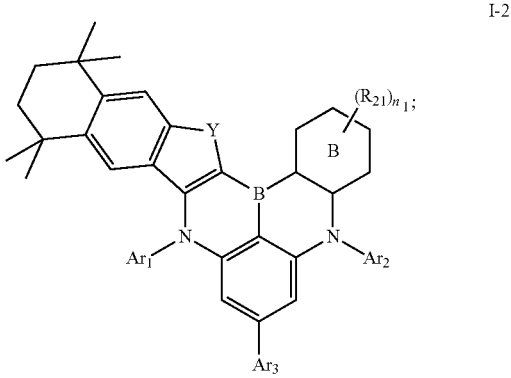

I-2

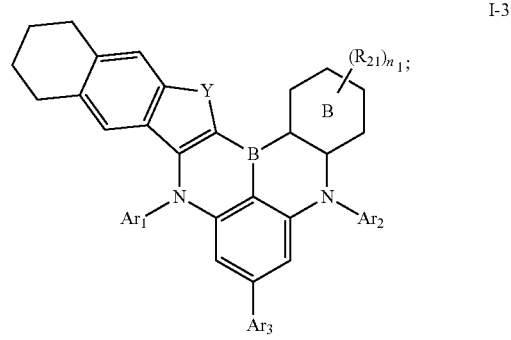

I-3

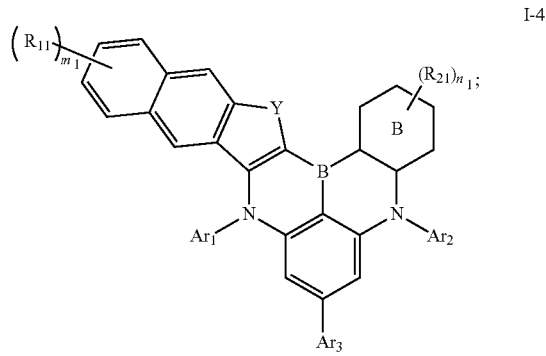

I-4

-continued

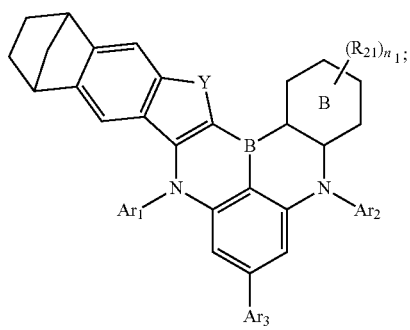
I-5

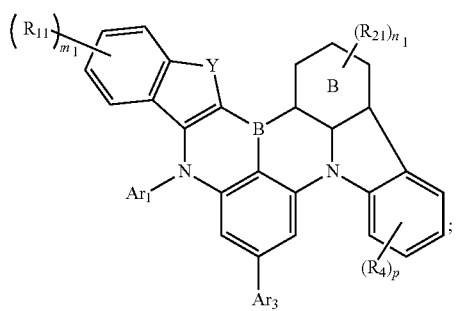
I-6

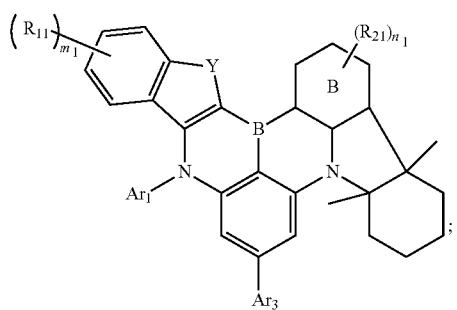
I-7

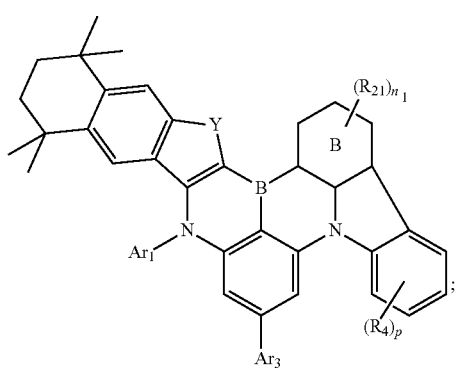
I-8

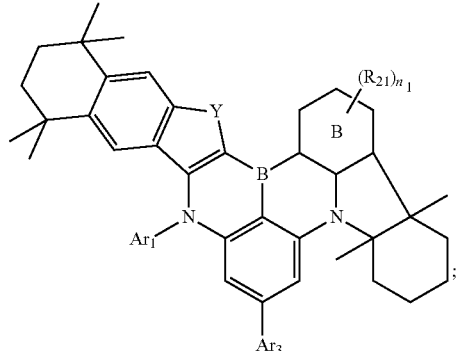
I-9

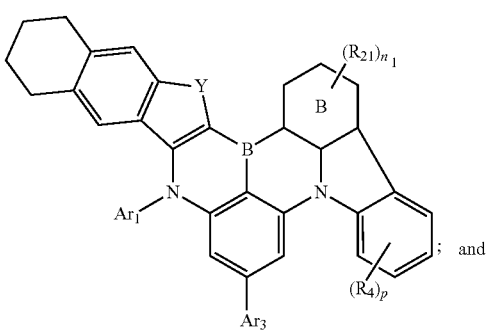
I-10

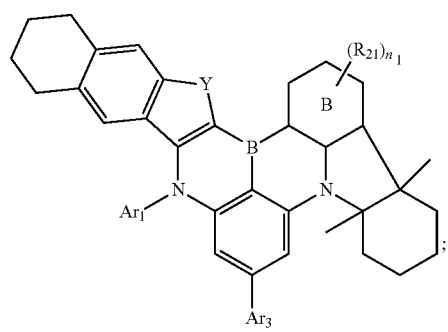
I-11 wherein
ring B represents any one of a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, and a substituted or unsubstituted fused heterocycloaryl group with a carbon atom number of $C_5$-$C_{60}$;

Y represents $NR_3$, O, or S;

each $R_3$ independently represents any one of a substituted or unsubstituted alkyl group with a carbon atom number of $C_1$-$C_{30}$, a substituted or unsubstituted cycloalkyl group with a carbon atom number of $C_3$-$C_{30}$, and a substituted or unsubstituted aryl group with a carbon atom number of $C_6$-$C_{60}$;

$R_{11}$ and $R_4$ represent any one of hydrogen, deuterium, halogen, a substituted or unsubstituted alkyl group with a carbon atom number of $C_1$-$C_{30}$, a substituted or unsubstituted cycloalkyl group with a carbon atom number of $C_3$-$C_{30}$, and a substituted or unsubstituted aryl group with a carbon atom number of $C_6$-$C_{60}$;

$R_{21}$ represents any one of hydrogen, deuterium, halogen, a substituted or unsubstituted alkyl group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, a substituted or unsubstituted fused heterocycloaryl group with a carbon atom number of $C_5$-$C_{60}$, and a substituted or unsubstituted amino group;

$m_1$ and p represent 0, 1, 2, 3, or 4; and when $m_1$ represents 2, 3, or 4, $R_{11}$ can be the same or different, and when p represents 2, 3, or 4, $R_4$ can be the same or different;

$n_1$ represents 0, 1, 2, or 3; and when $n_1$ represents 2 or 3, $R_{21}$ can be the same or different;

$Ar_1$ and $Ar_2$ each independently represent any one of a substituted or unsubstituted alkyl group with a carbon atom number of $C_1$-$C_{30}$, a substituted or unsubstituted alkoxy group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, and a substituted or unsubstituted fused heterocycloaryl group with a carbon atom number of $C_5$-$C_{60}$;

in Formulas I-1 to I-5, one of $Ar_1$ and $Ar_2$ represents a substituted or unsubstituted cycloalkyl-containing fluorenyl group, and in Formulas I-6 to I-11, $Ar_1$ represents a substituted or unsubstituted cycloalkyl-containing fluorenyl group;

$Ar_3$ represents one of hydrogen, deuterium, halogen, a substituted or unsubstituted alkyl group with a carbon atom number of $C_1$-$C_{30}$, a substituted or unsubstituted alkoxy group with a carbon atom number of $C_1$-$C_{30}$, a substituted or unsubstituted cycloalkyl group with a carbon atom number of $C_3$-$C_{30}$, a substituted or unsubstituted aryl group with a carbon atom number of $C_6$-$C_{60}$, a substituted or unsubstituted heteroaryl group with a carbon atom number of $C_5$-$C_{60}$, a substituted or unsubstituted fused cycloaryl group with a carbon atom number of $C_6$-$C_{60}$, a substituted or unsubstituted fused heterocycloaryl group with a carbon atom number of $C_5$-$C_{60}$, and a substituted or unsubstituted amino group;

substituents in ring B, $R_{11}$, $R_{21}$, $R_3$, $R_4$, $Ar_1$, $Ar_2$, and $Ar_3$ can be the same or different and are each independently selected from one of deuterium, halogen, cyano, an alkyl group with a carbon atom number of $C_1$-$C_{10}$, an aryl group with a carbon atom number of $C_6$-$C_{60}$, a heteroaryl group with a carbon atom number of $C_5$-$C_{60}$, a fused cycloaryl group with a carbon atom number of $C_6$-$C_{60}$, and a cycloalkyl group with a carbon atom number of $C_3$-$C_{30}$, wherein two or more substituents can be connected to each other to form an aliphatic ring, an aromatic ring, or a condensed ring; and each hydrogen on the compounds represented by Formulas I-1 to I-11 can be independently replaced by deuterium.

Furthermore, the cycloalkyl-containing fluorenyl group is selected from

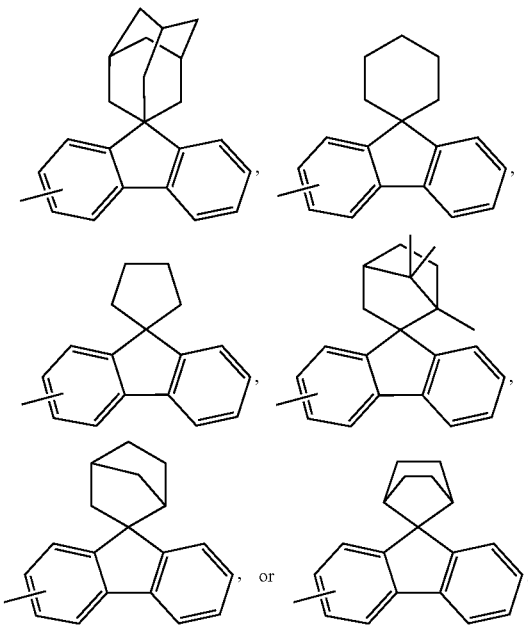

Furthermore, when $Ar_1$ and $Ar_2$ do not represent a cycloalkyl-containing fluorenyl group, each of $Ar_1$ and $Ar_2$ independently represents

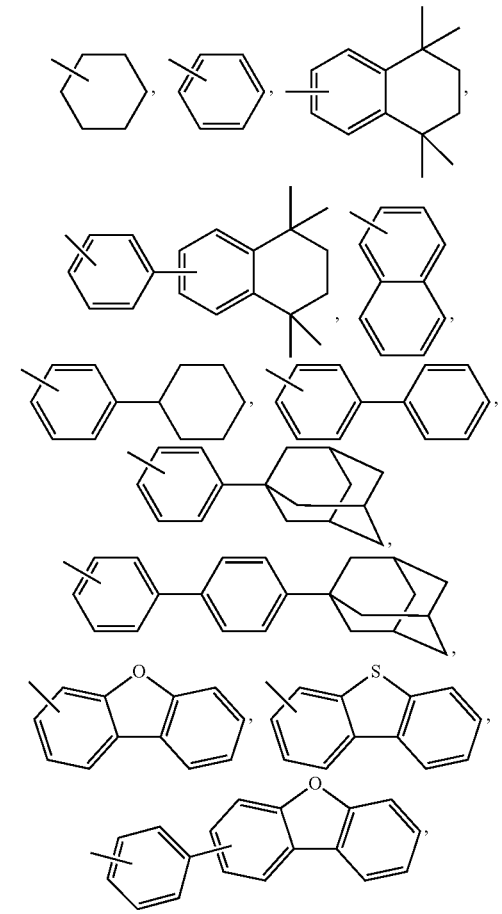

-continued

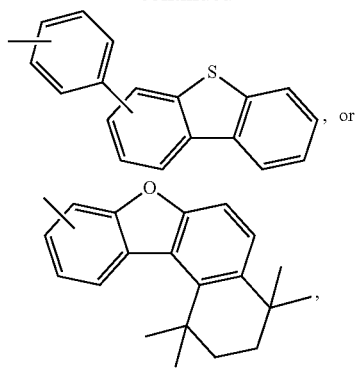, or

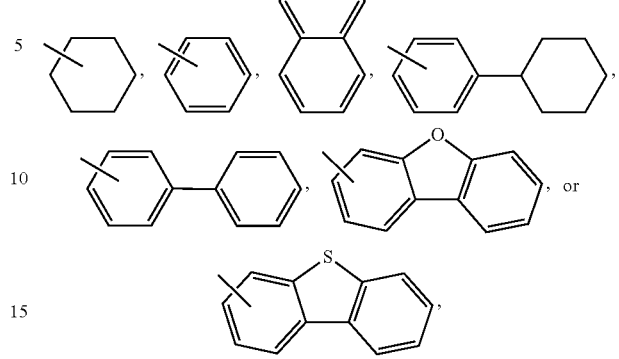

wherein any nonadjacent C in each of the above structures can be each independently replaced by N, and any hydrogen in each of the above structures can be each independently replaced by fluorine, deuterium, cyano, linear alkyl, branched alkyl, cycloalkyl, aryl, heteroaryl, or arylamino.

Furthermore, the amino group is selected from any one of a substituted or unsubstituted alkylamino group with a carbon atom number of $C_1$-$C_{10}$, a substituted or unsubstituted arylamino group with a carbon atom number of $C_6$-$C_{20}$, a substituted or unsubstituted aralkylamino group with a carbon atom number of $C_6$-$C_{20}$, and a substituted or unsubstituted heteroarylamino group with a carbon atom number of $C_2$-$C_{24}$.

Furthermore, ring B represents

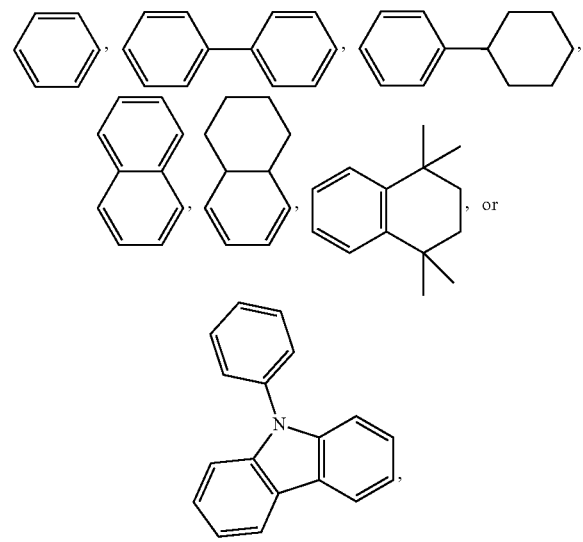

wherein any nonadjacent C in each of the above structures can be each independently replaced by N, and any hydrogen in each of the above structures can be each independently replaced by fluorine, deuterium, cyano, linear alkyl, branched alkyl, cycloalkyl, aryl, heteroaryl, or arylamino.

Furthermore, the arylamino is —$NR_5R_6$, wherein $R_5$ and $R_6$ each independently represent a substituted or unsubstituted linear alkyl or branched alkyl group with a carbon atom number of $C_1$-$C_{10}$, and any hydrogen in each of the above structures can be each independently replaced by fluorine, deuterium, linear alkyl, branched alkyl, cycloalkyl, or phenyl.

Furthermore, $Ar_3$ represents any one of hydrogen, a substituted or unsubstituted linear alkyl or branched alkyl group with a carbon atom number of $C_1$-$C_{10}$,

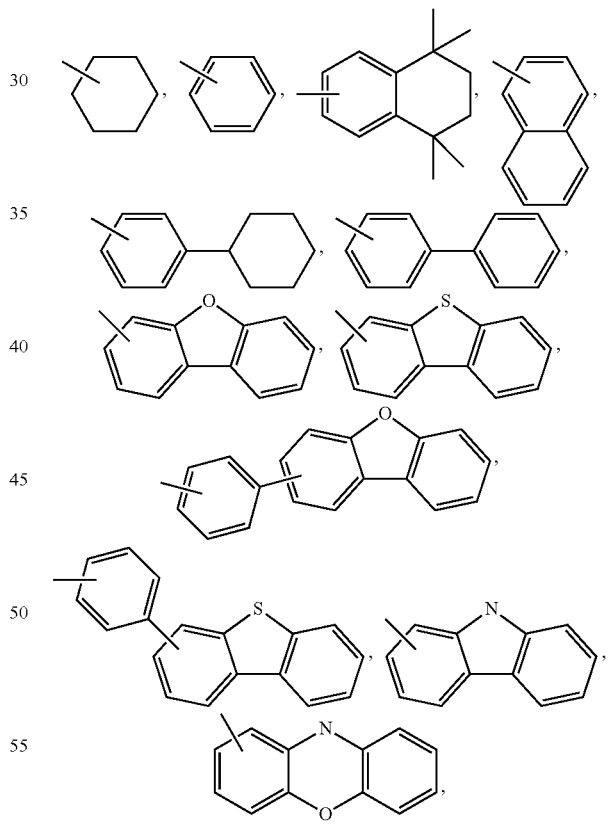

and —$NR_5R_6$, and any hydrogen in each of the above structures of $Ar_3$ can be each independently replaced by fluorine, deuterium, linear alkyl, branched alkyl, cycloalkyl, or phenyl; and $R_5$ and $R_6$ each independently represent a substituted or unsubstituted linear alkyl or branched alkyl group with a carbon atom number of $C_1$-$C_{10}$,

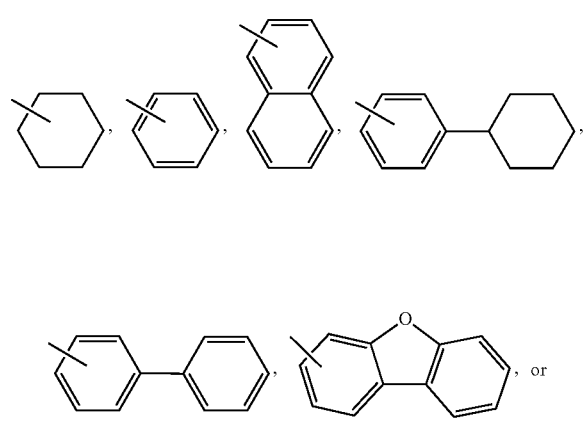
and any hydrogen in each of the above structures of $R_5$ and $R_6$ can be each independently replaced by fluorine, deuterium, linear alkyl, branched alkyl, cycloalkyl, or phenyl.
Furthermore, the compound represented by Formula I is selected from any one of the following compounds:
G-1
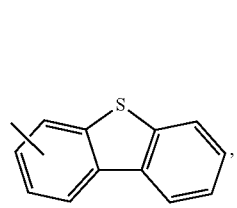
G-2
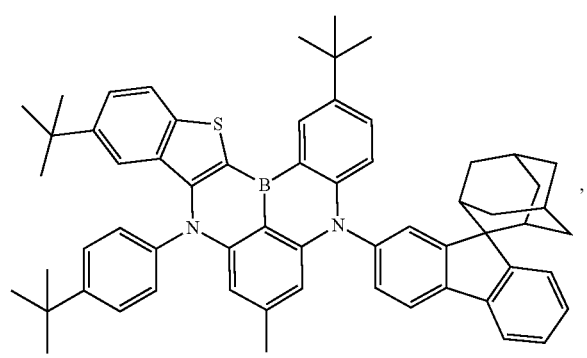
G-3
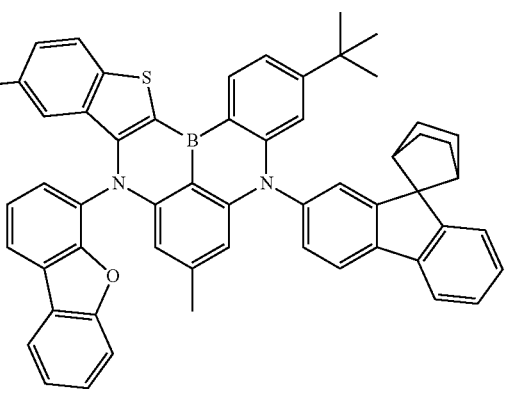
G-4
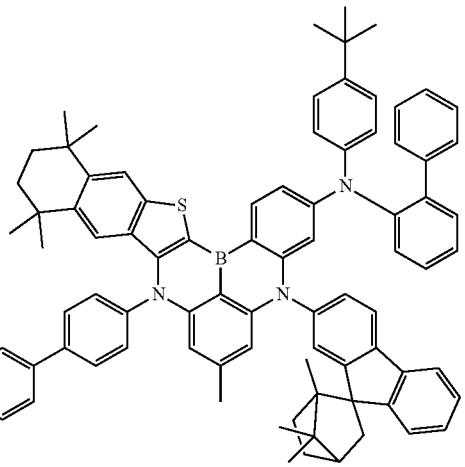
G-5
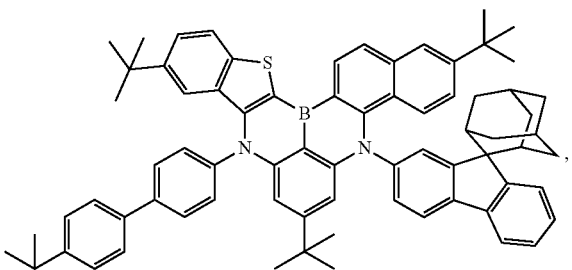
G-6
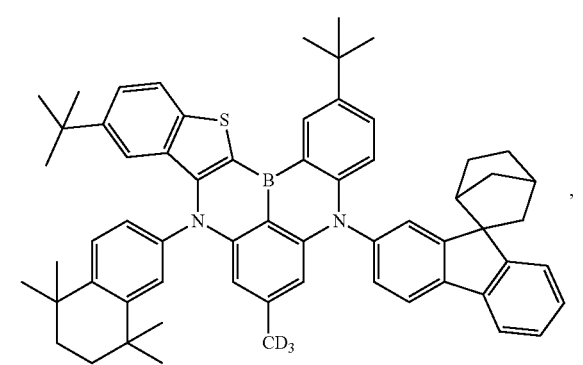
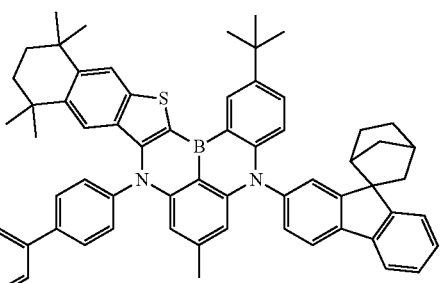

-continued
G-7
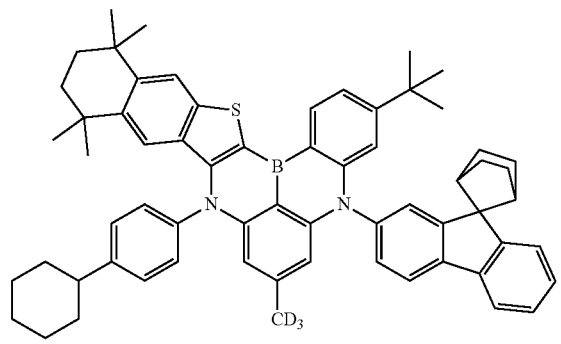
G-8
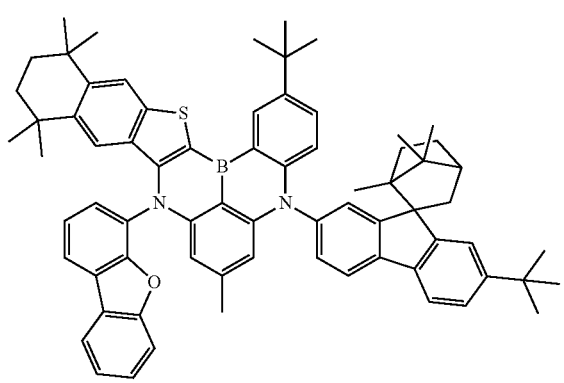
G-9
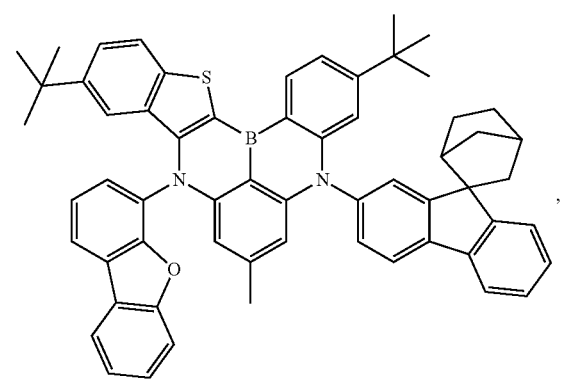
G-10
-continued
G-11
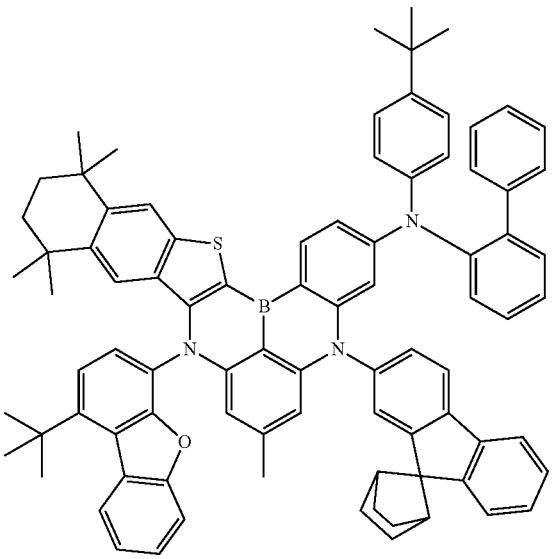
G-12
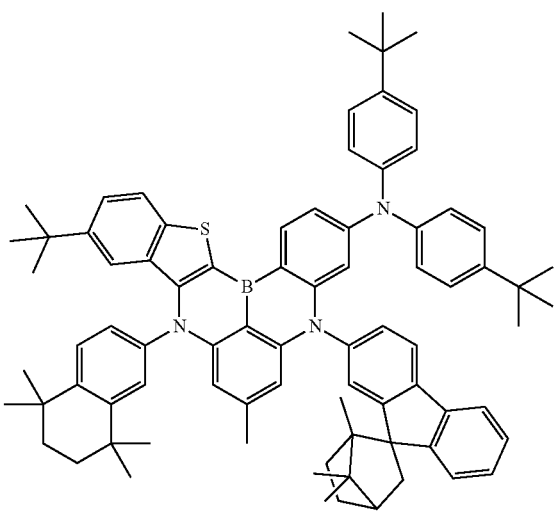
G-13
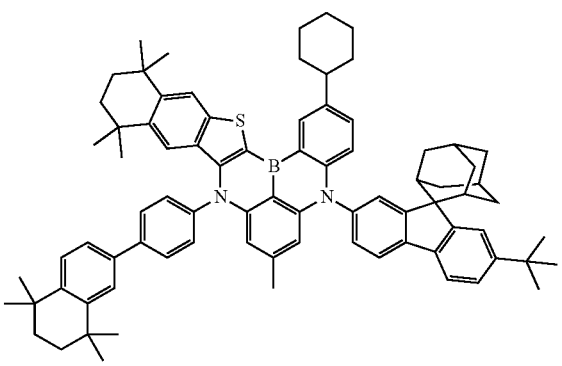

-continued
G-14
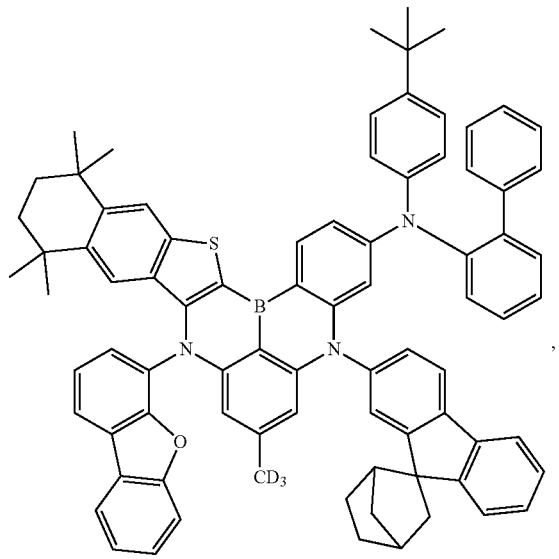
G-15
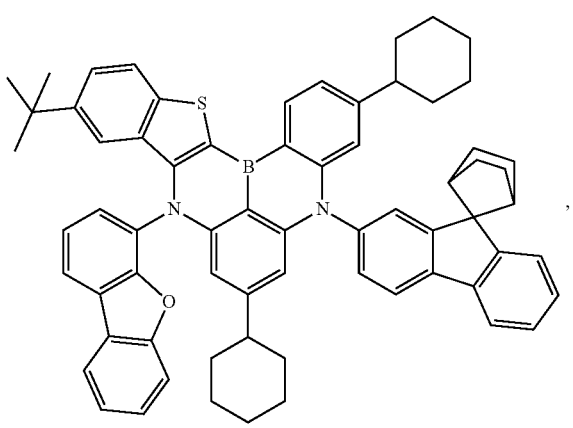
G-16
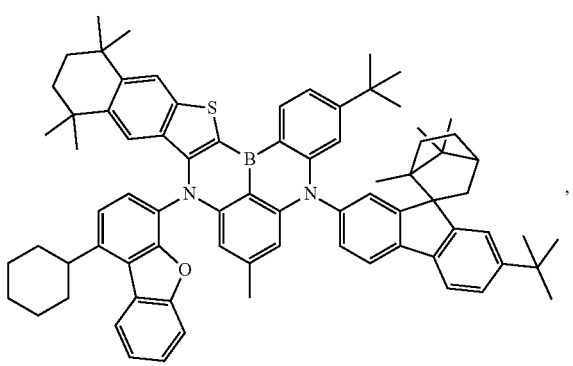
-continued
G-17
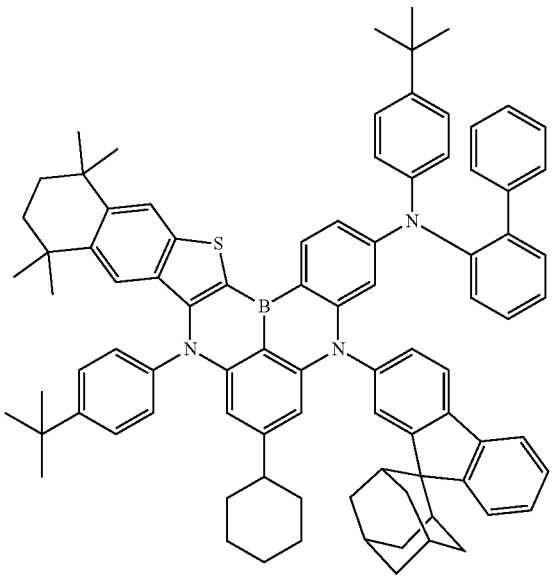
G-18
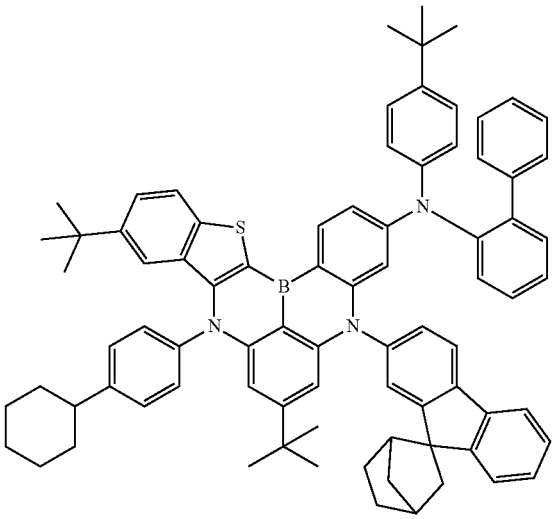
G-19
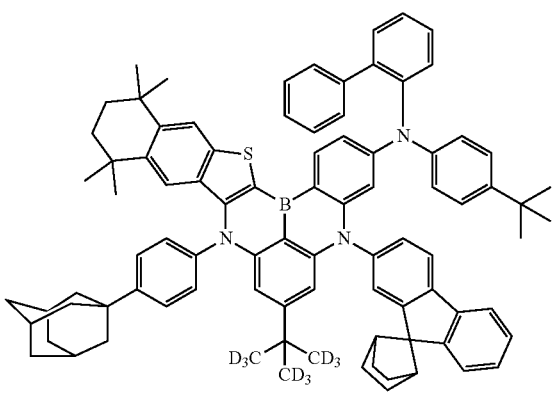

-continued
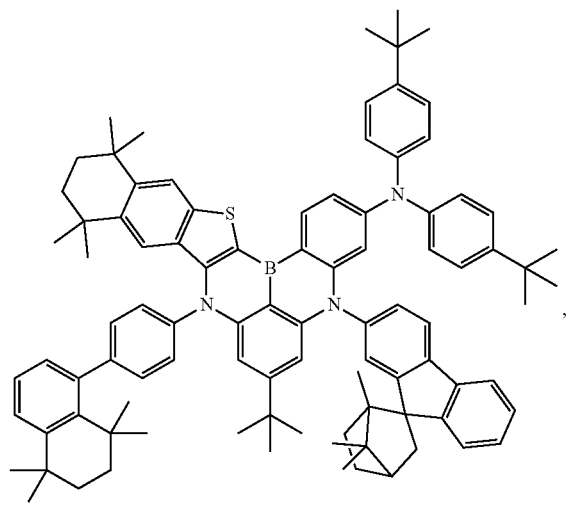
G-20
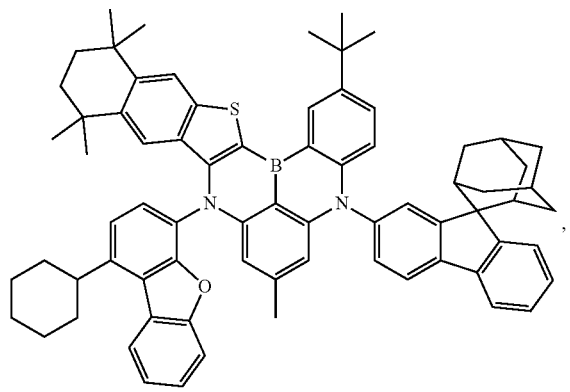
G-21
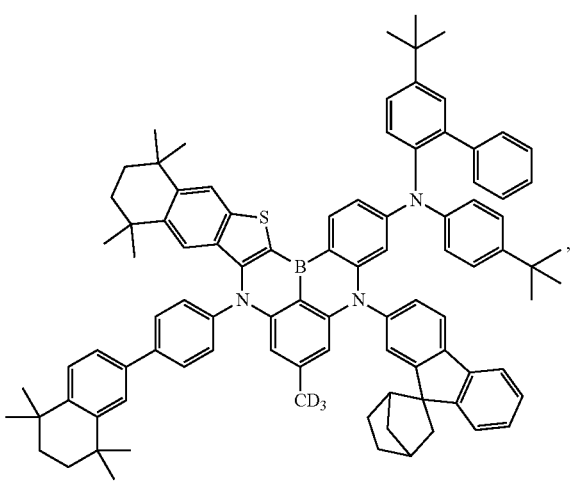
G-22
-continued
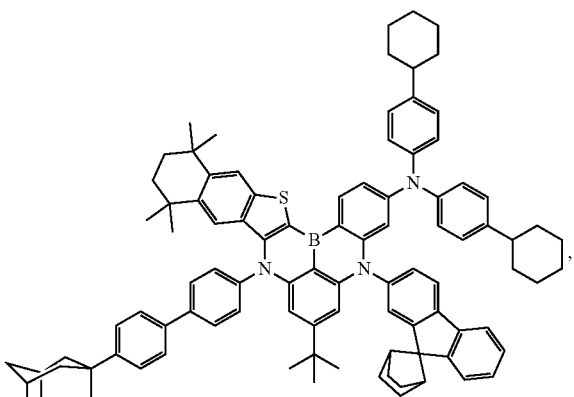
G-23
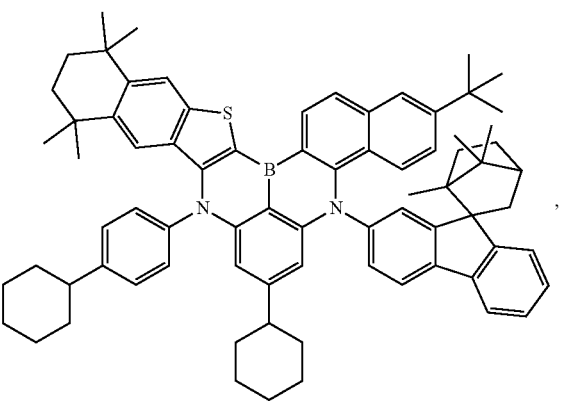
G-24
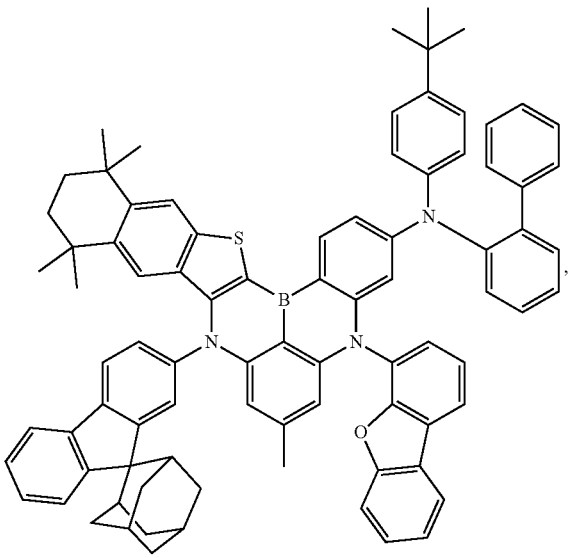
G-25

-continued
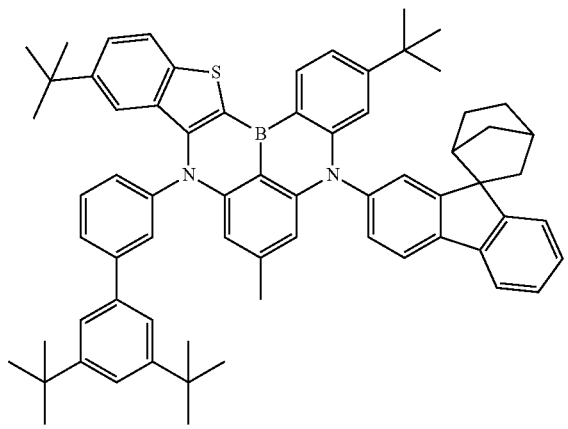
G-26
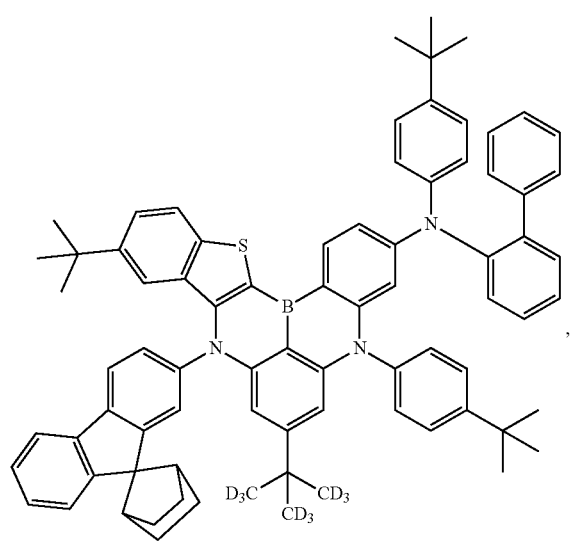
G-27
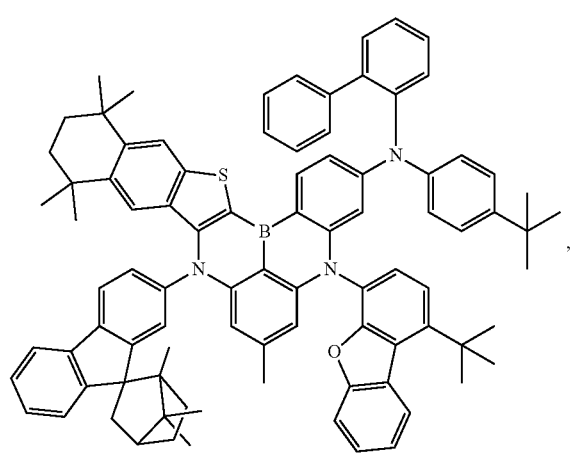
G-28
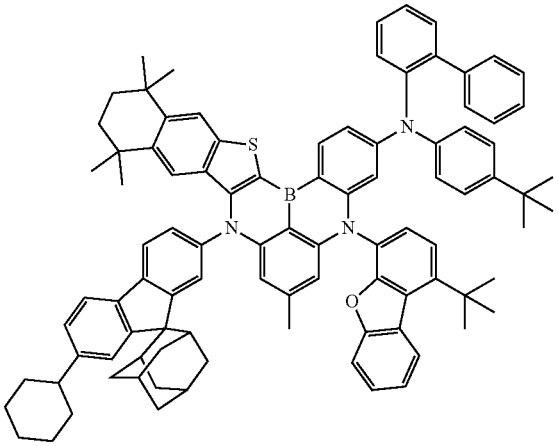
G-29
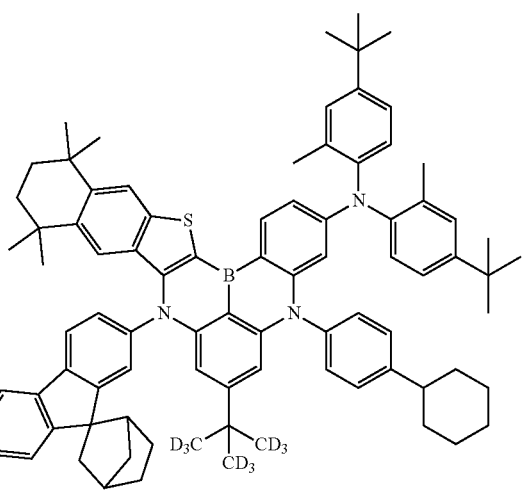
G-30
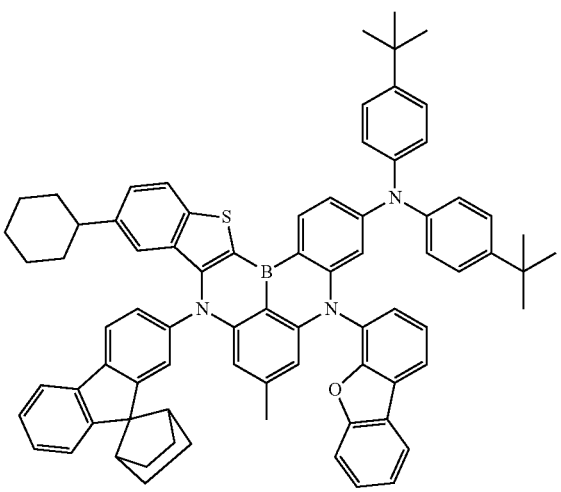
G-31

-continued
G-32
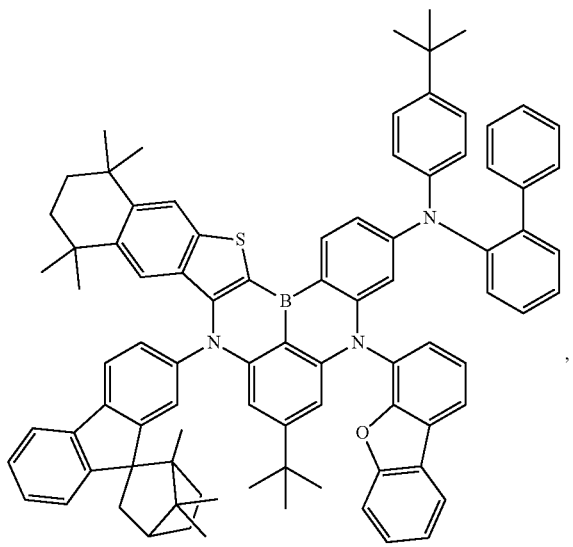
G-33
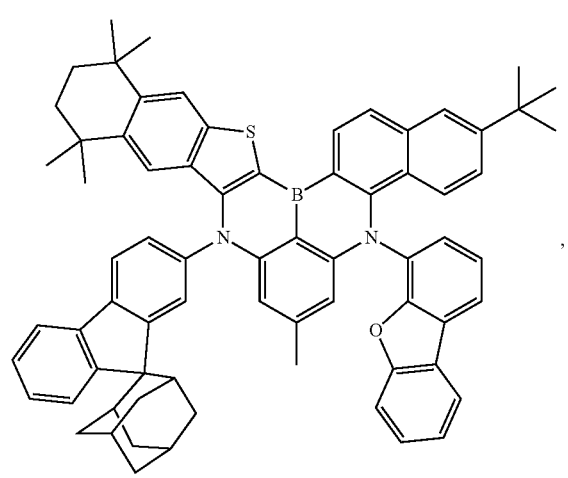
G-34
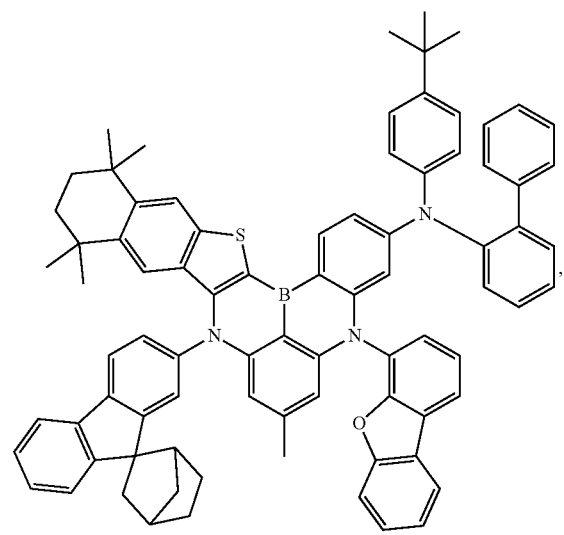
-continued
G-35
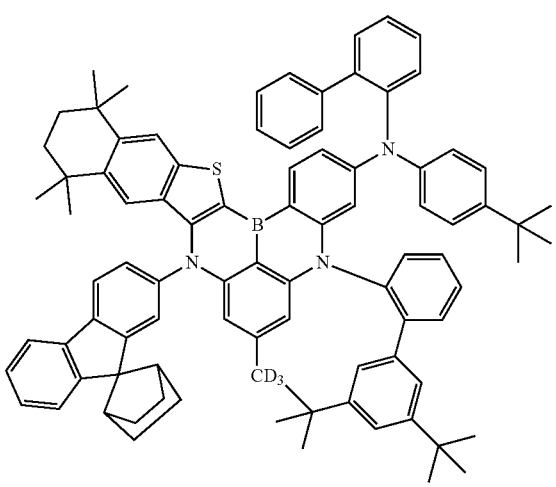
G-36
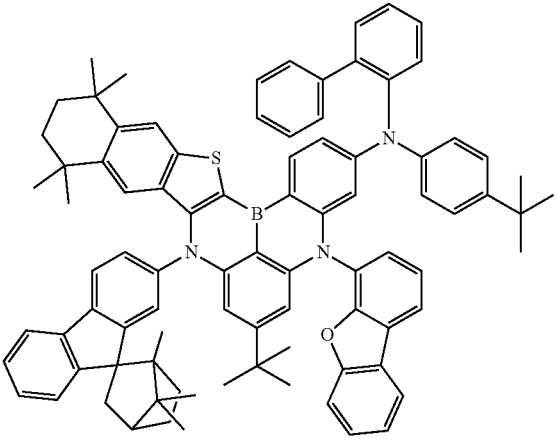
G-37
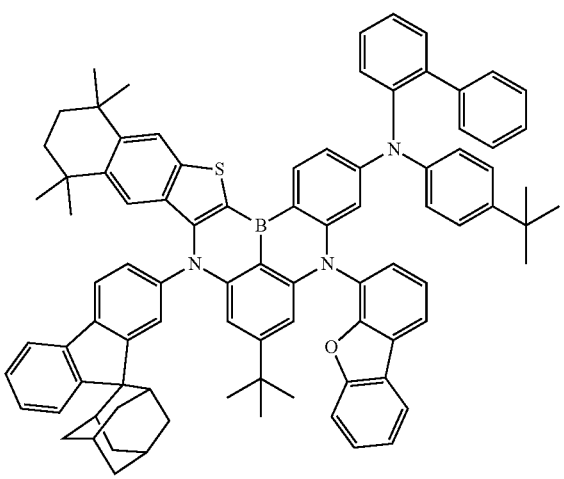

G-38
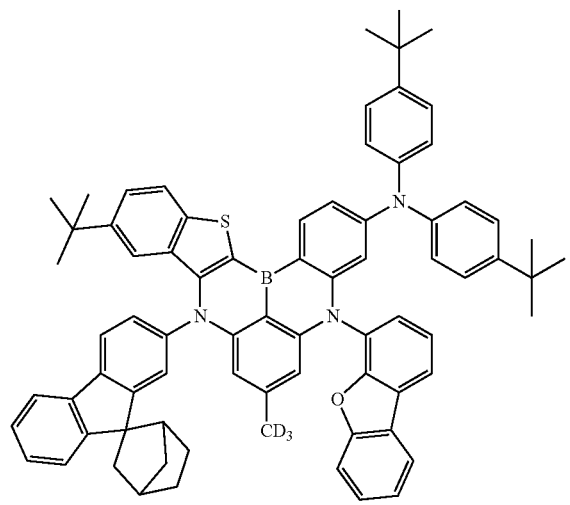
G-41
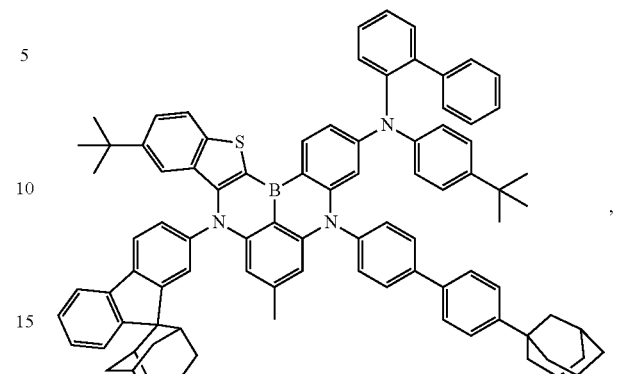
G-39
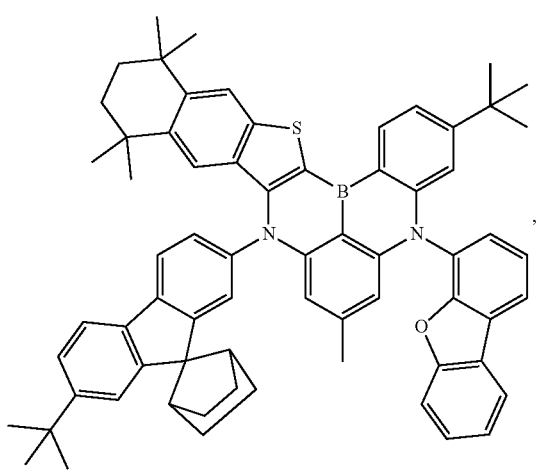
G-42
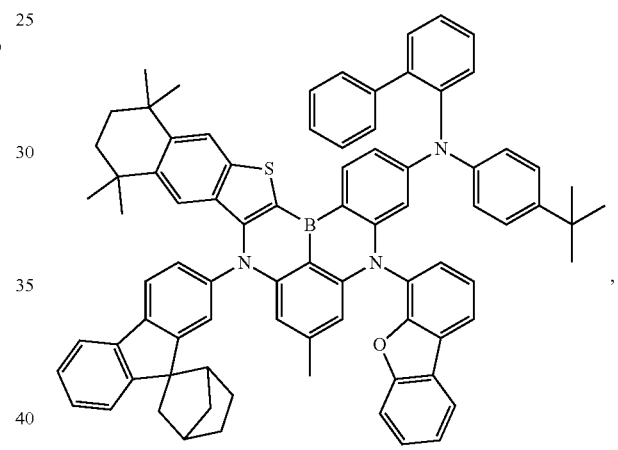
G-40
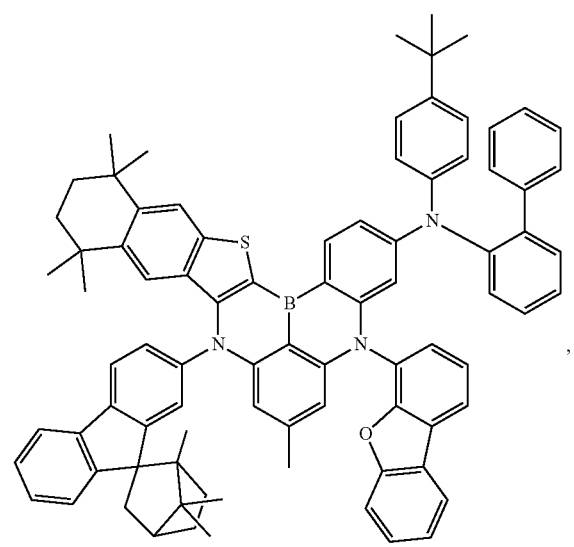
G-43
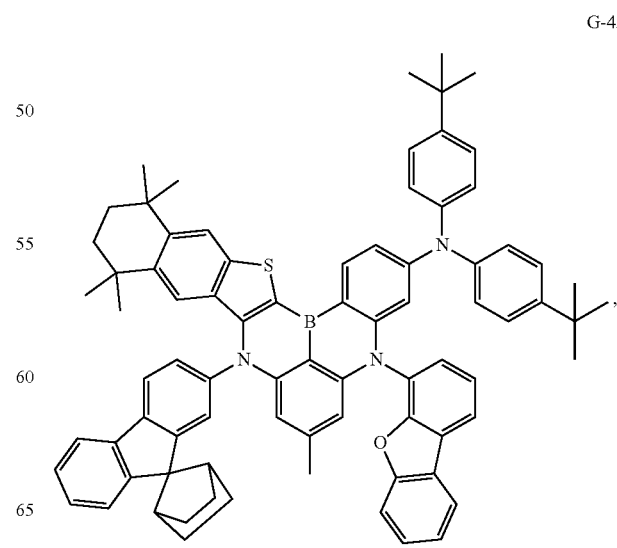

G-44
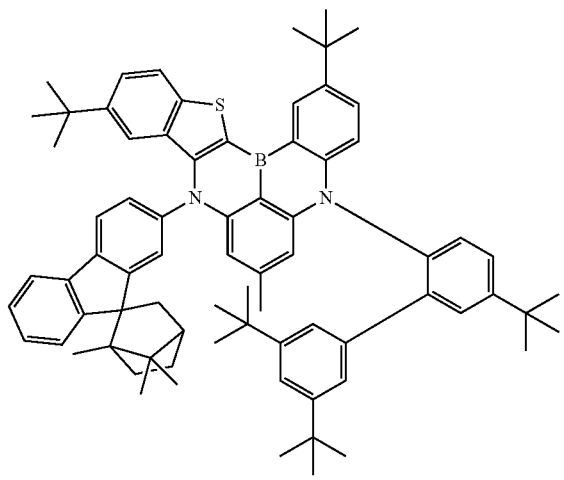
G-45
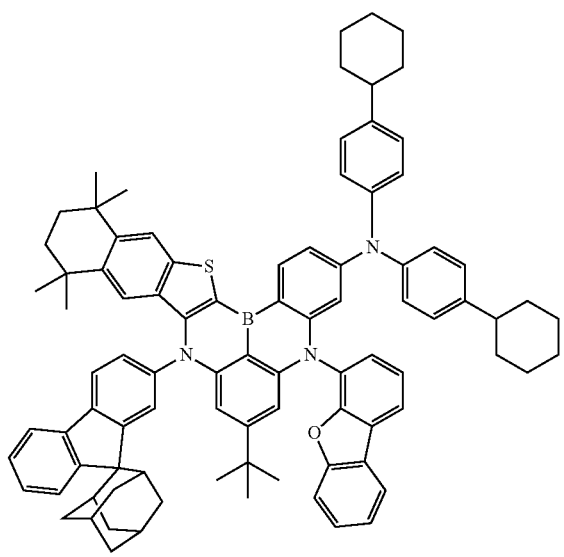
G-46
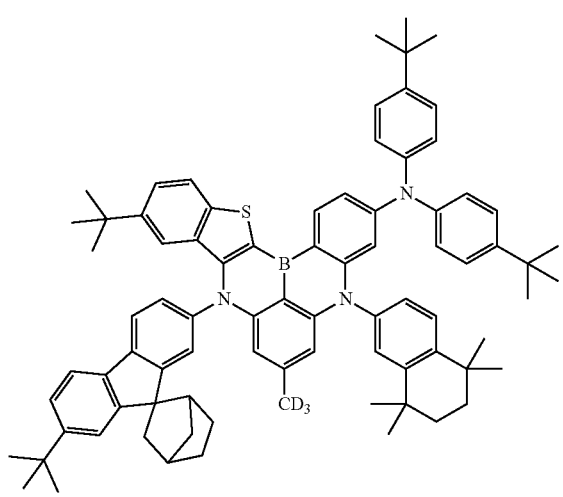
G-47
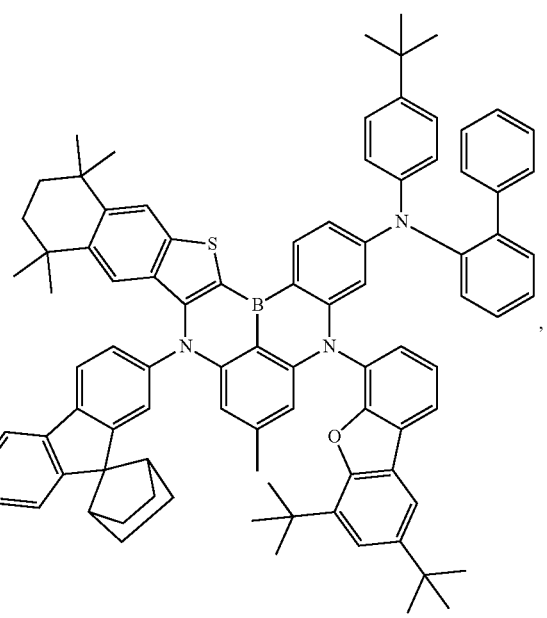
G-48
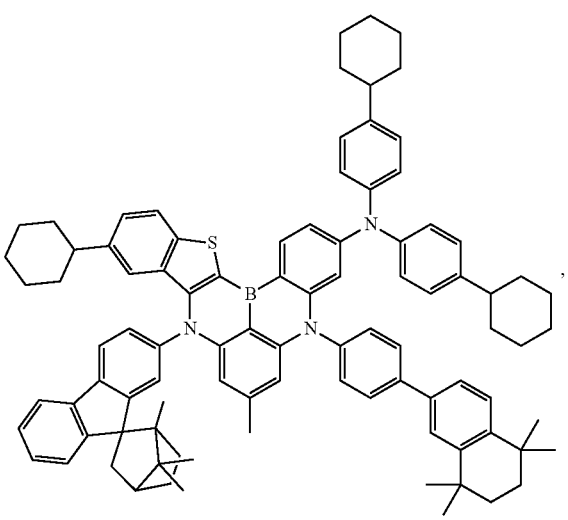
G-49
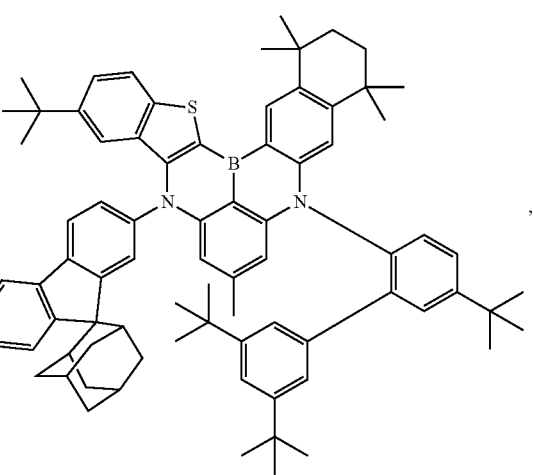

G-50
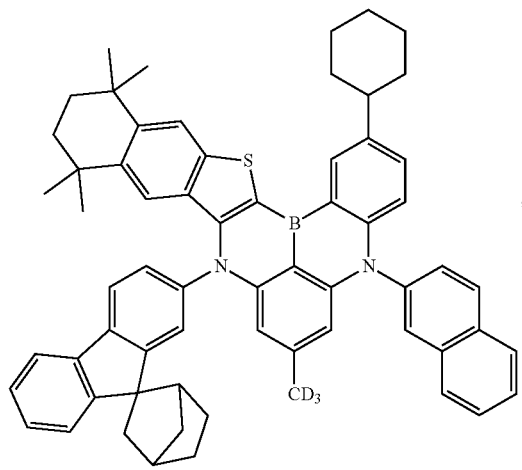
G-51
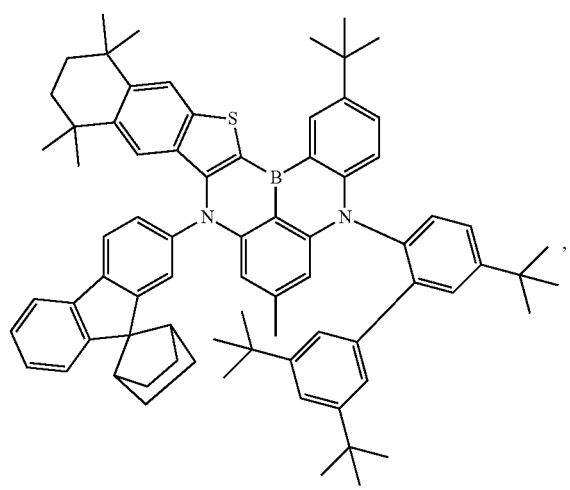
G-52
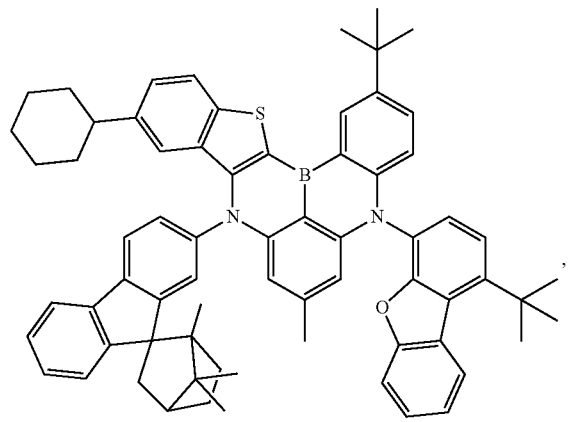
G-53
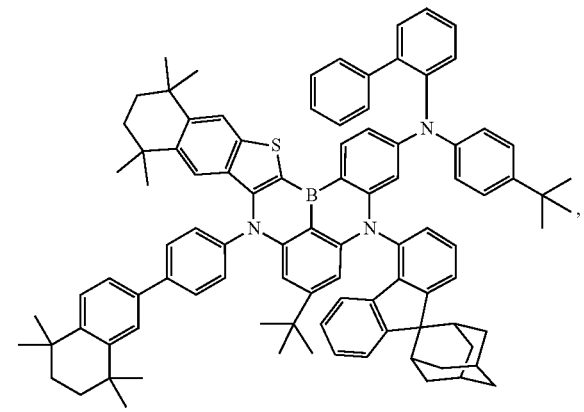
G-54
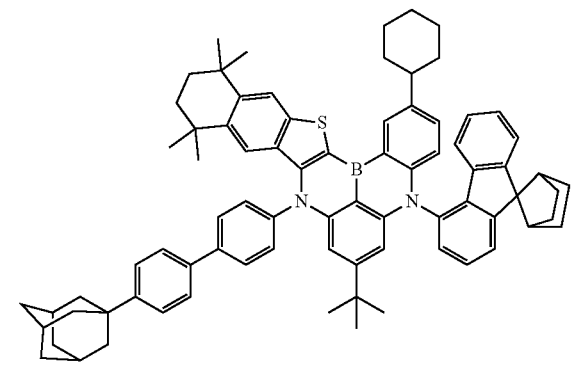
G-55

-continued
G-56
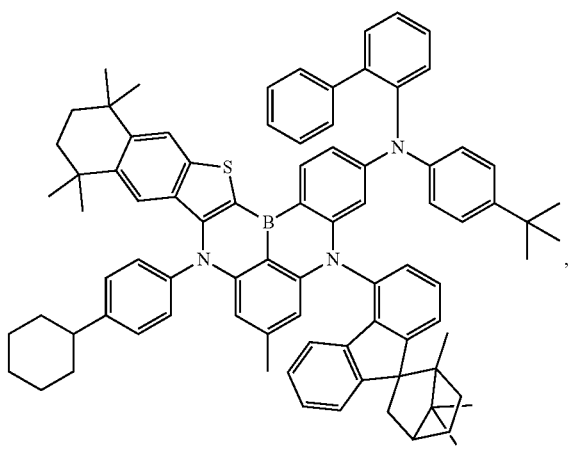
G-57
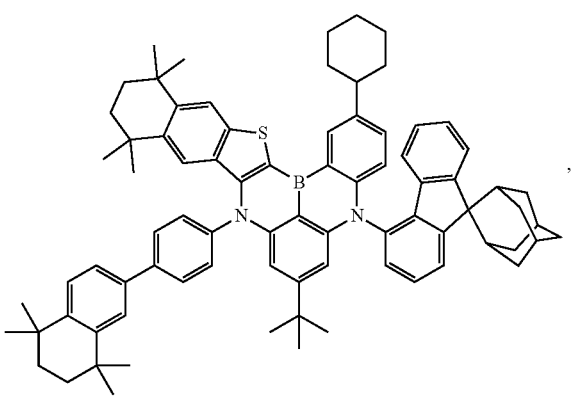
G-58
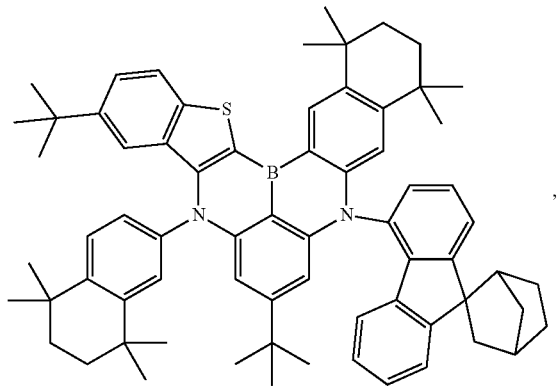
-continued
G-59
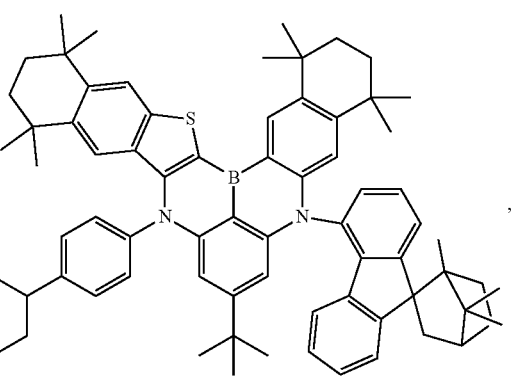
G-60
G-61
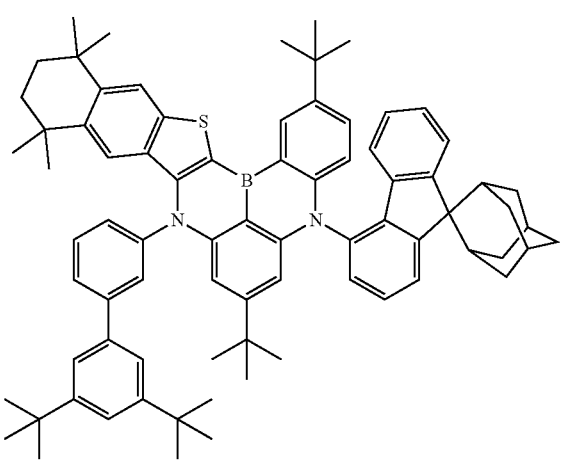

G-62
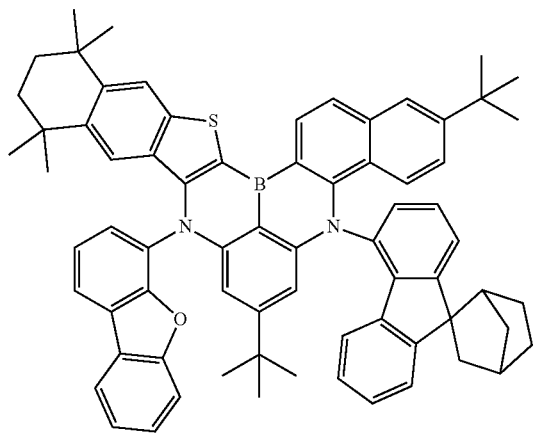
G-63
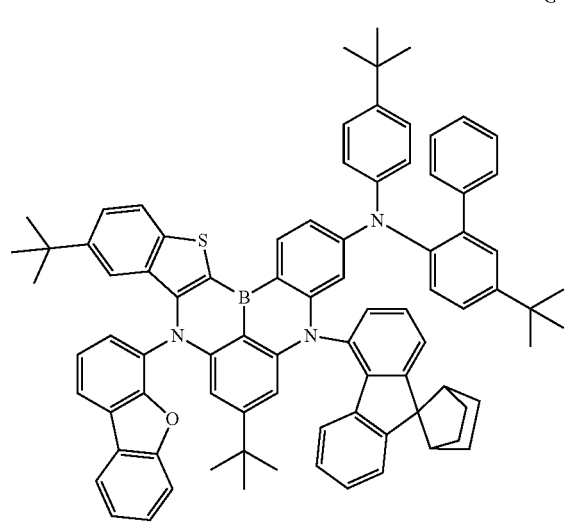
G-64
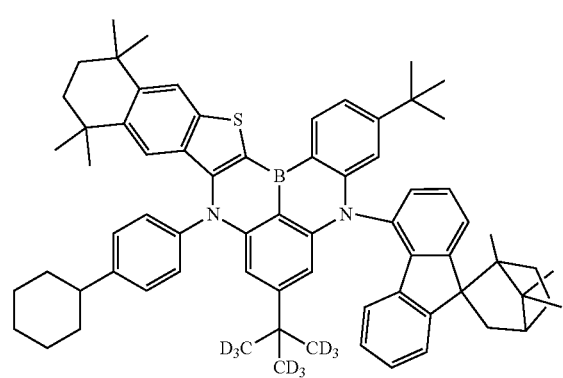
G-65
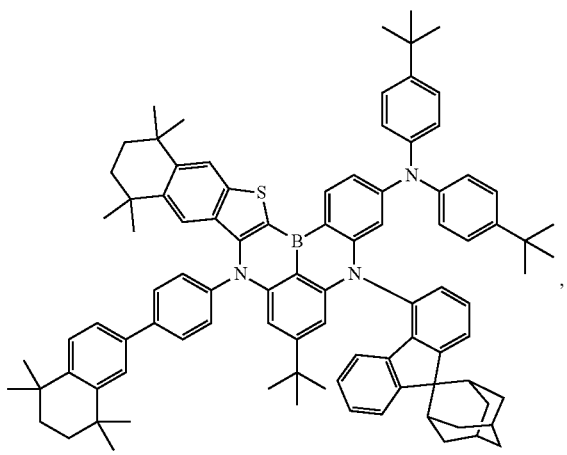
G-66
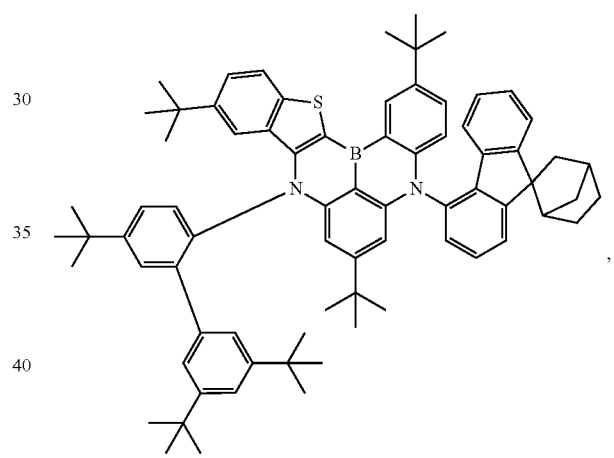
G-67
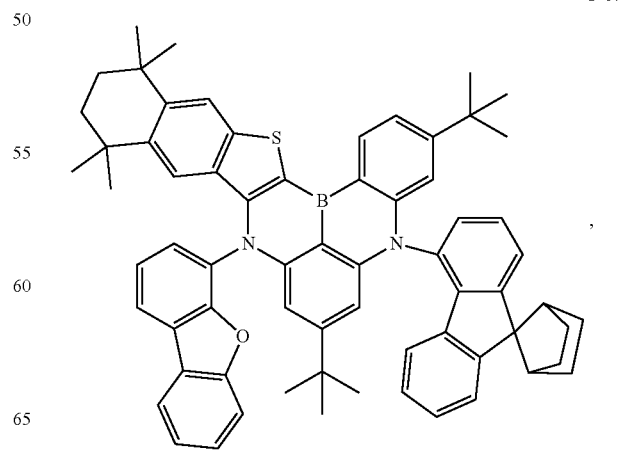

-continued
G-68
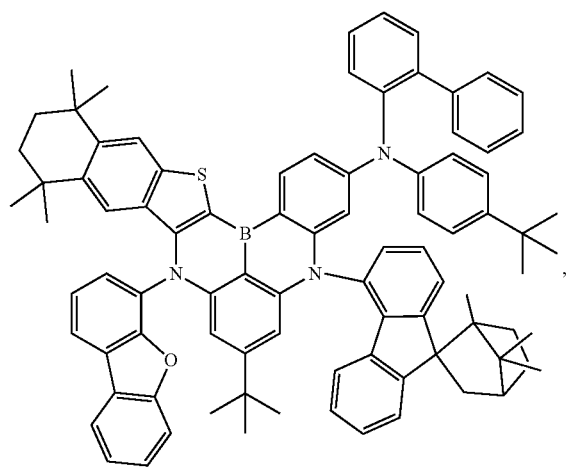
G-69
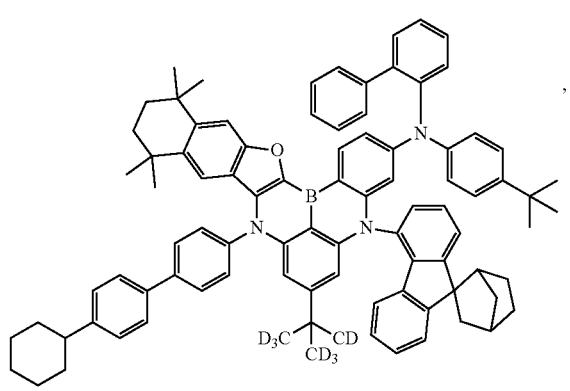
G-70
-continued
G-71
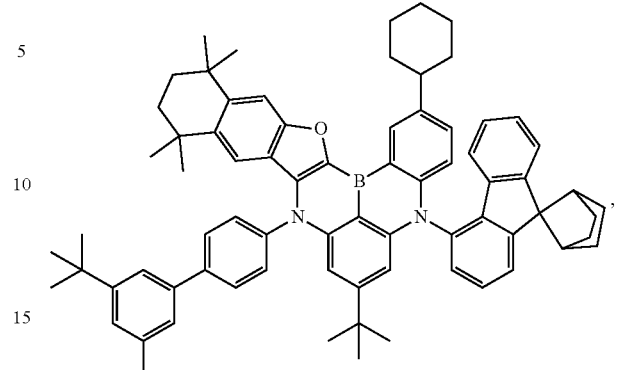
G-72
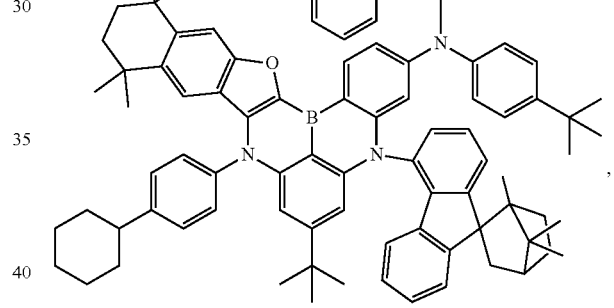
G-73
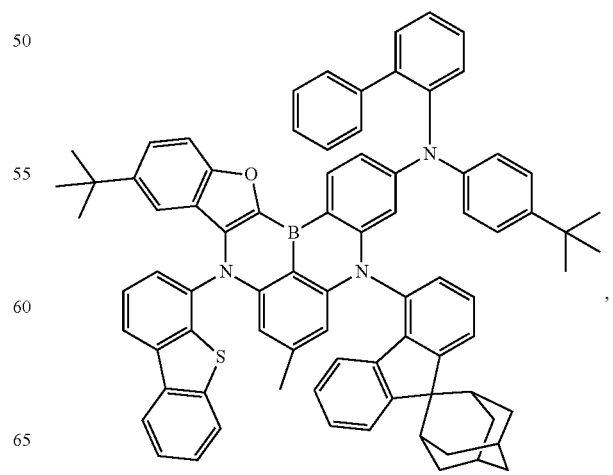

G-74
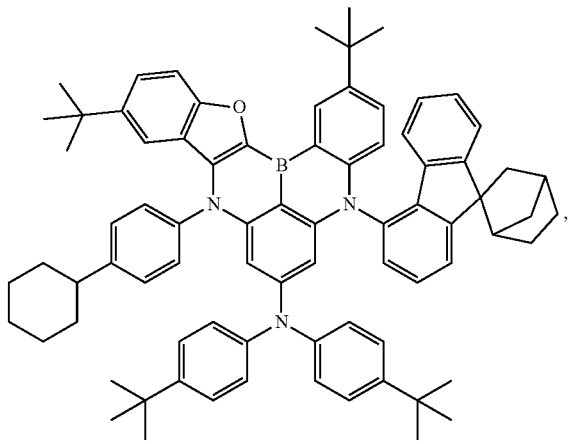
G-75
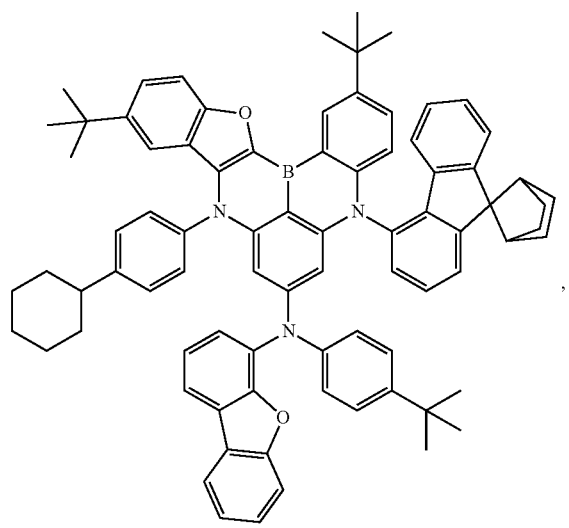
G-76
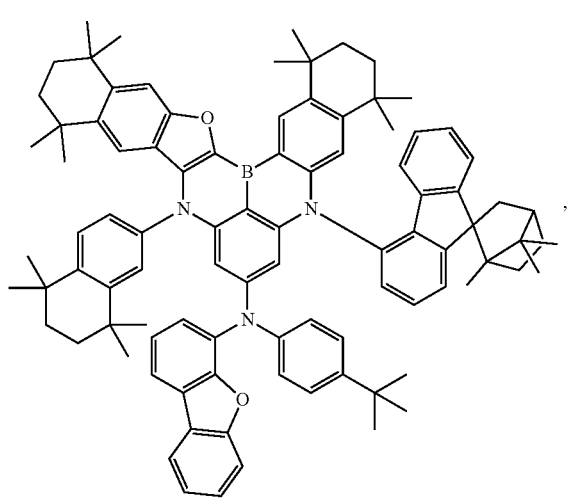
G-77
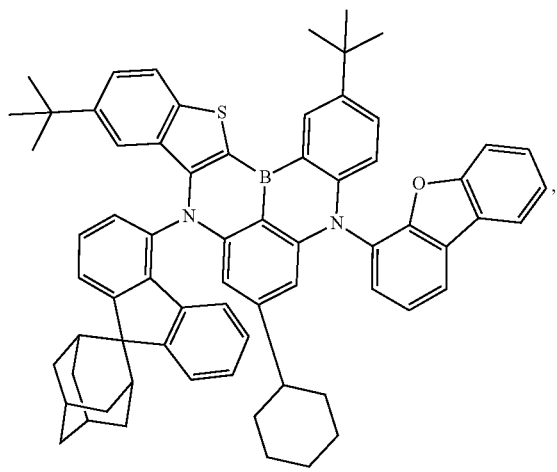
G-78
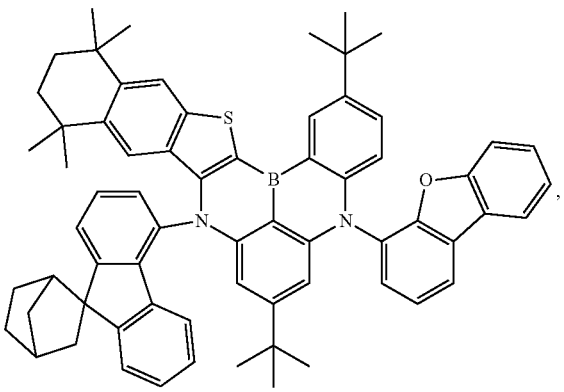
G-79
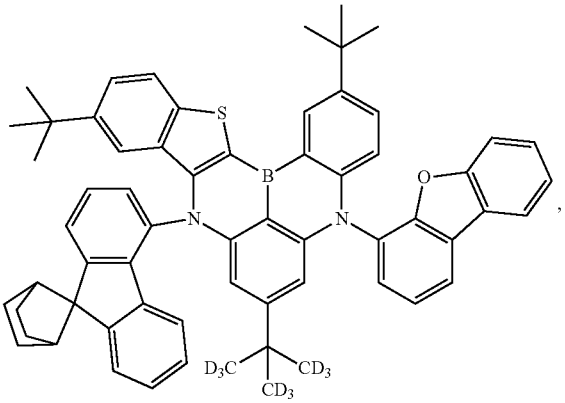

-continued
G-80
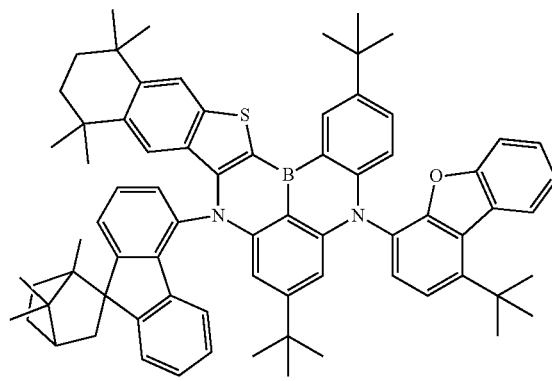
G-81
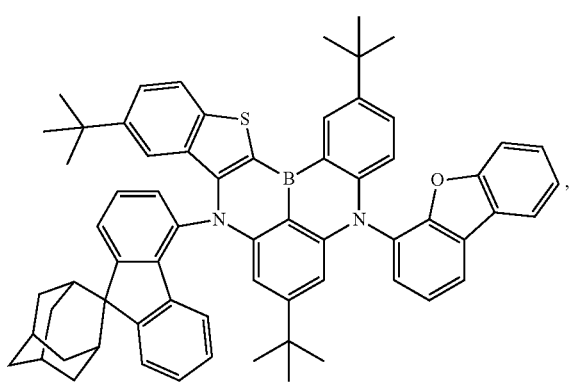
G-82
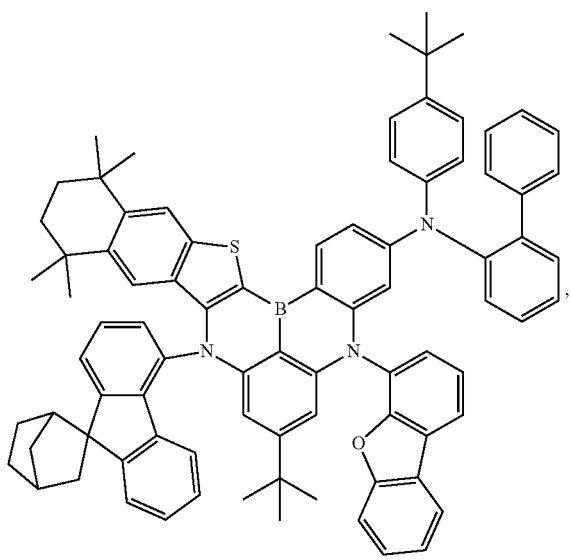
-continued
G-83
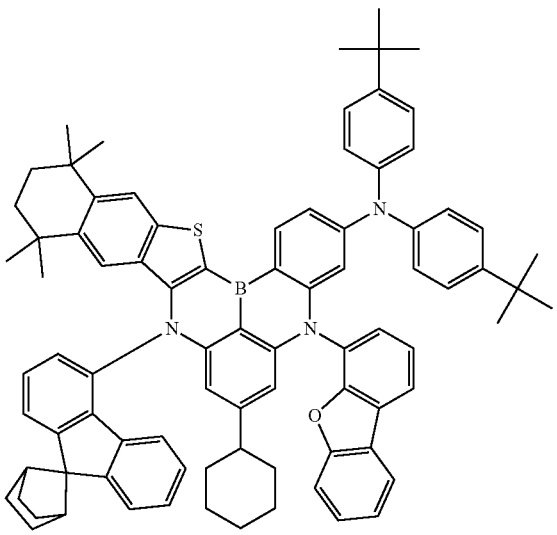
G-84
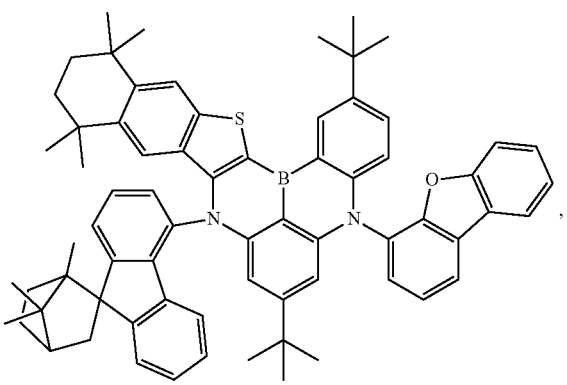
G-85
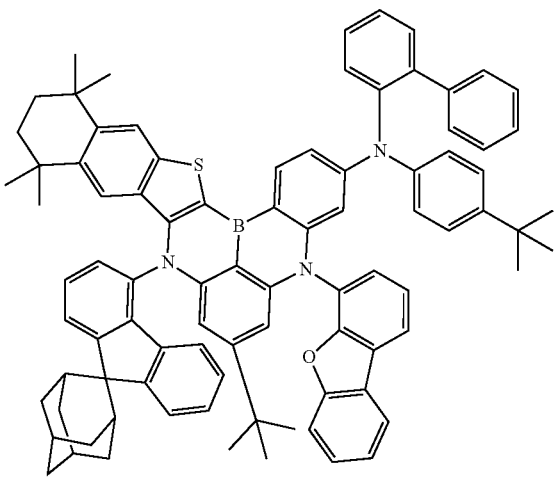

-continued
G-86
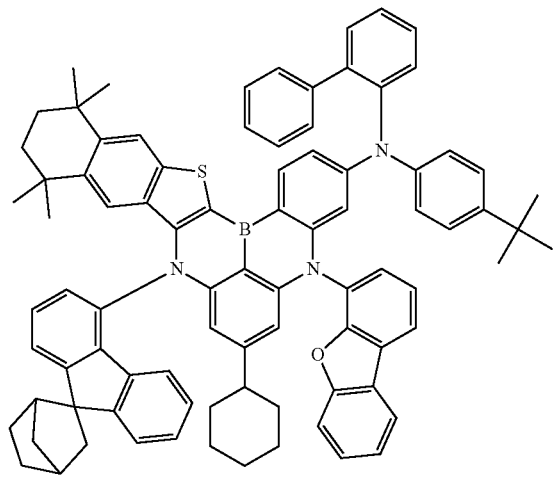
G-87
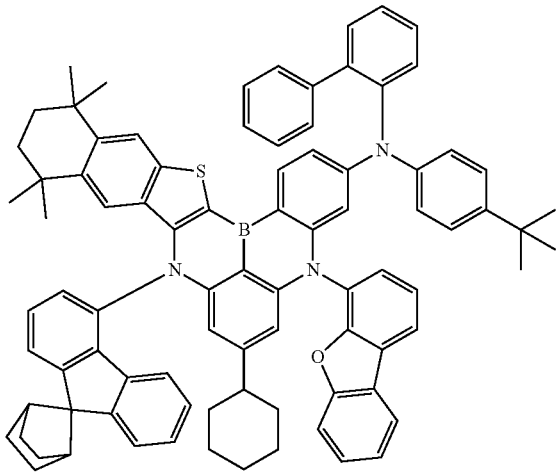
G-88
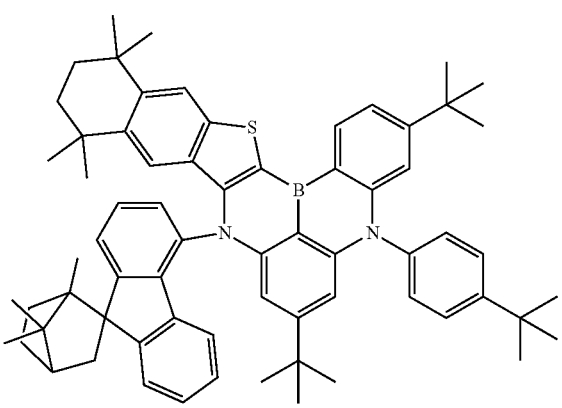
-continued
G-89
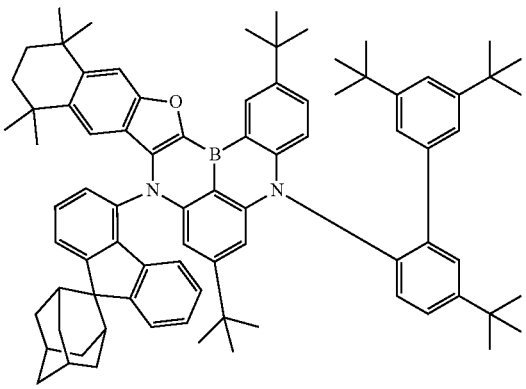
G-90
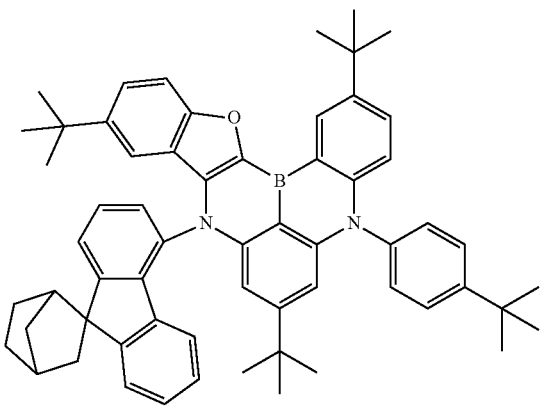
G-91
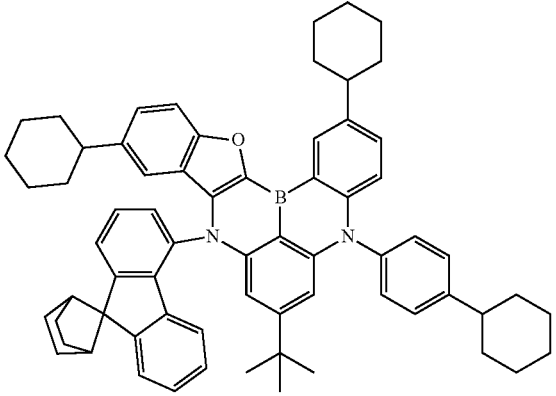
G-92
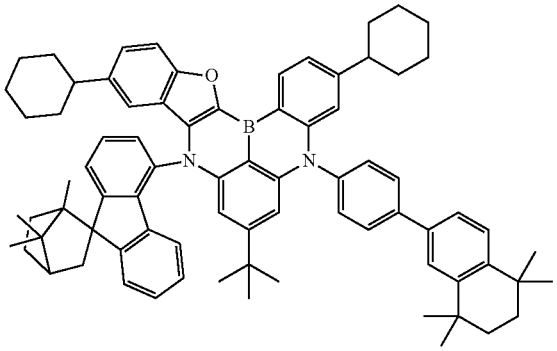

G-93
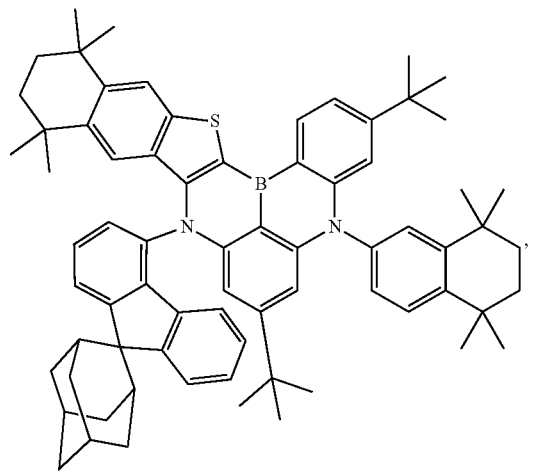
G-94
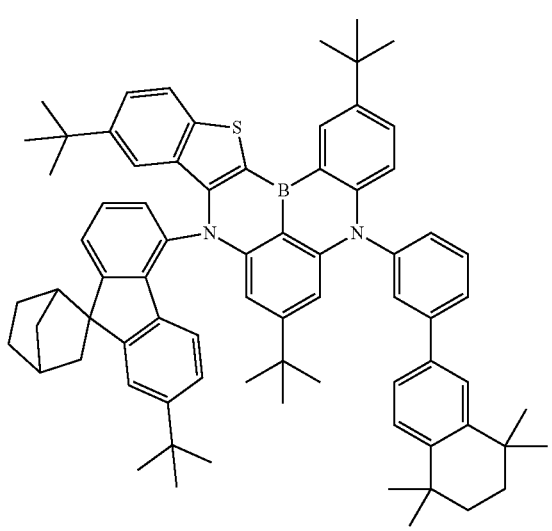
G-95
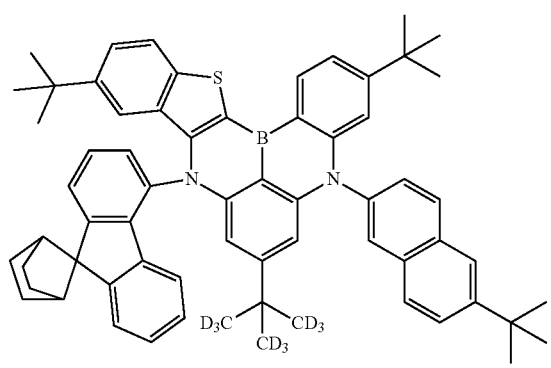
G-96
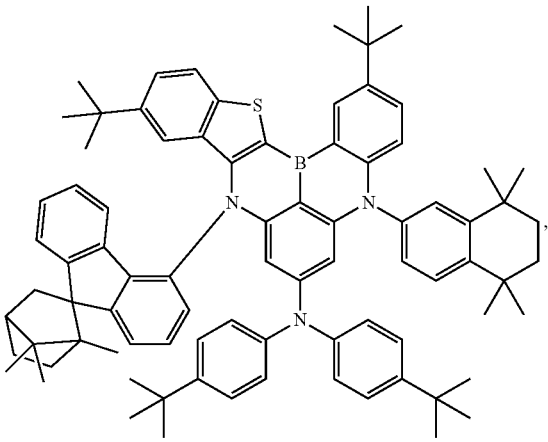
G-97
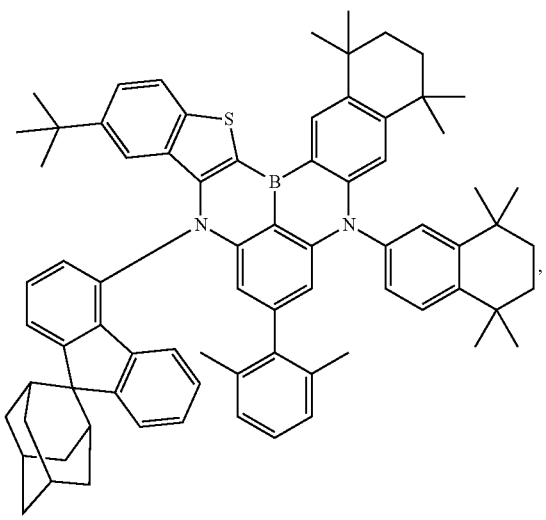
G-98
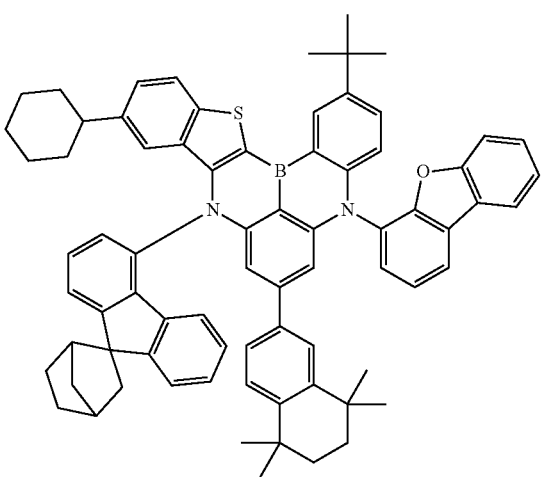

G-99
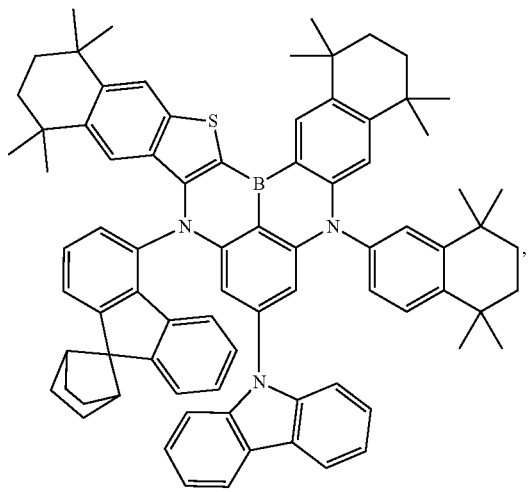
G-100
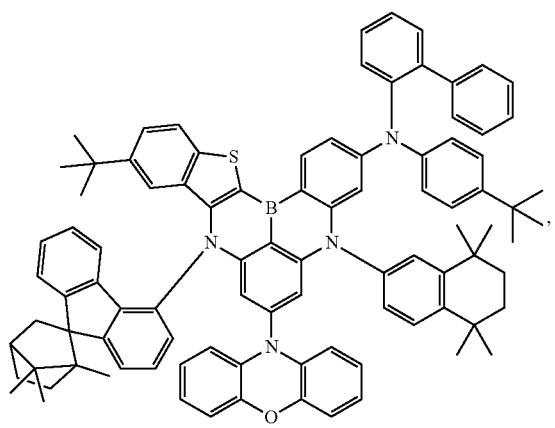
G-101
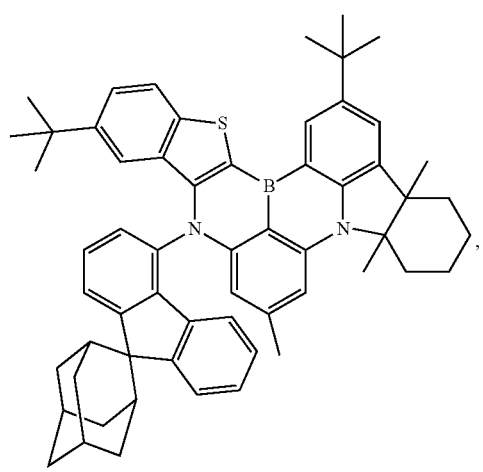
G-102
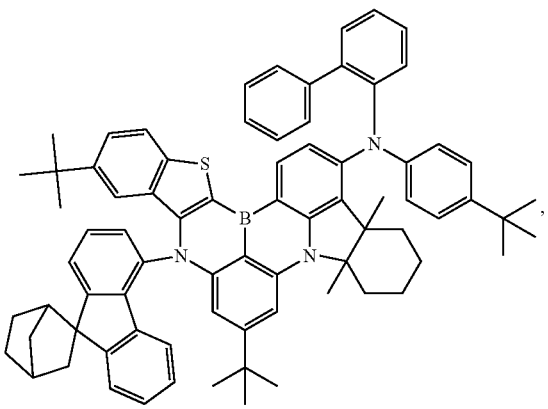
G-103
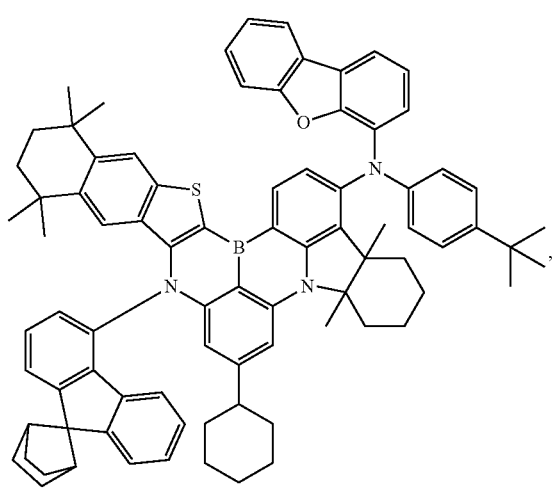
G-104
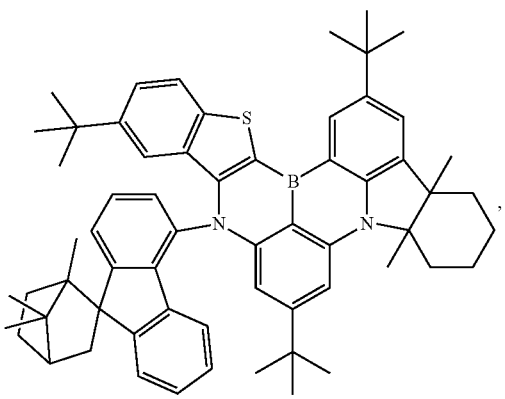

-continued
G-105
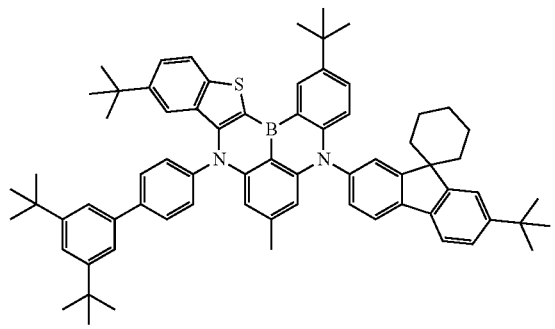
G-106
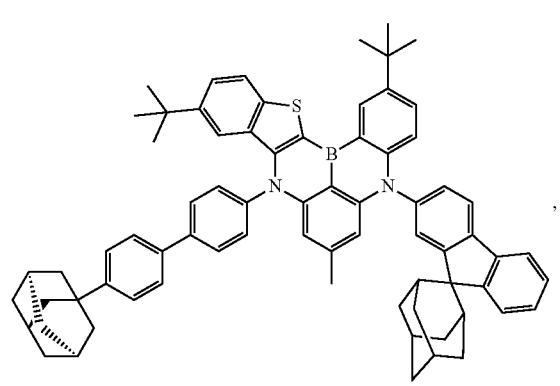
G-107
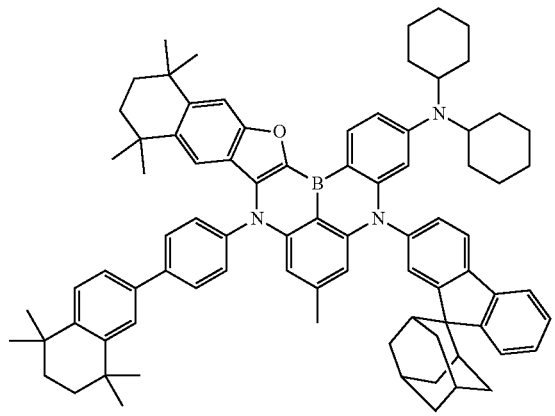
G-108
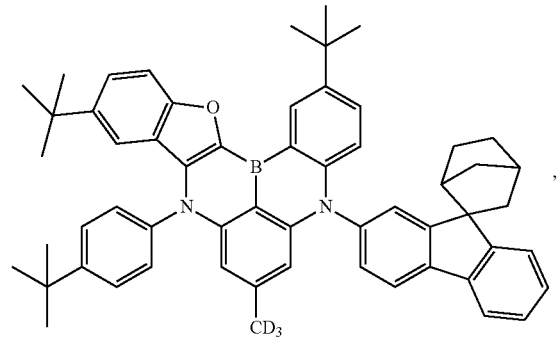
-continued
G-109
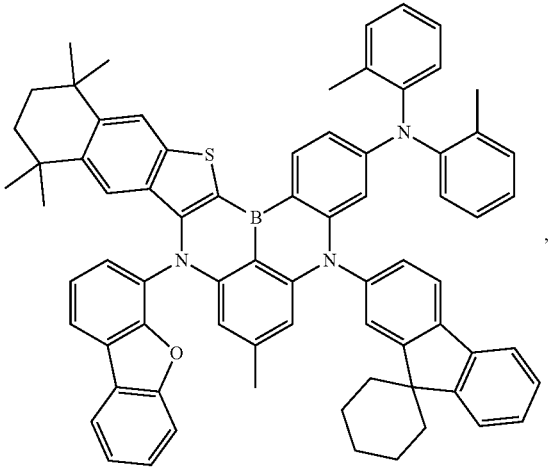
G-110
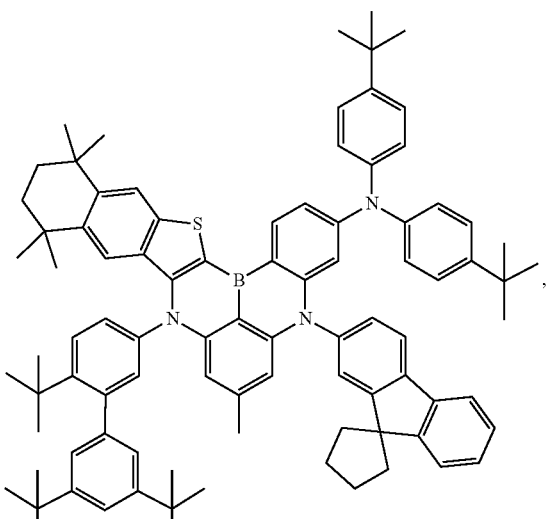
G-111
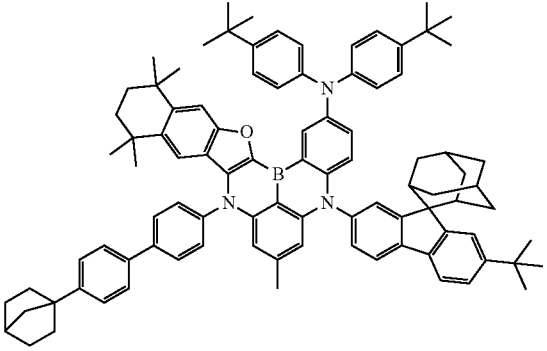

G-112
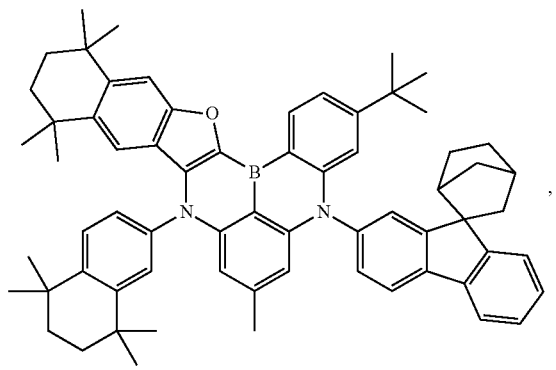
G-115
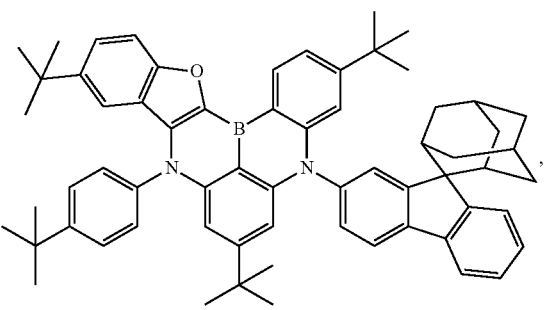
G-113
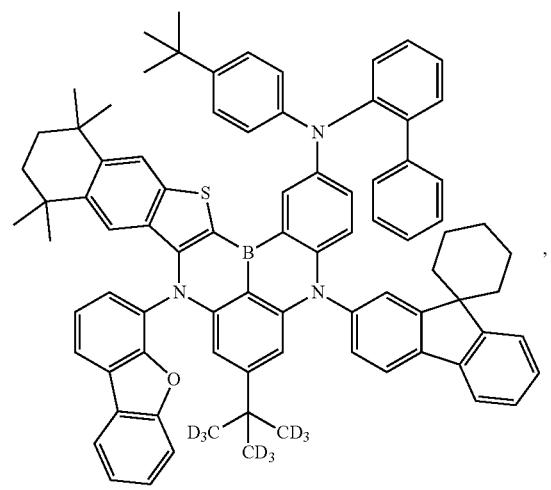
G-116
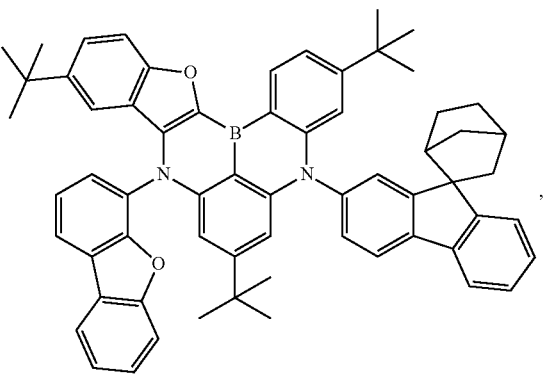
G-114
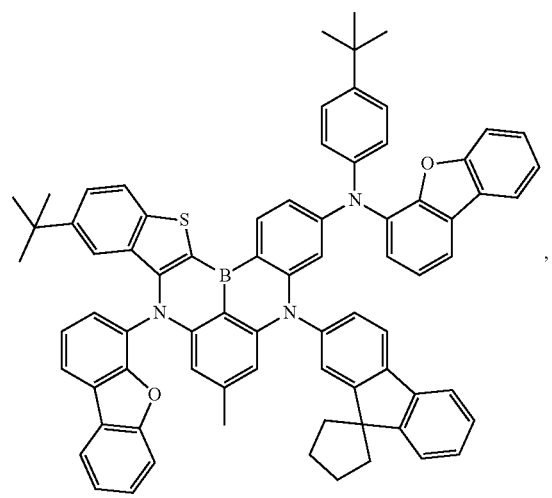
G-117
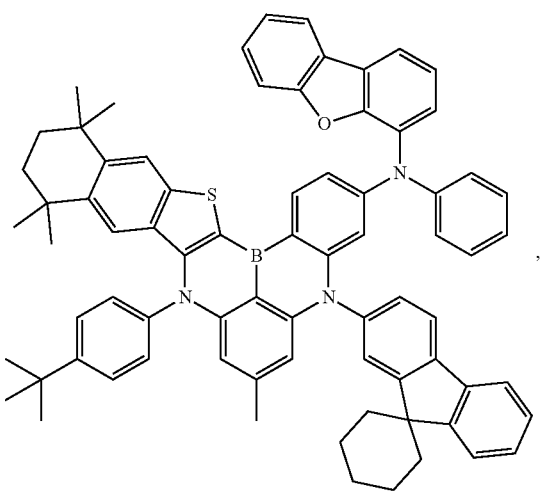

G-118
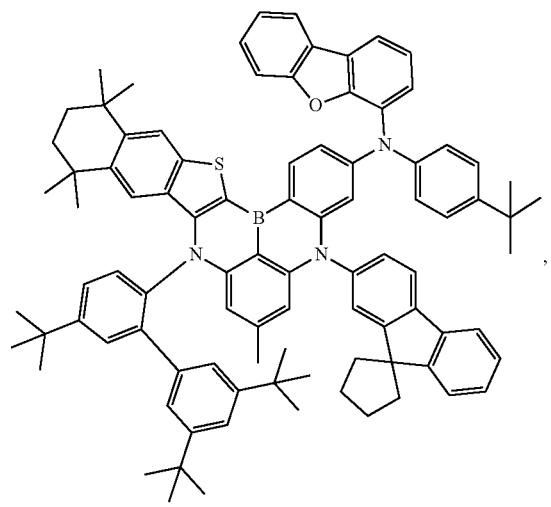
G-121
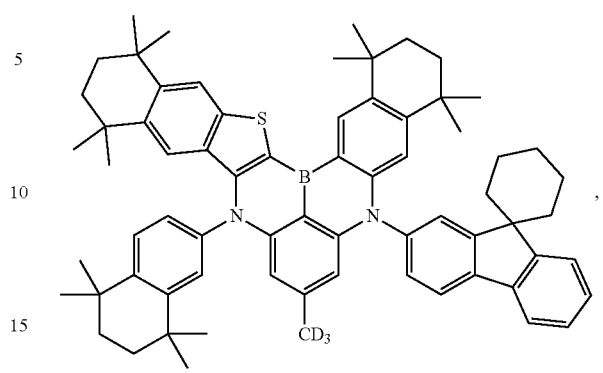
G-119
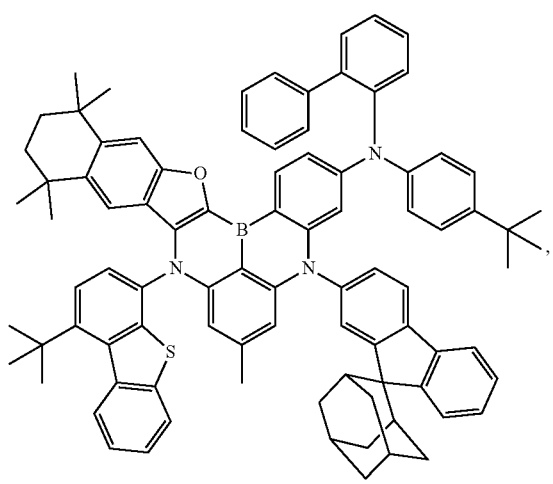
G-122
G-120
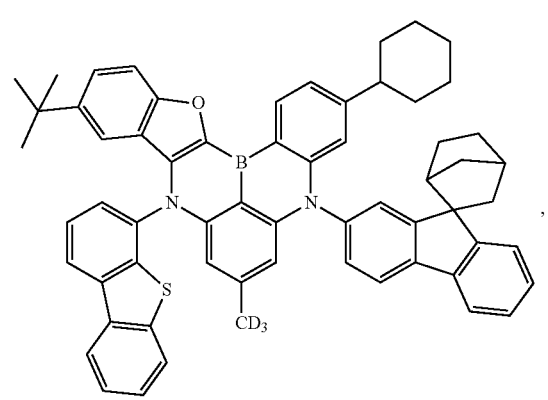
G-123
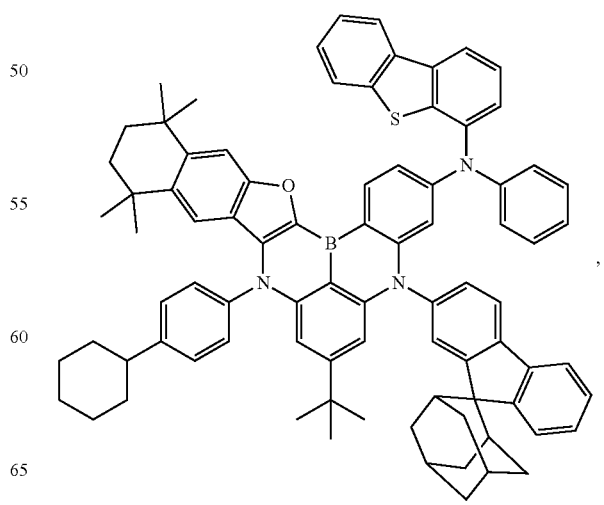

-continued
G-124
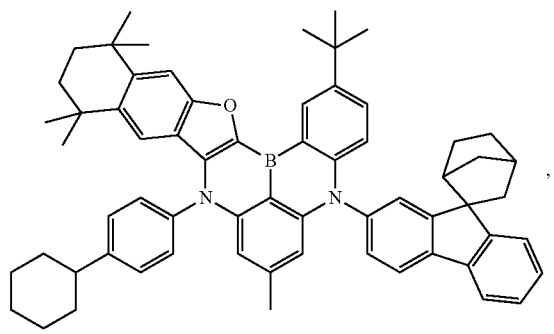
G-125
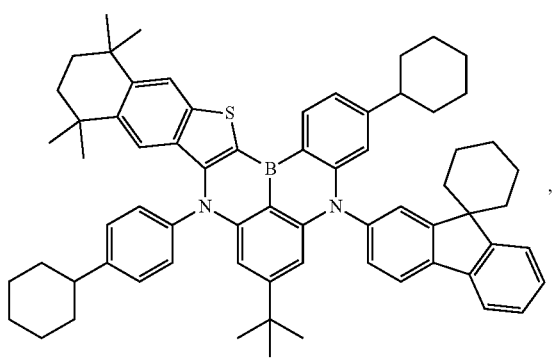
G-126
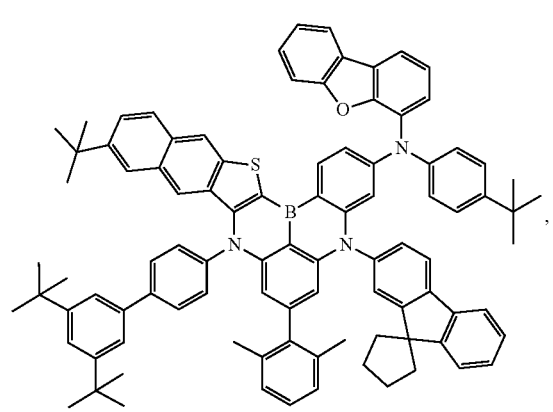
G-127
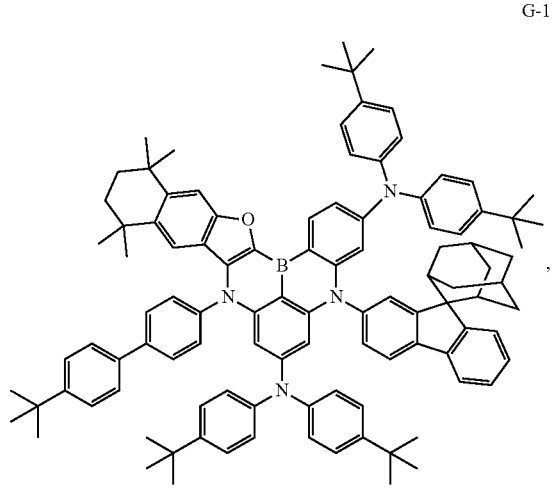
-continued
G-128
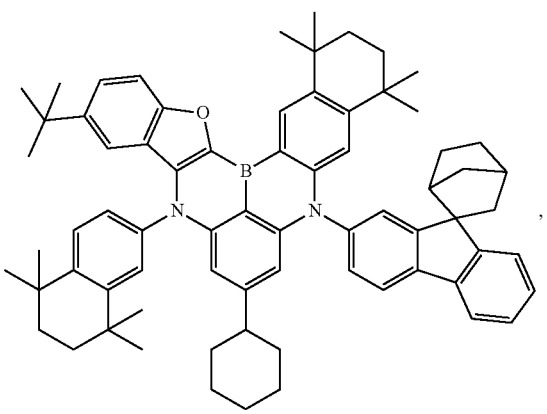
G-129
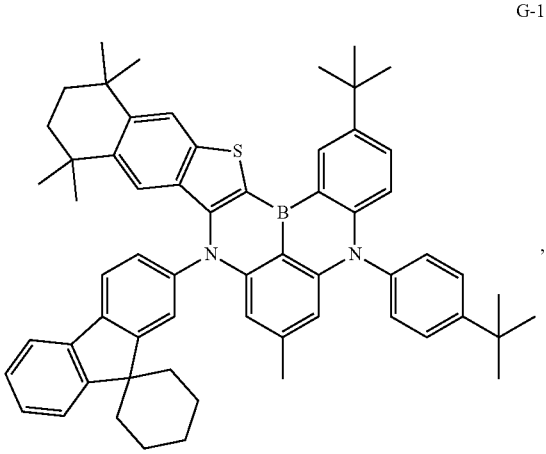
G-130
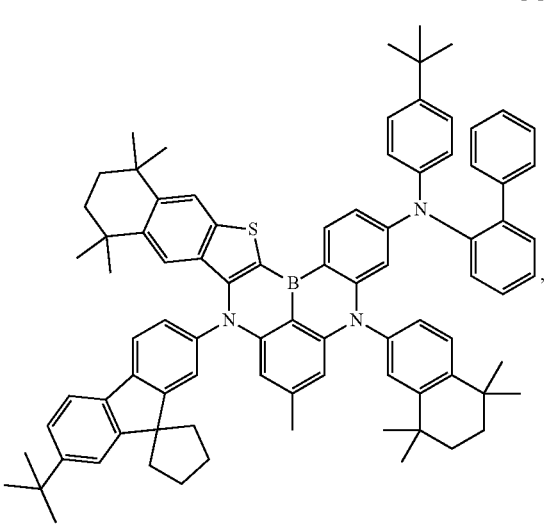

G-131
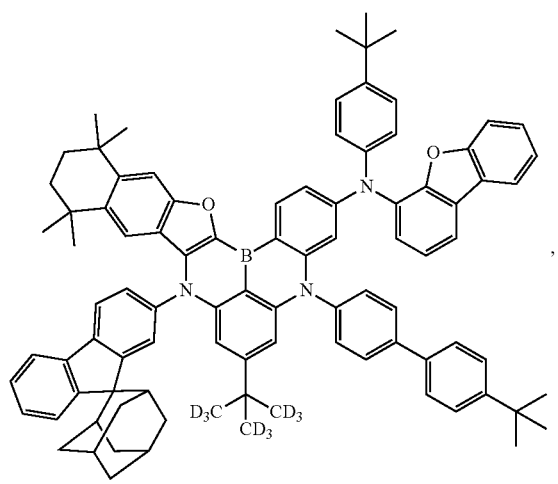
G-134
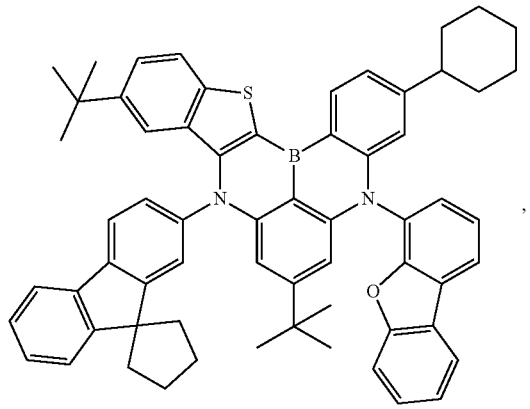
G-132
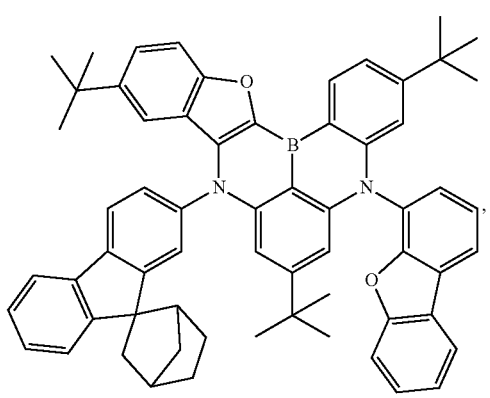
G-135
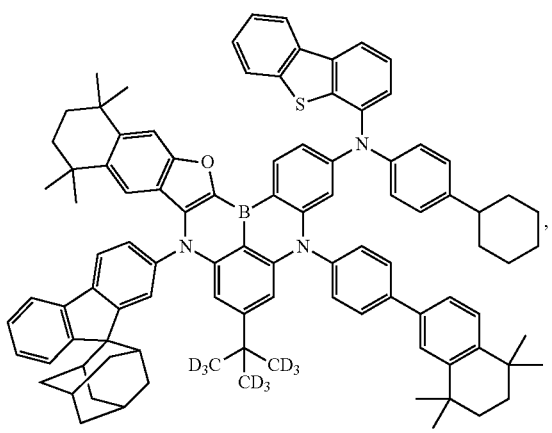
G-133
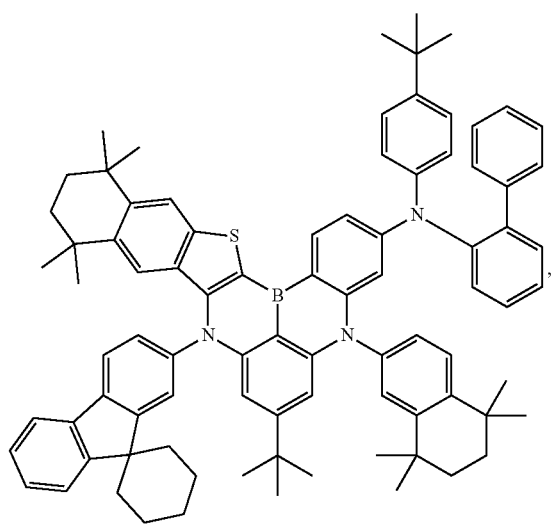
G-136
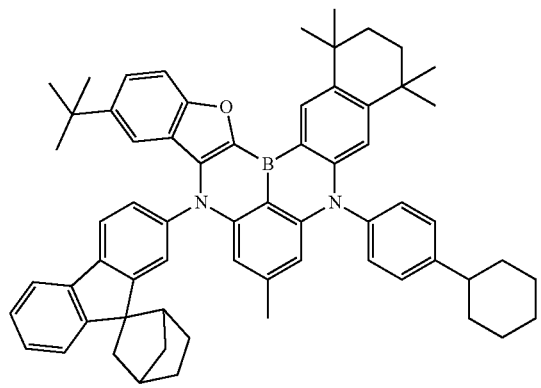

-continued
G-137
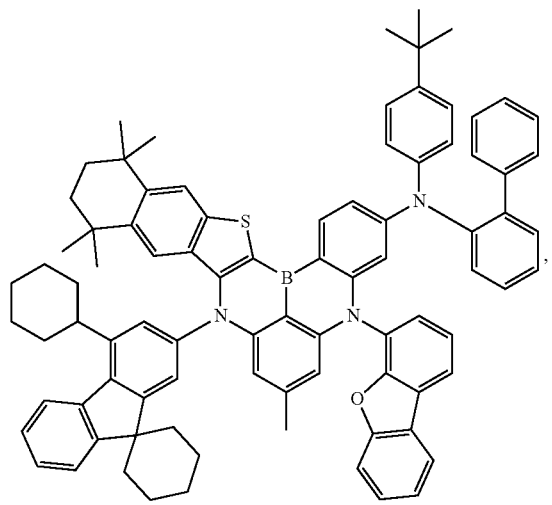
G-138
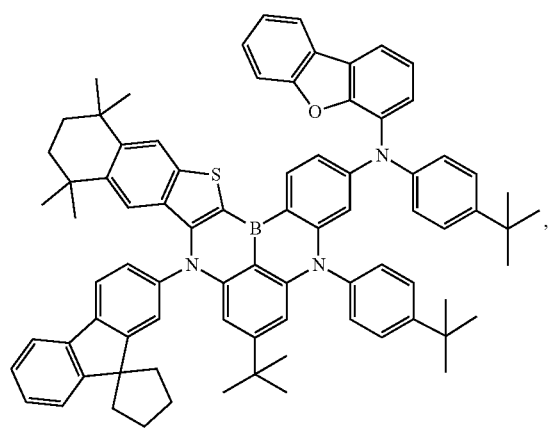
G-139
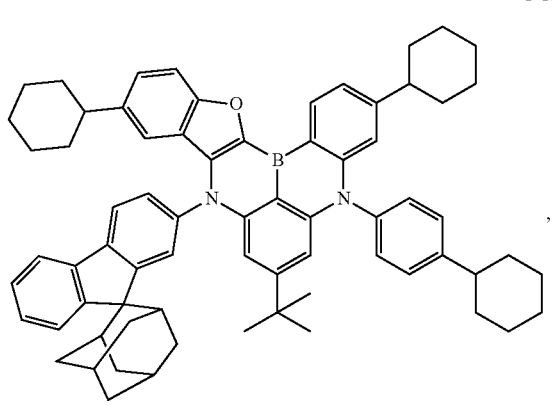
-continued
G-140
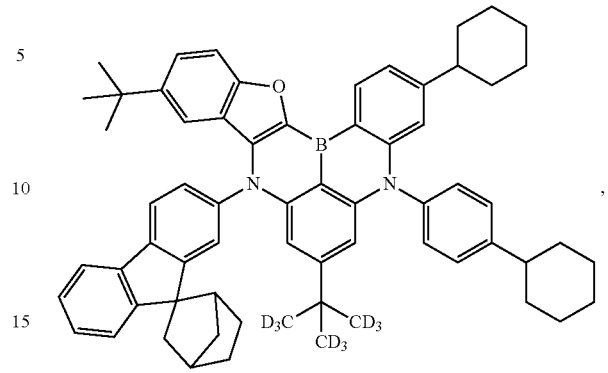
G-141
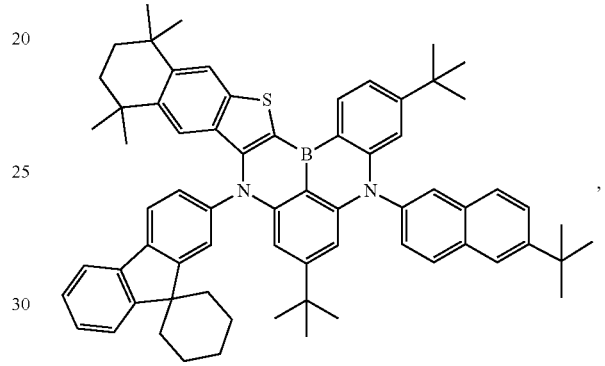
G-142
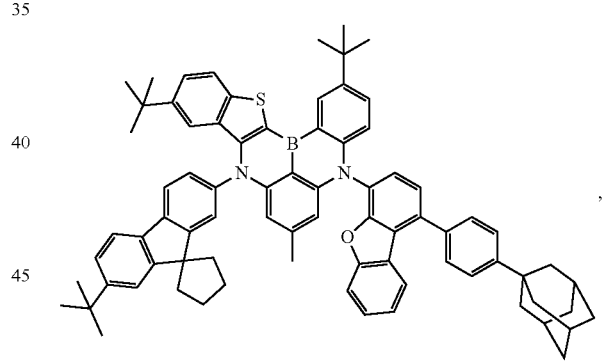
G-143
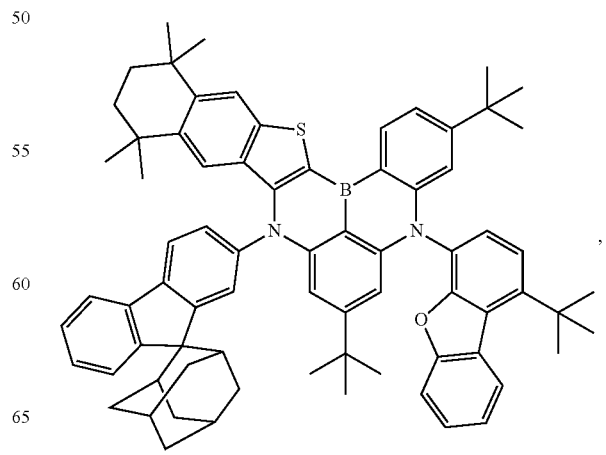

G-144
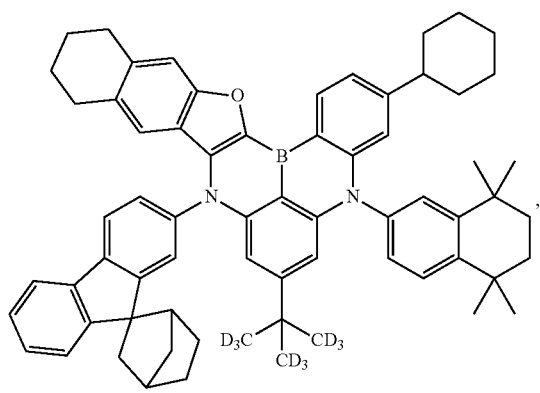
G-145
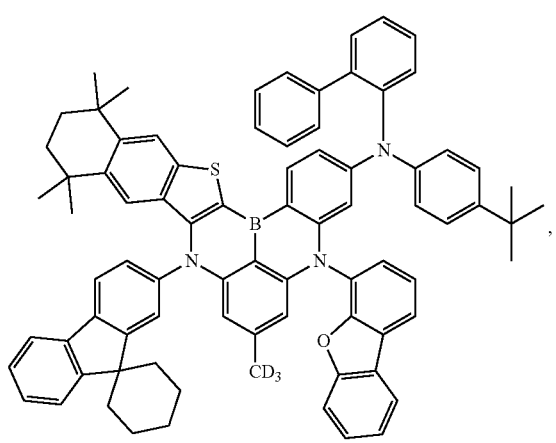
G-146
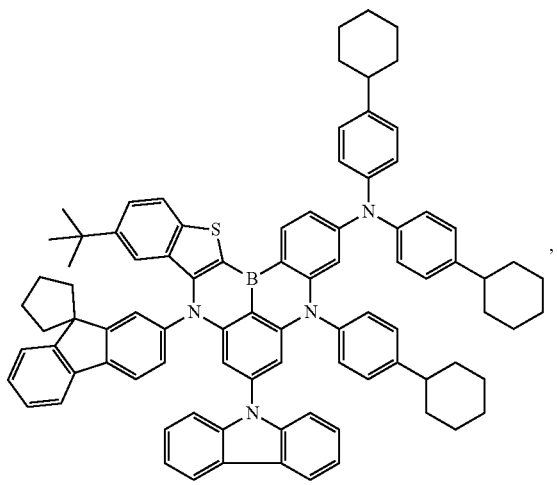
G-147
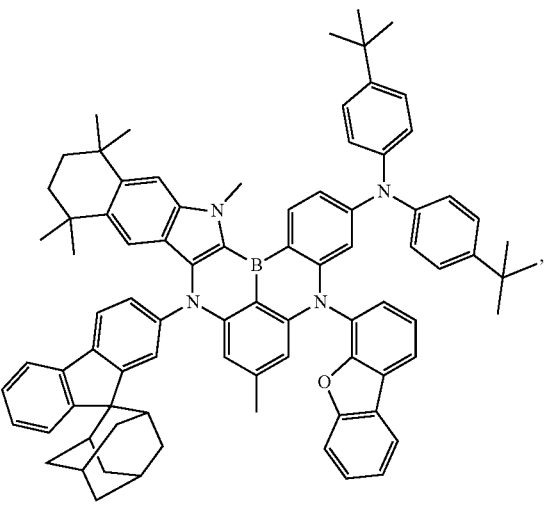
G-148
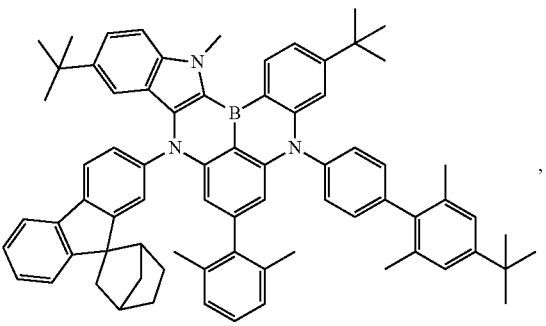
G-149
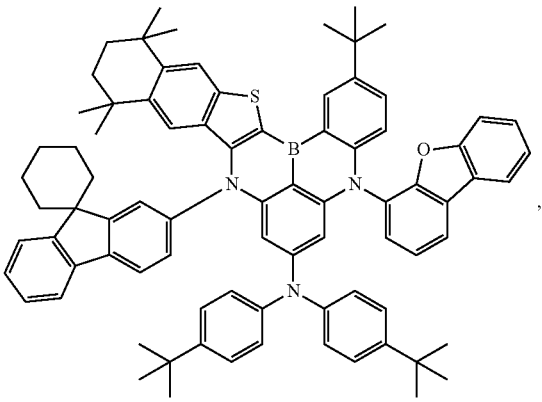

G-150
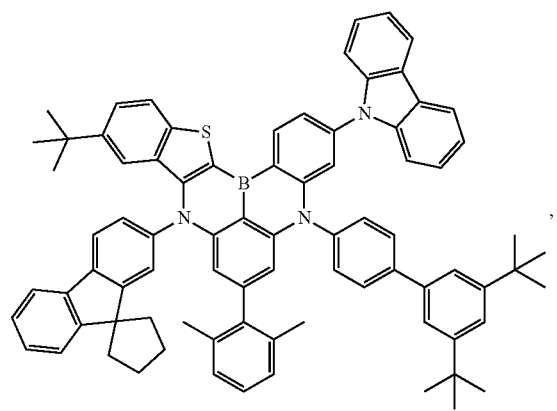
G-153
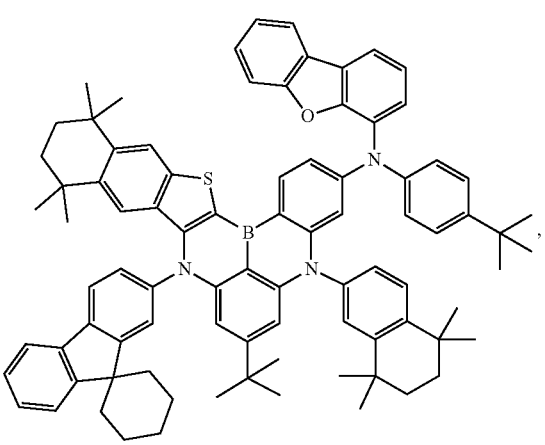
G-151
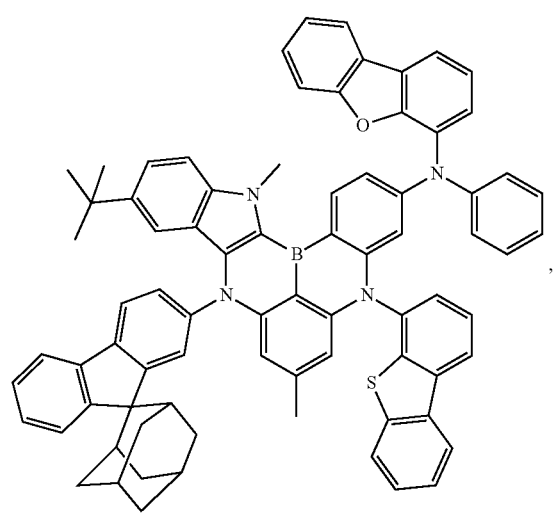
G-154
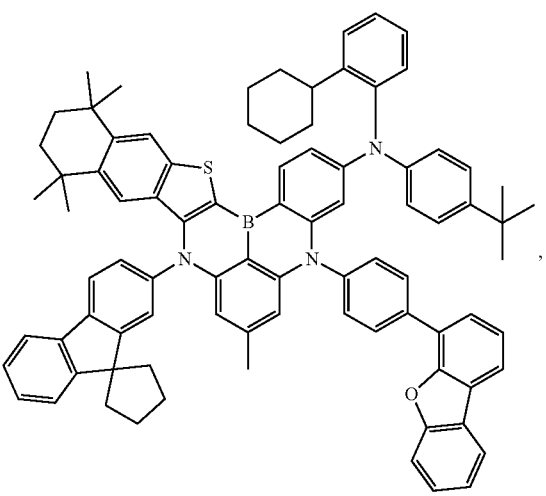
G-152
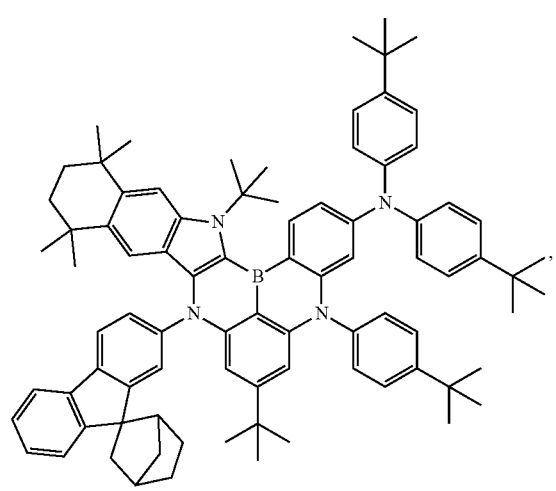
G-155
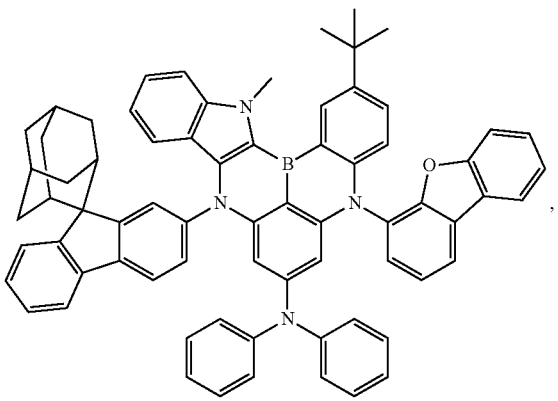

-continued
G-156
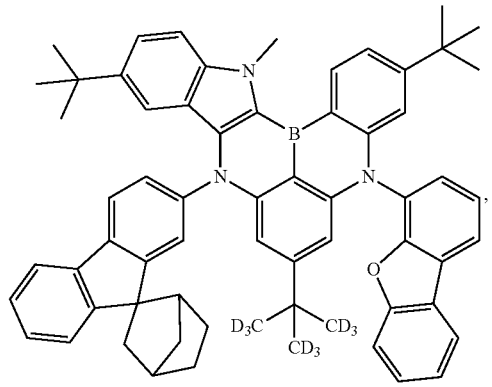
G-157
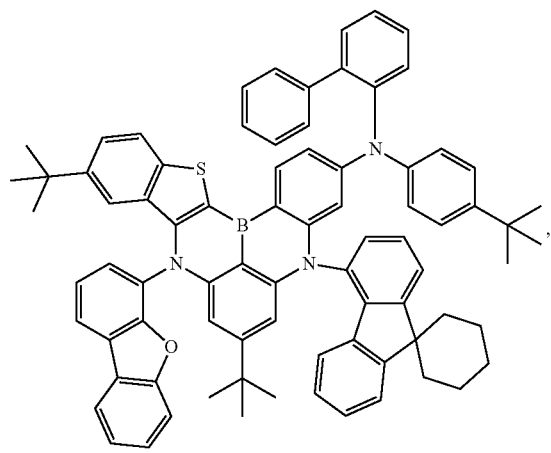
G-158
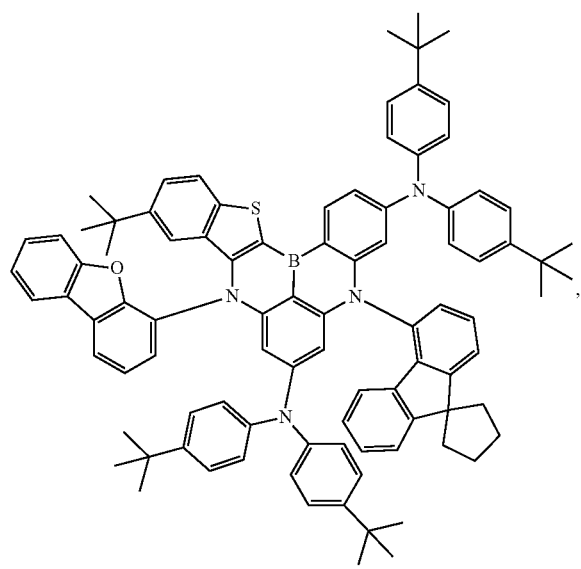
-continued
G-159
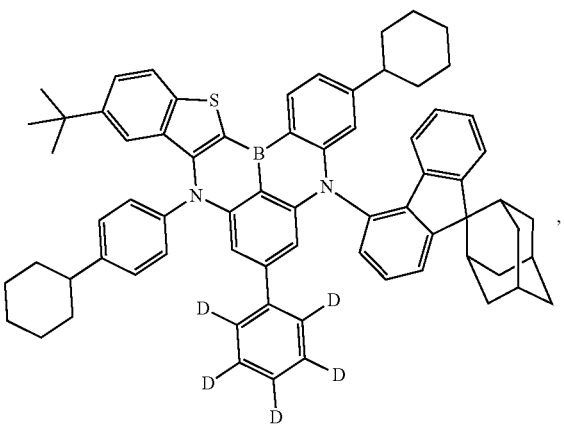
G-160
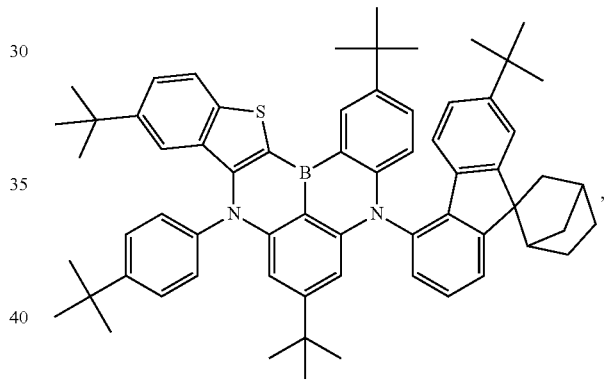
G-161
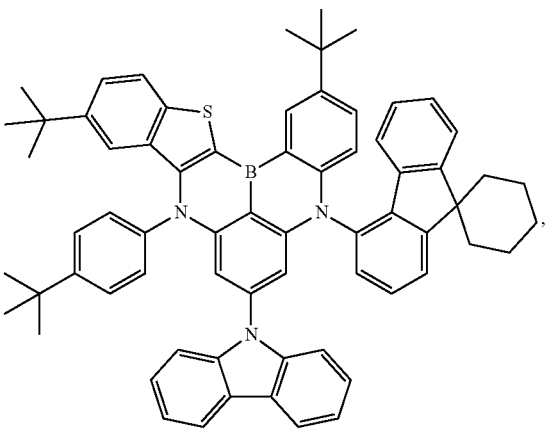

G-162
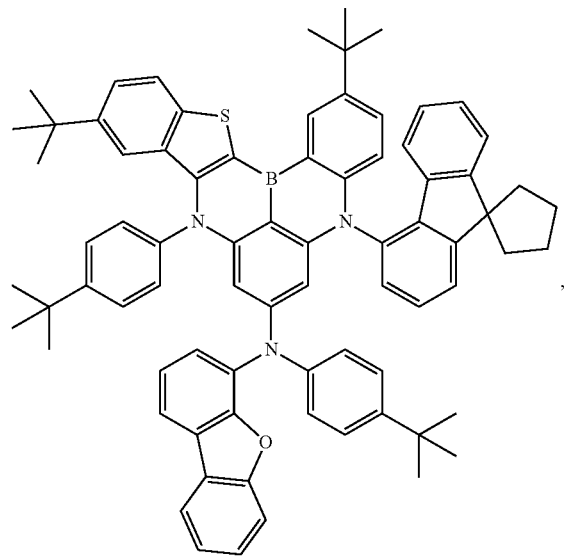
G-163
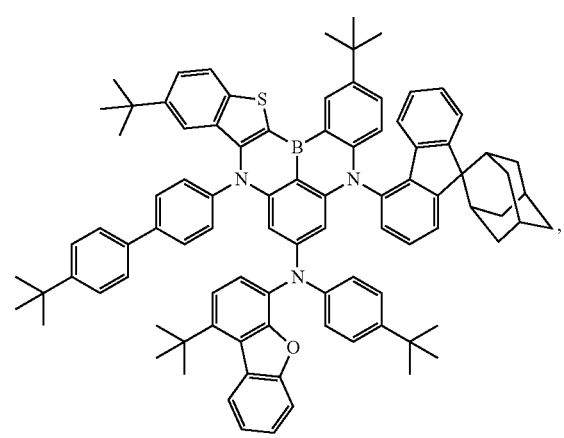
G-164
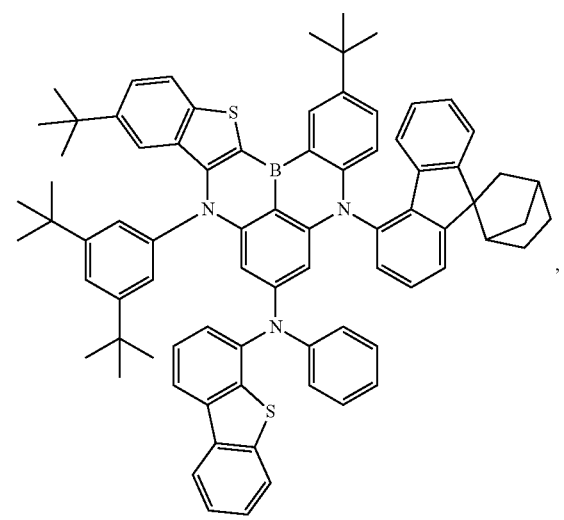
G-165
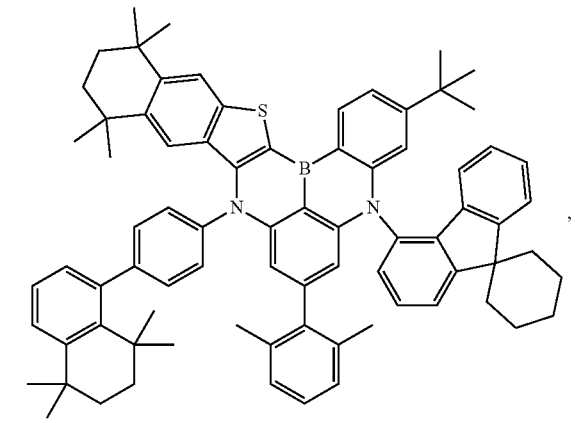
G-166
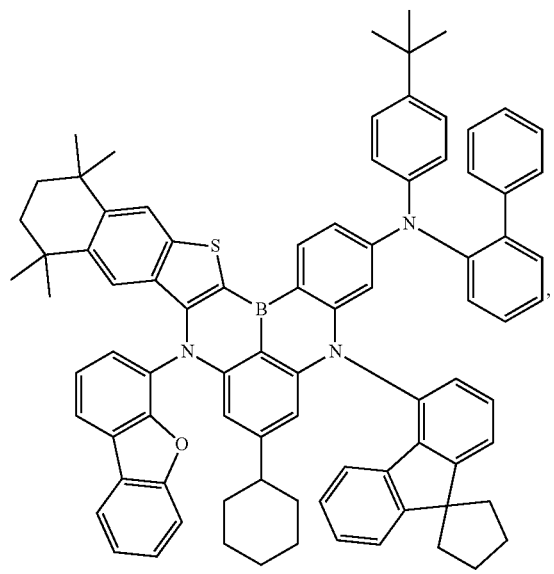
G-167
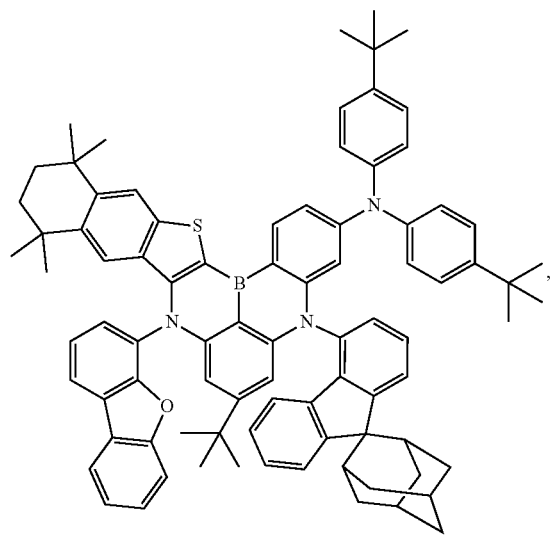

G-168
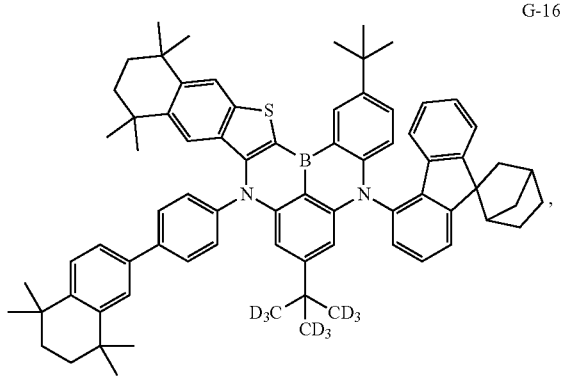
G-172
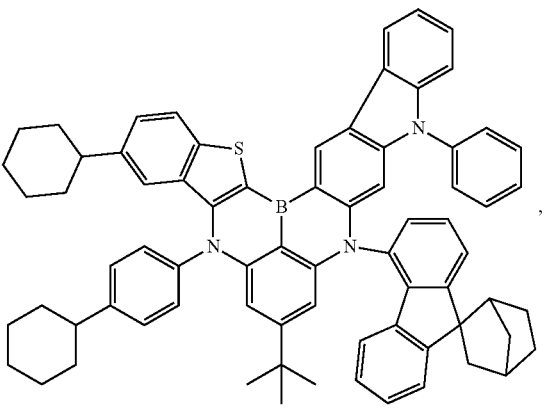
G-169
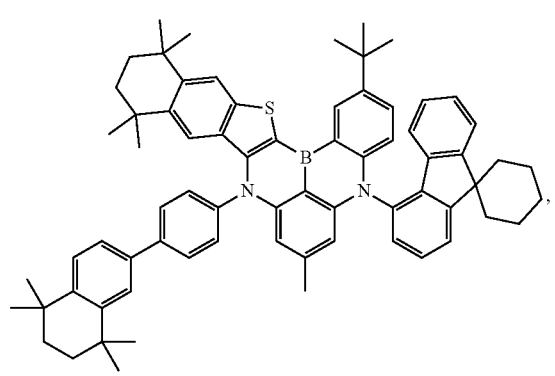
G-173
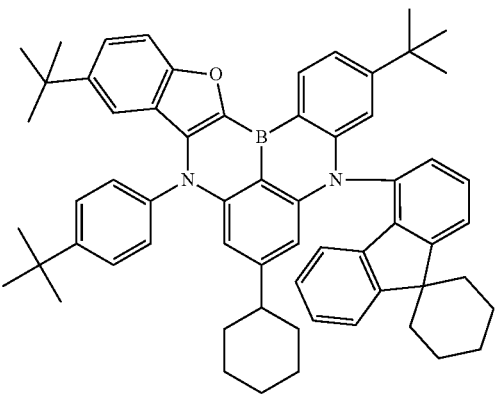
G-170
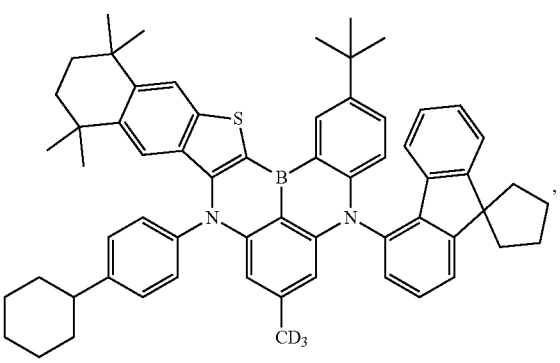
G-171
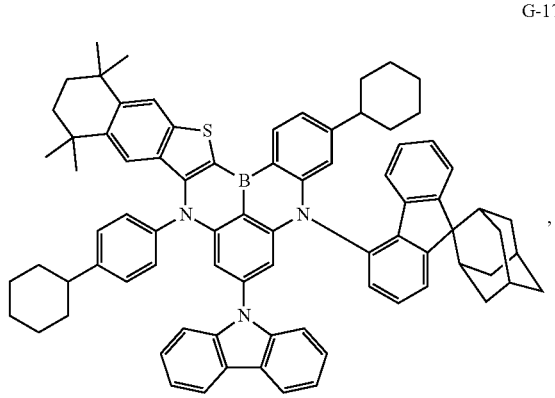
G-174
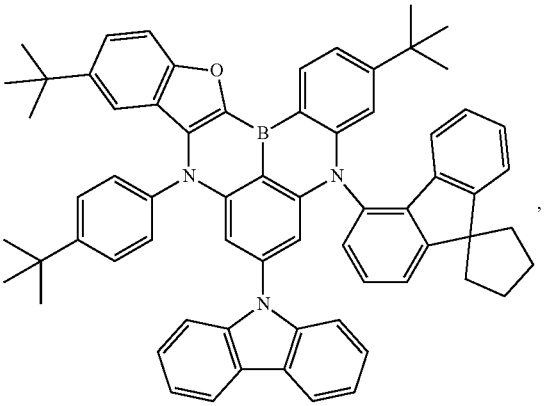

G-175
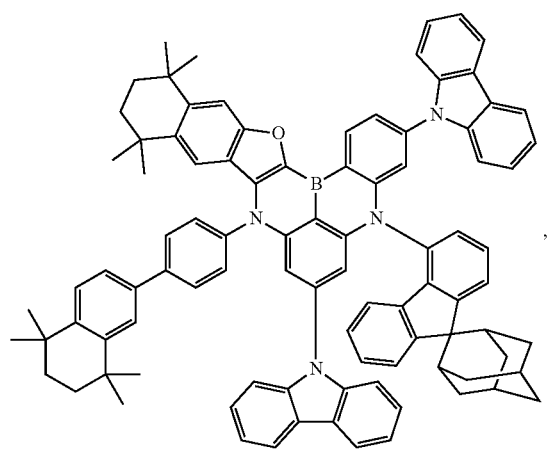
G-178
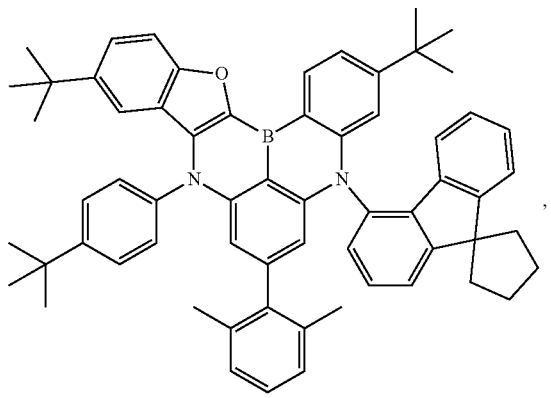
G-176
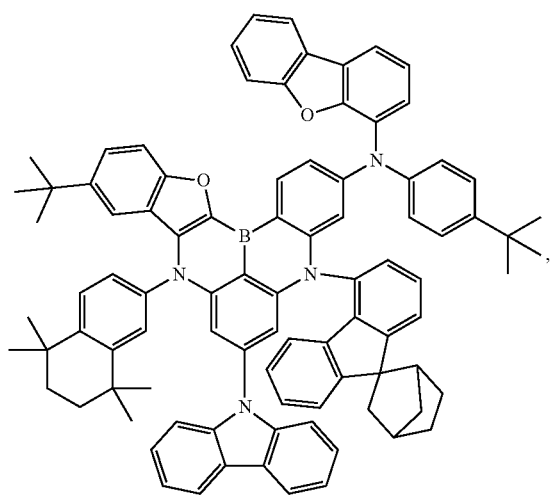
G-179
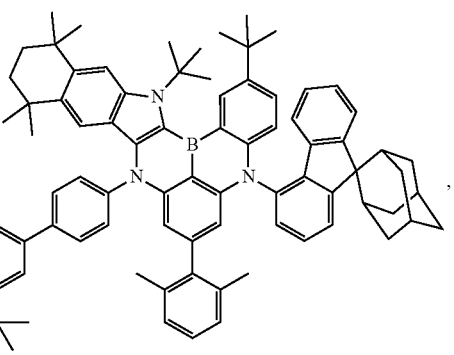
G-180
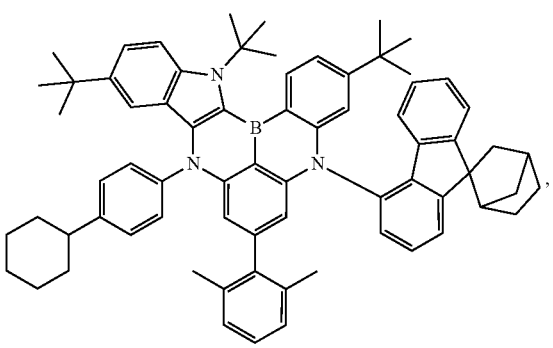
G-177
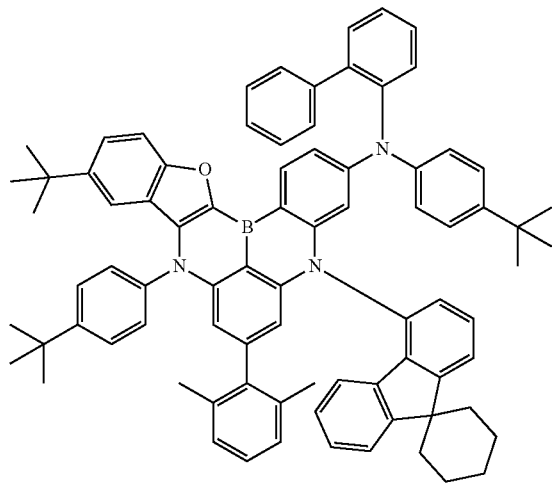
G-181
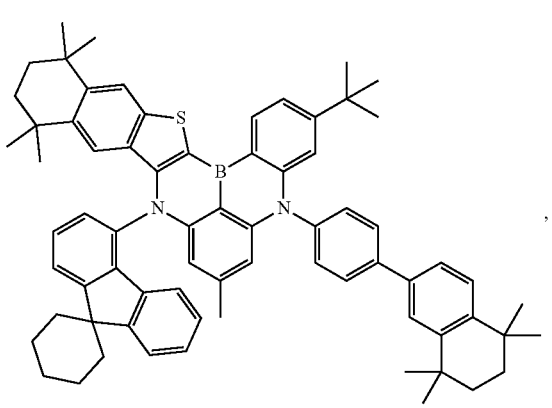

-continued
G-182
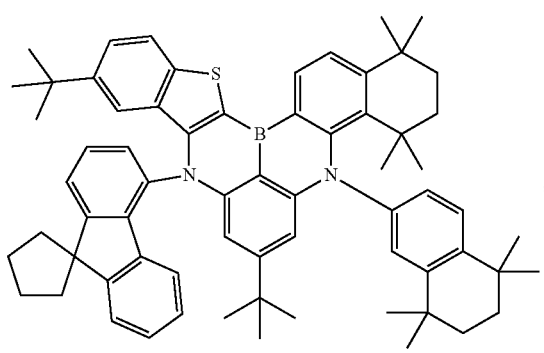
G-183
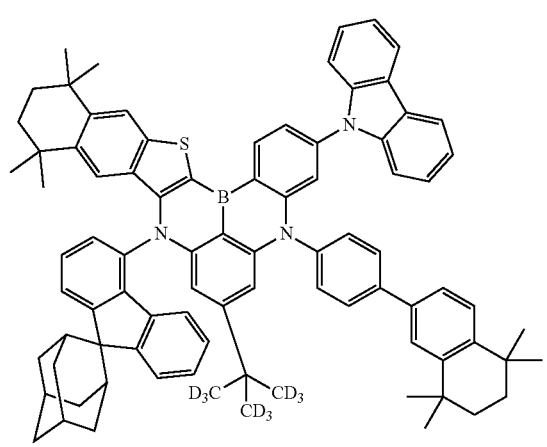
G-184
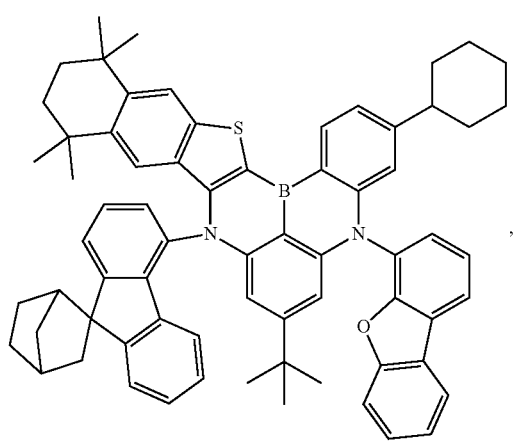
-continued
G-185
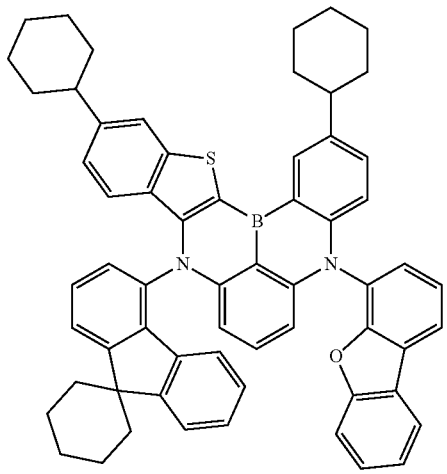
G-186
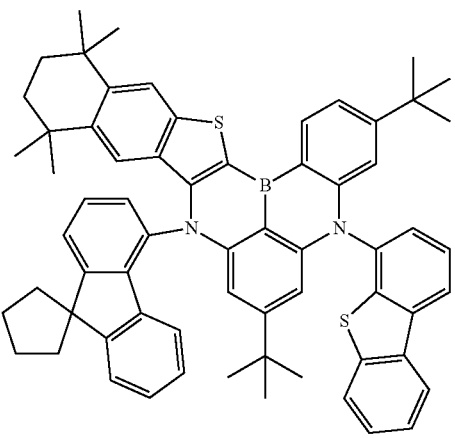
G-187
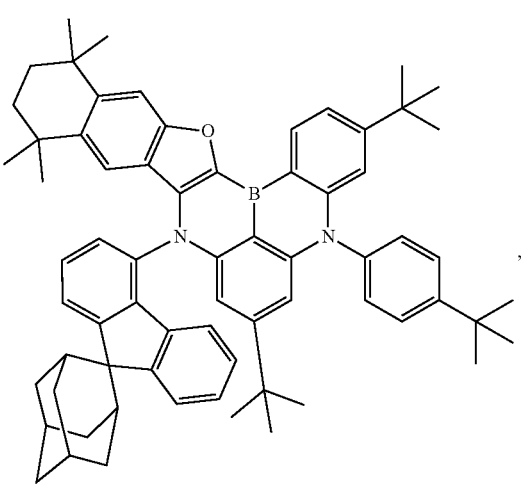

-continued
G-188
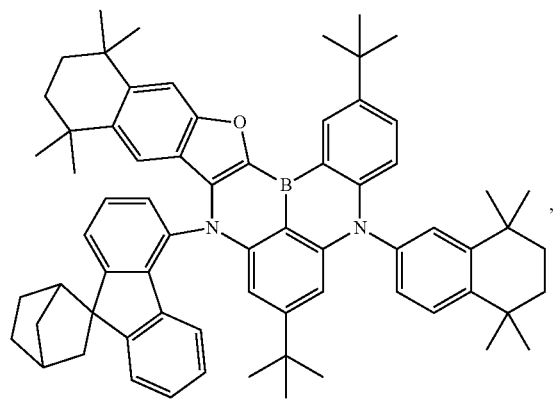
G-189
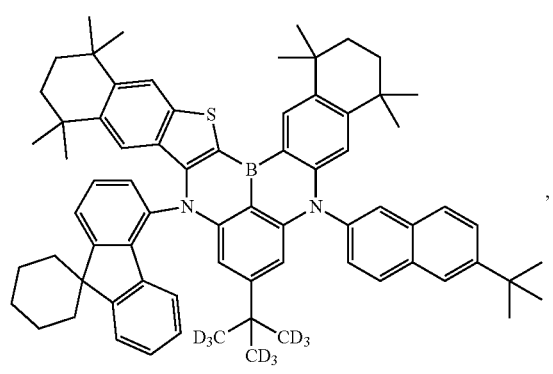
G-190
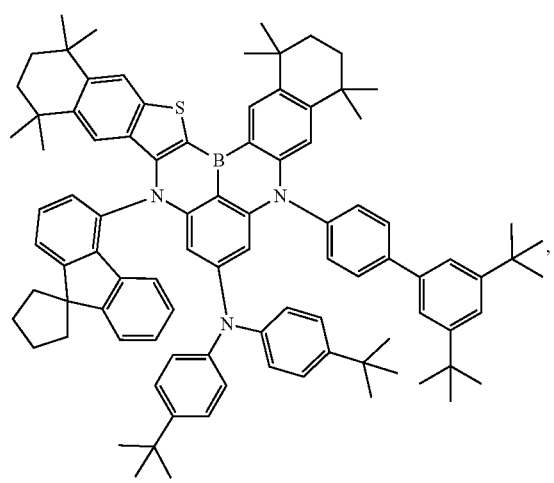
-continued
G-191
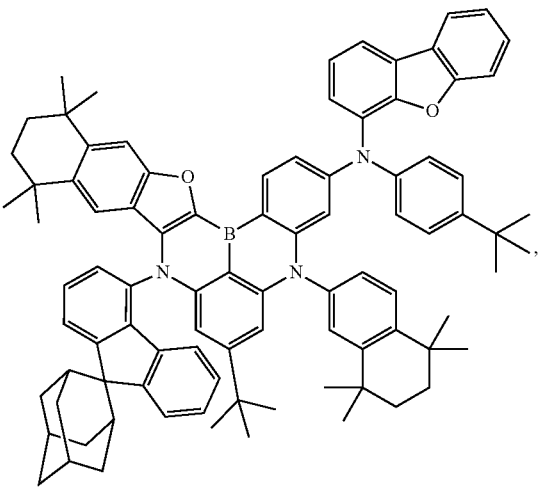
G-192
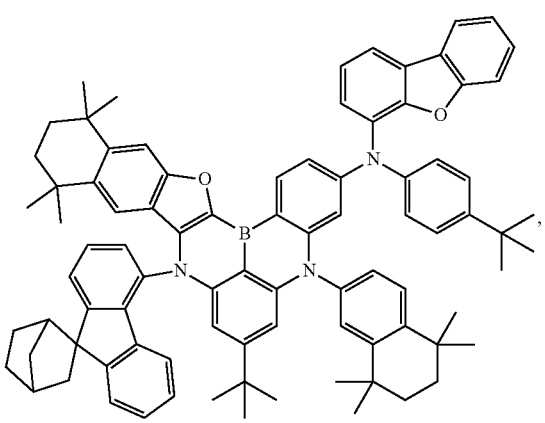
G-193
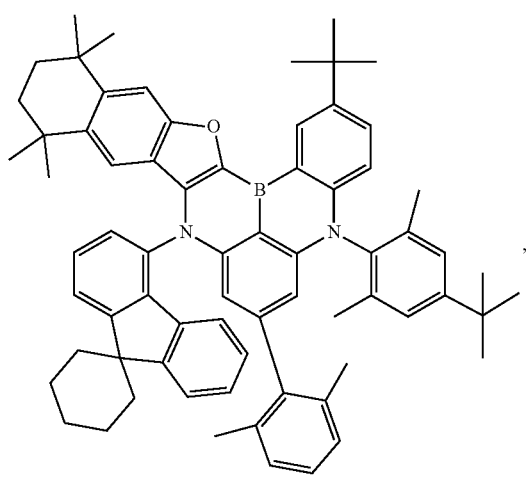

G-194
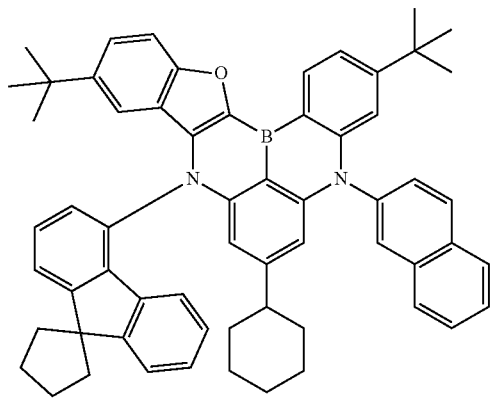
G-195
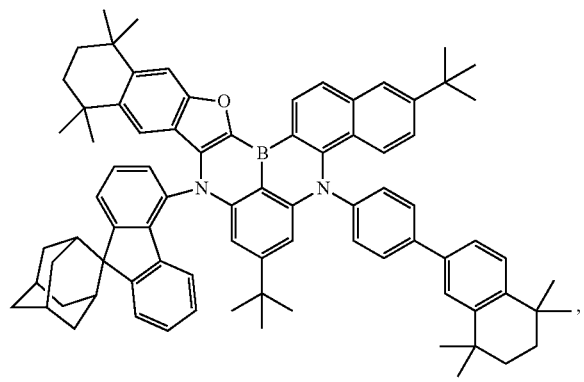
G-196
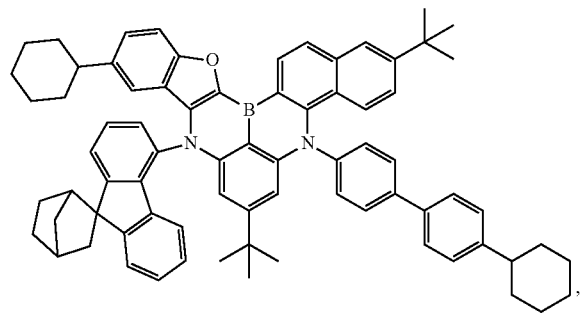
G-197
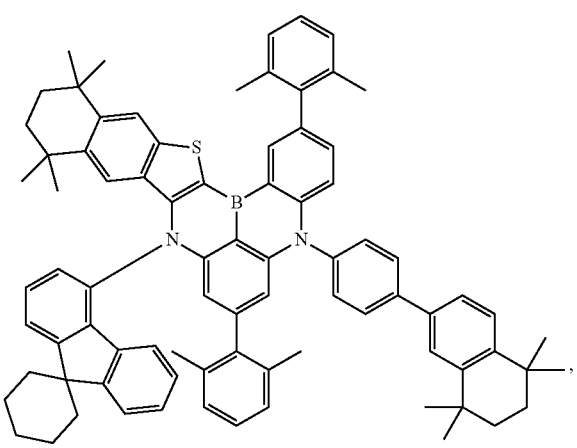
G-198, G-199
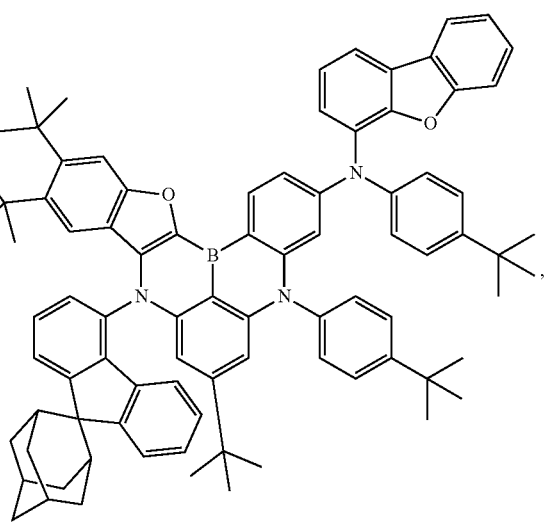

G-200
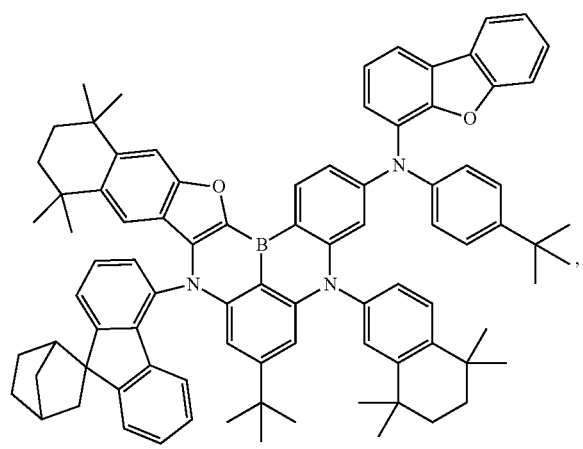
G-203
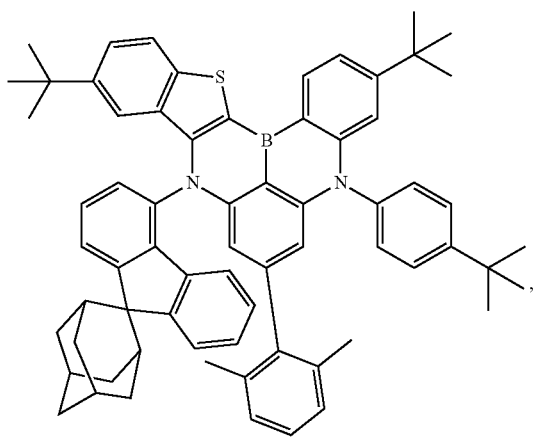
G-201
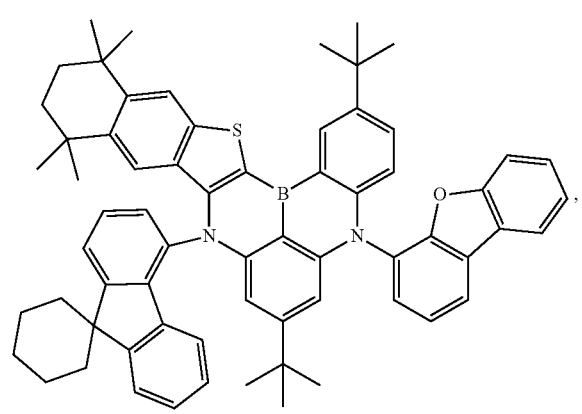
G-204
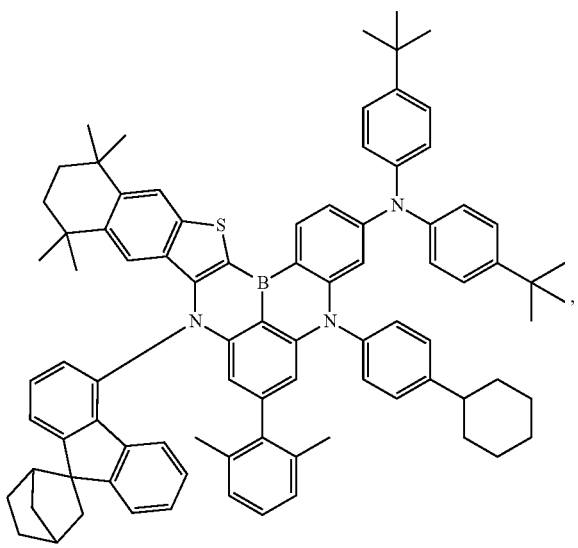
G-202
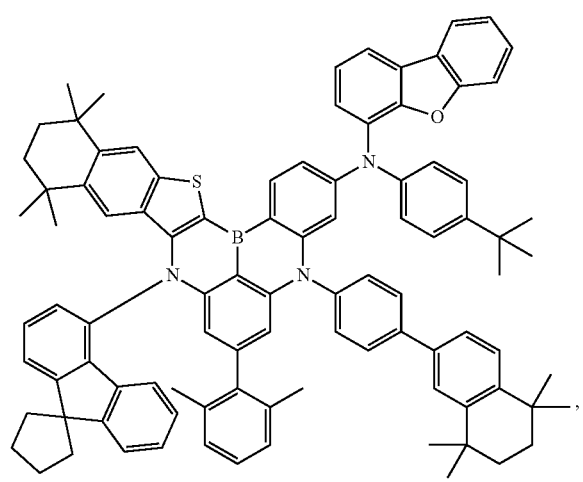
G-205
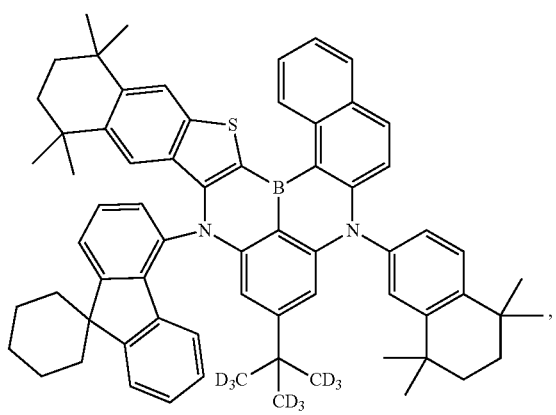

G-206
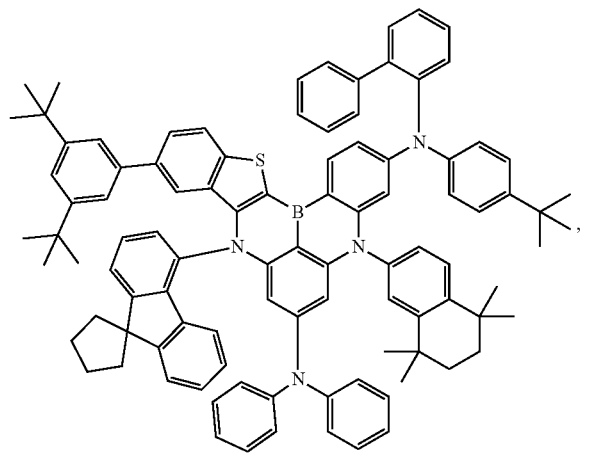
G-209
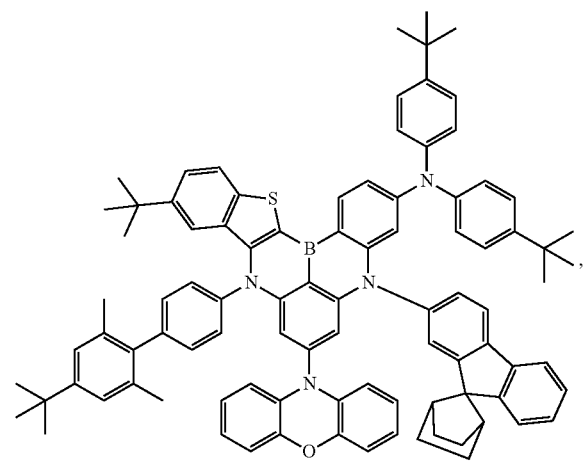
G-207
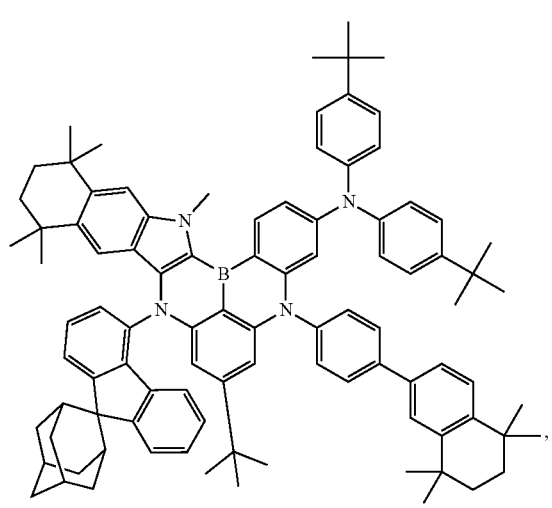
G-210
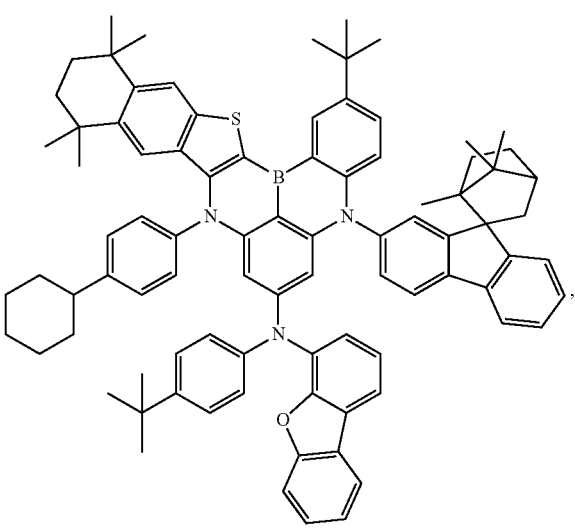
G-208
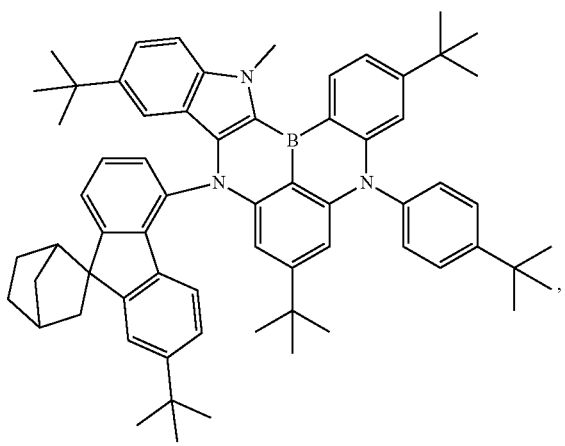
G-211
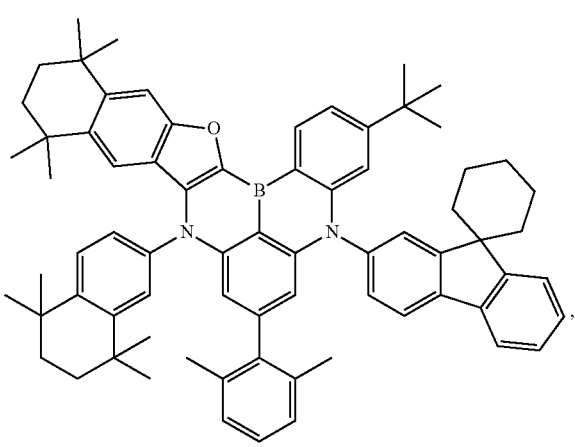

-continued
G-212
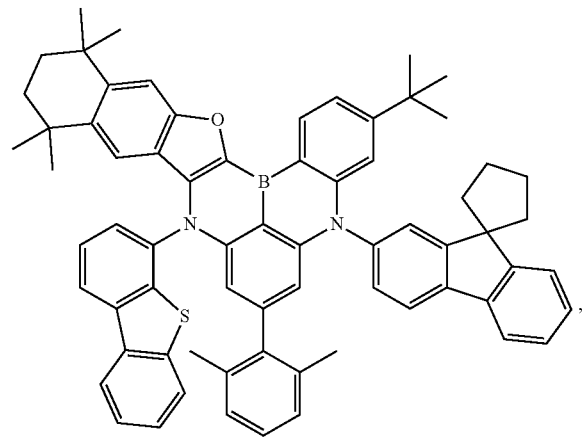
G-215
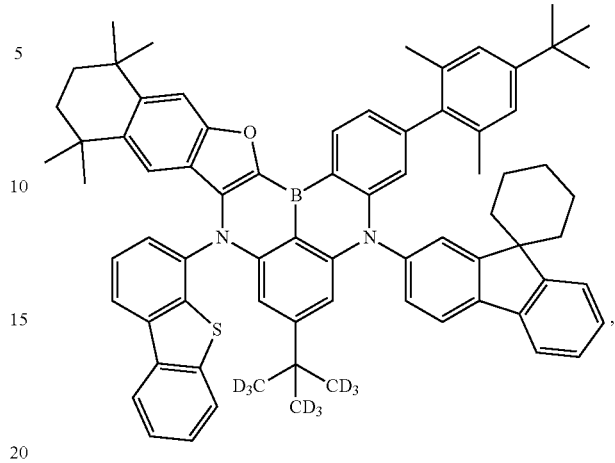
G-213
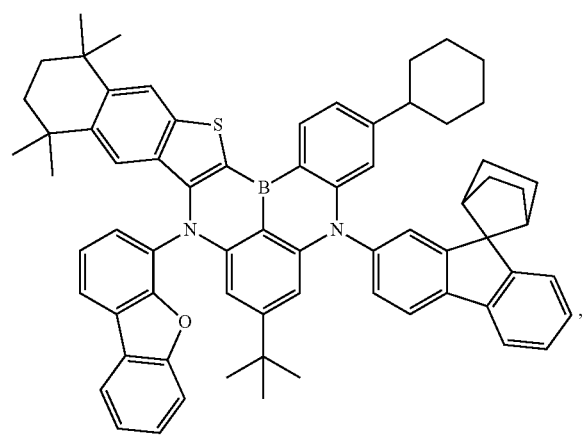
G-216
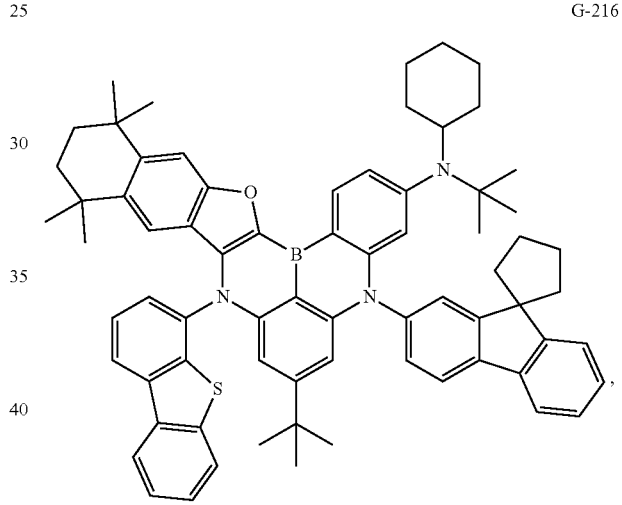
G-214
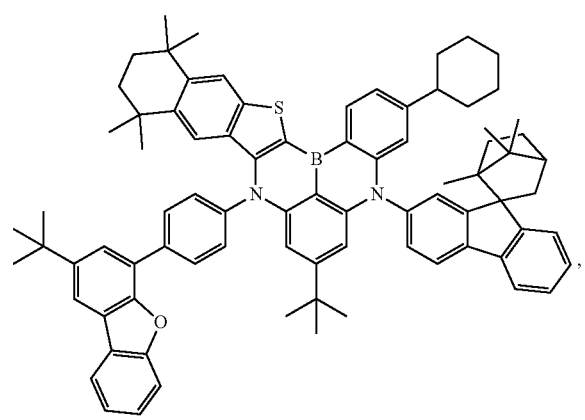
G-217
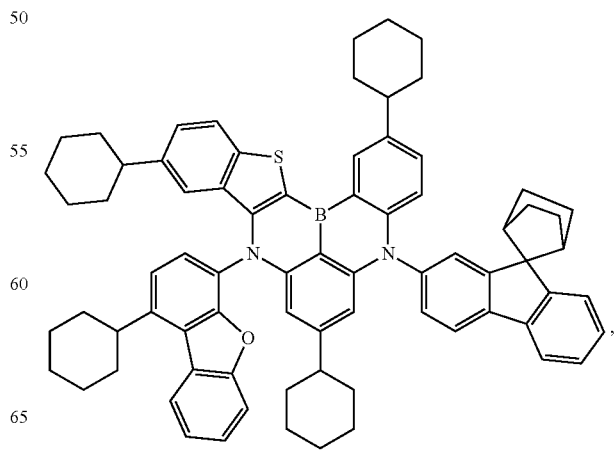

G-218
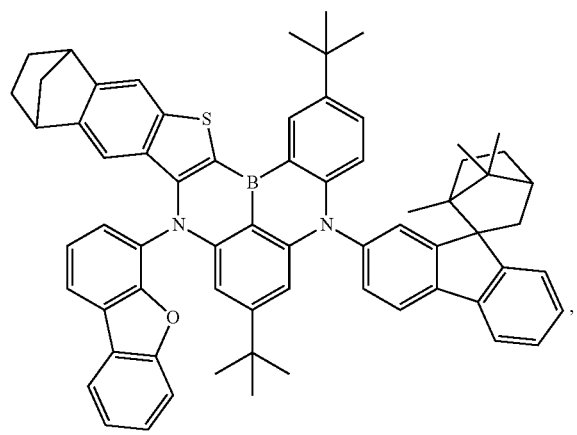
G-219
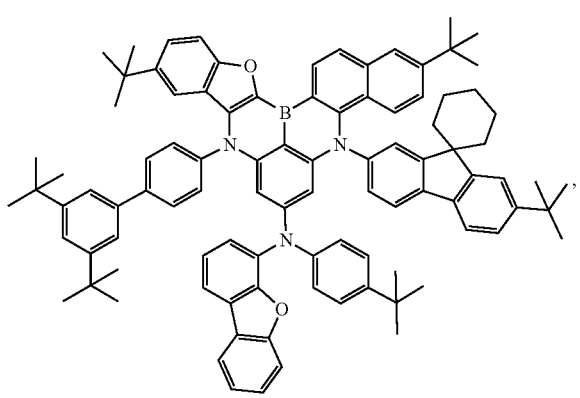
G-220
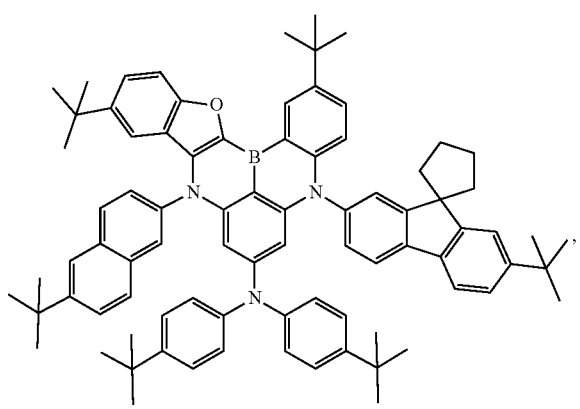
G-221
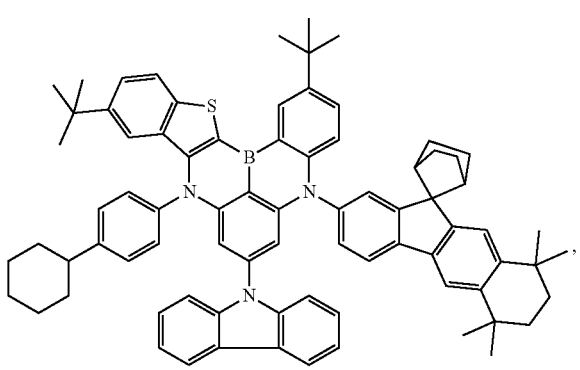
G-222
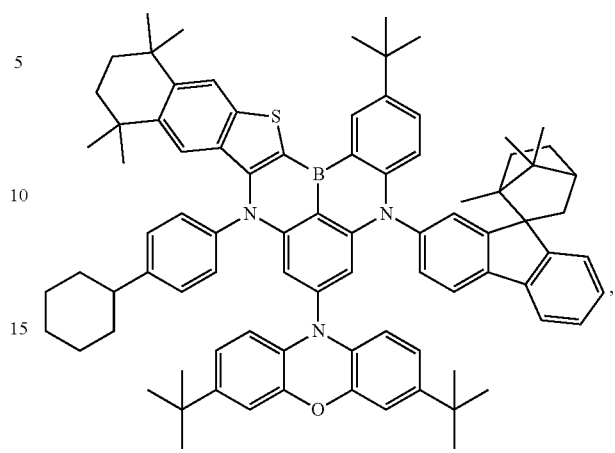
G-223
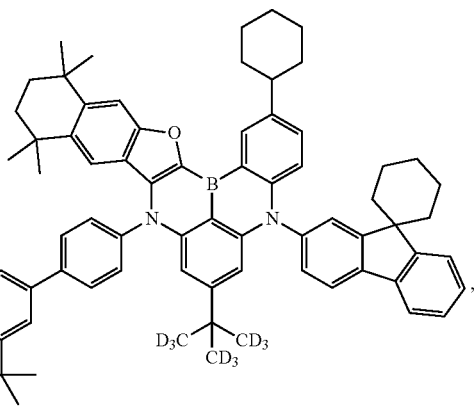
G-224
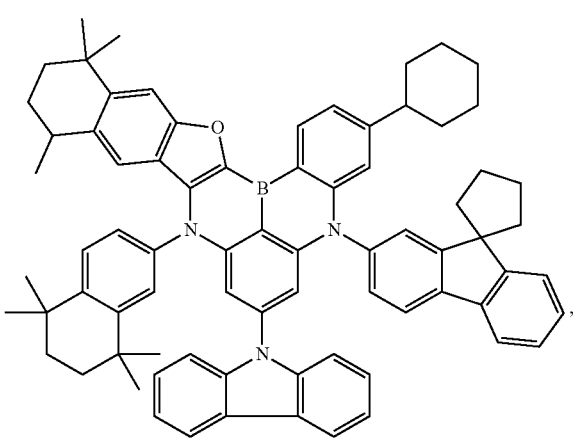

83
-continued
G-225
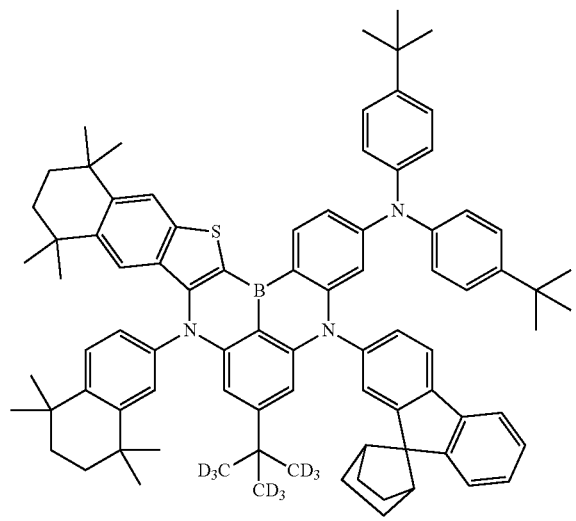
G-226
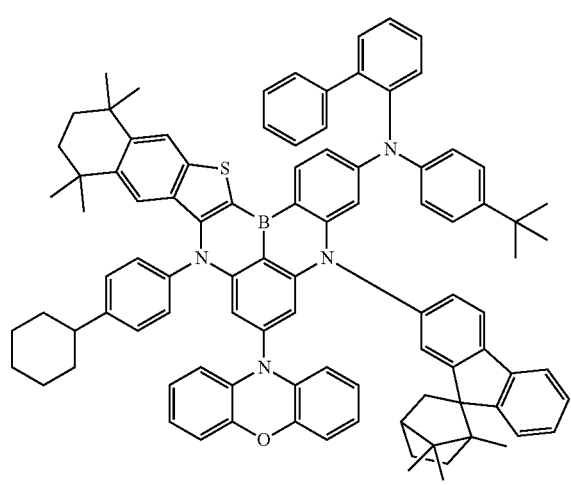
G-227
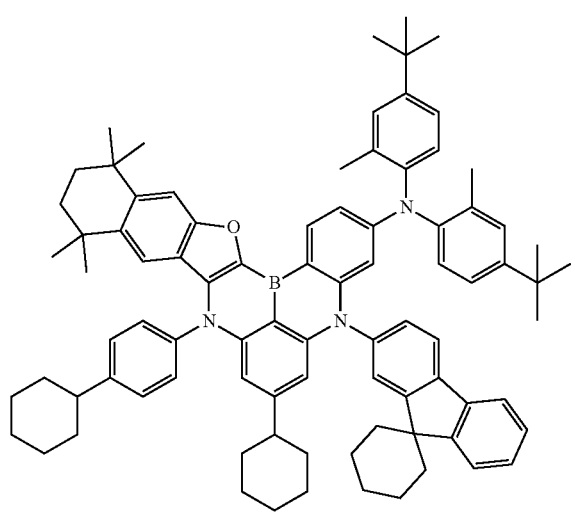
84
-continued
G-228
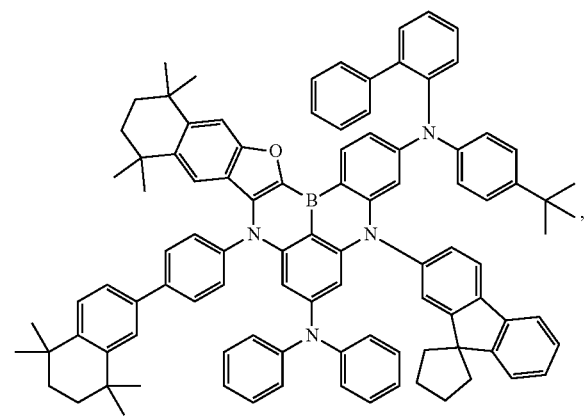
G-229
G-230
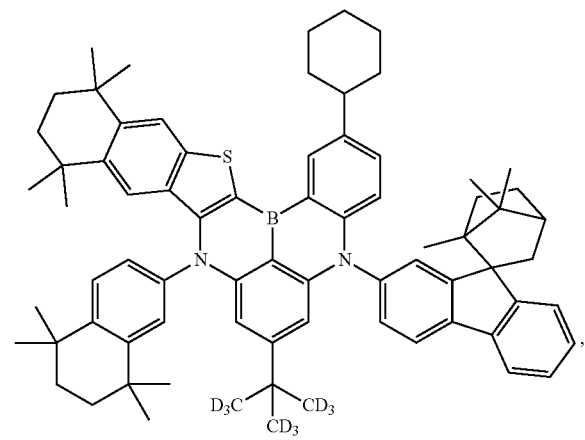

G-231
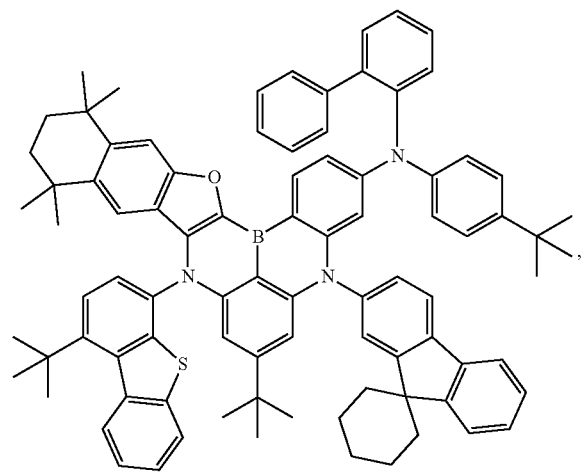
G-234
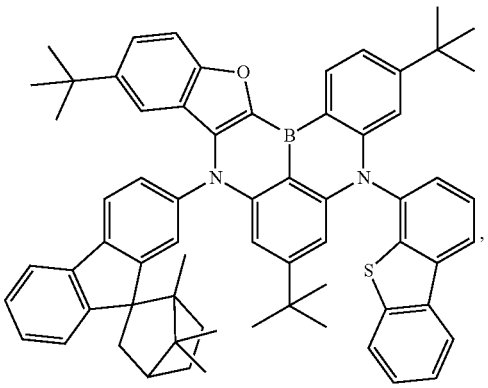
G-232
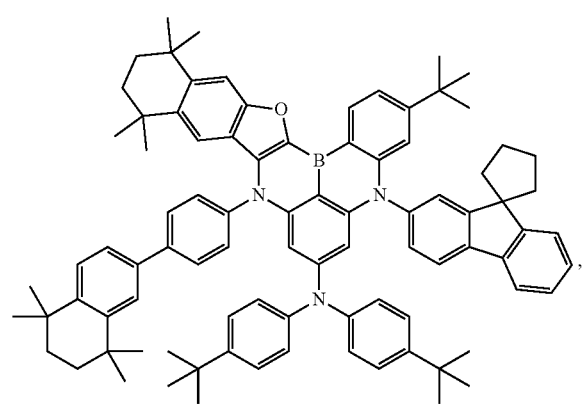
G-235
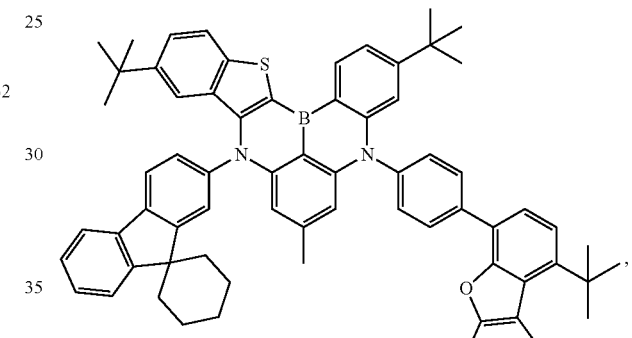
G-233
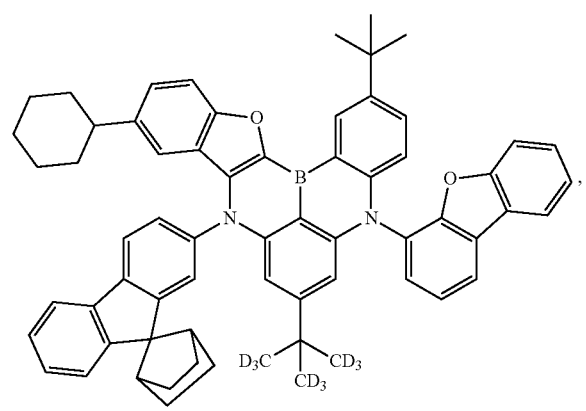
G-236
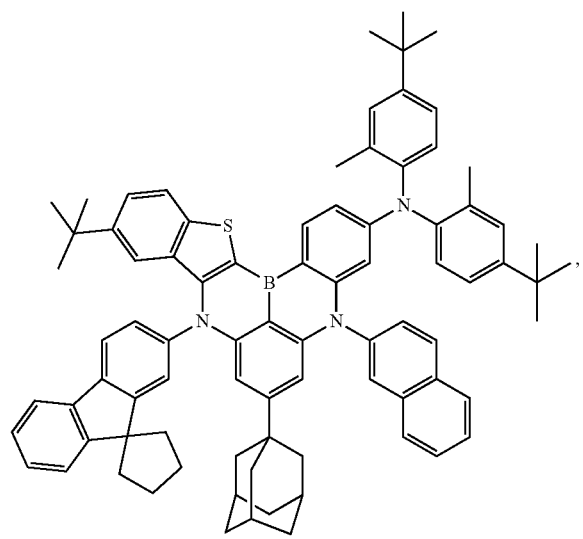

G-237
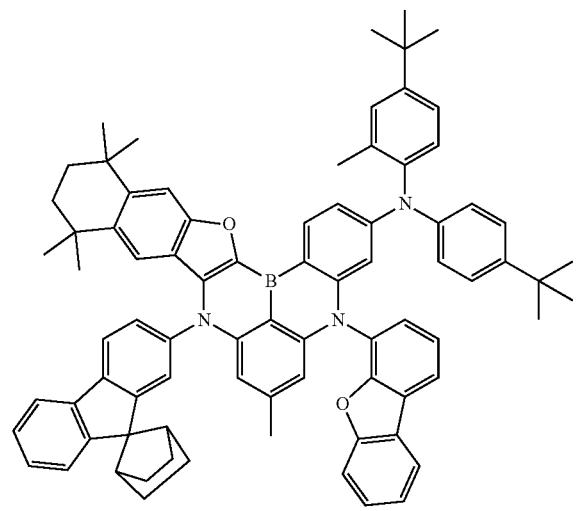
G-238
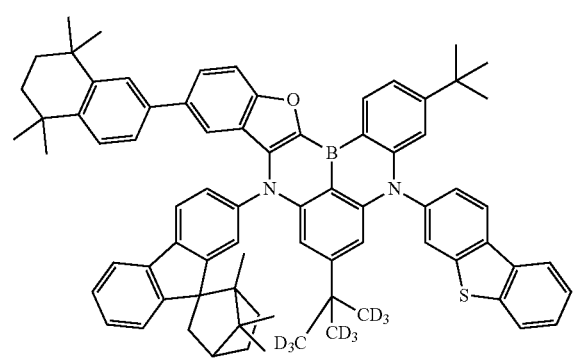
G-239
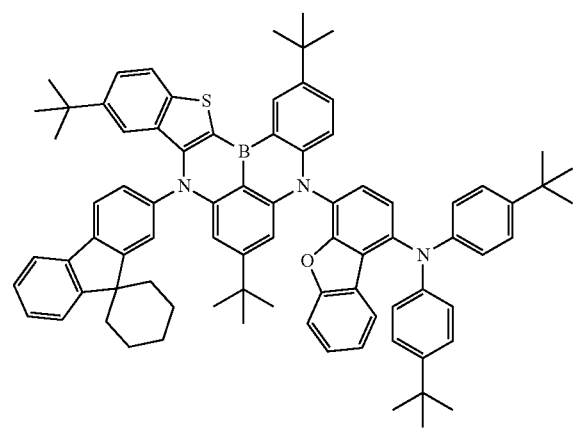
G-240
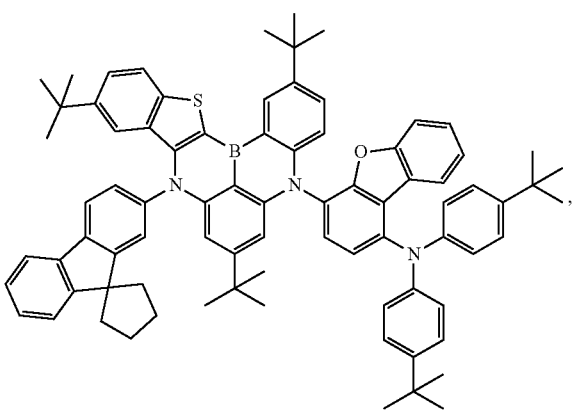
G-241
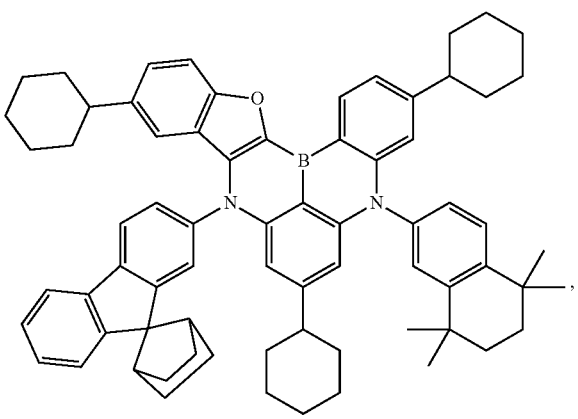
G-242
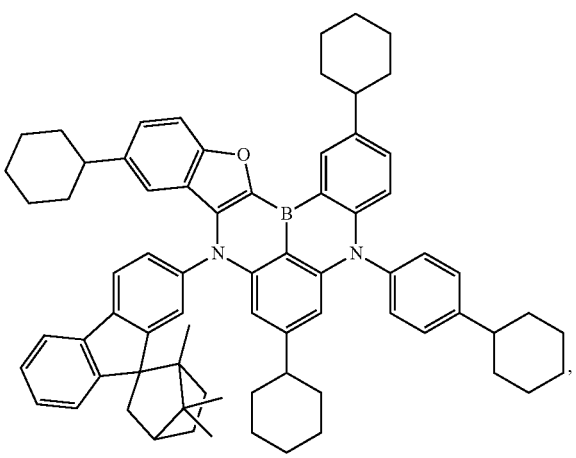

-continued
G-243
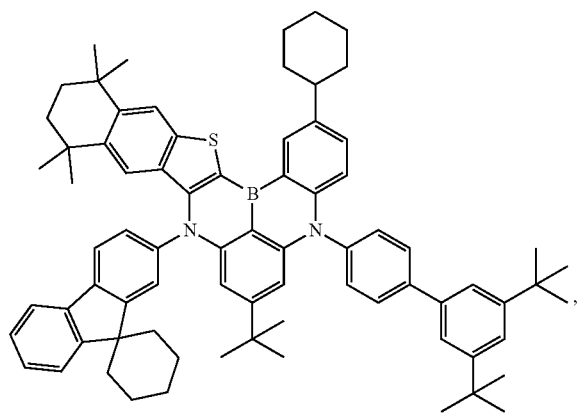
G-244
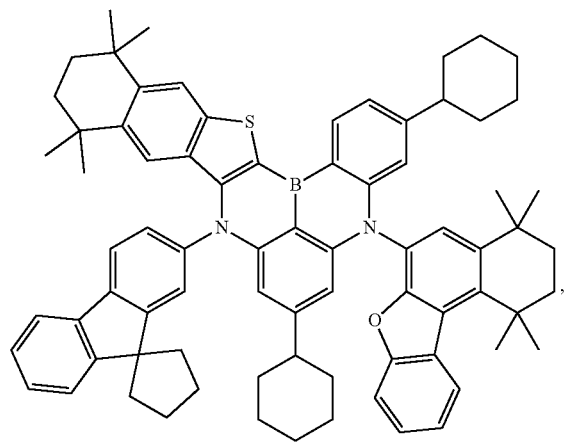
G-245
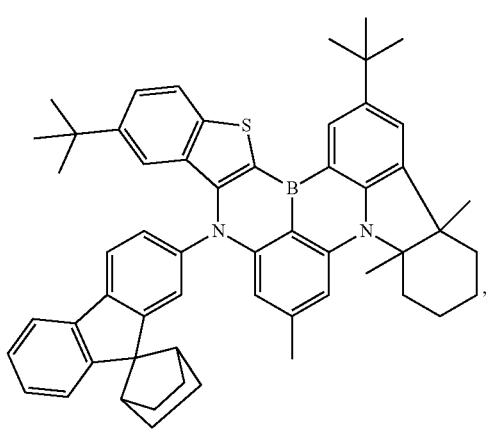
-continued
G-246
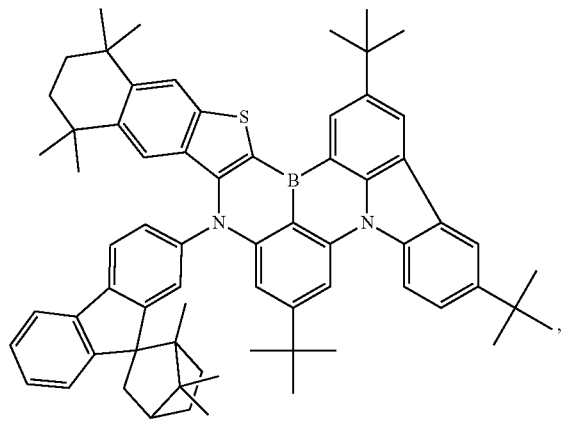
G-247
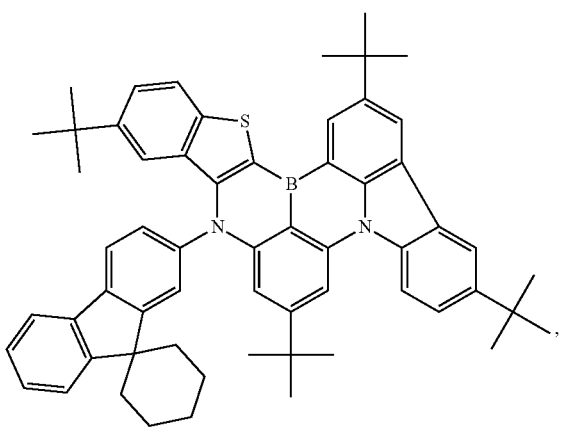
G-248
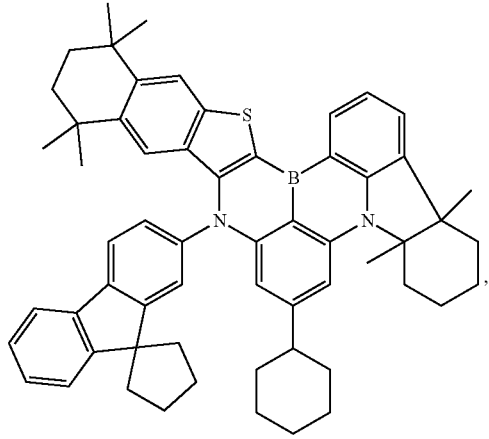

G-249
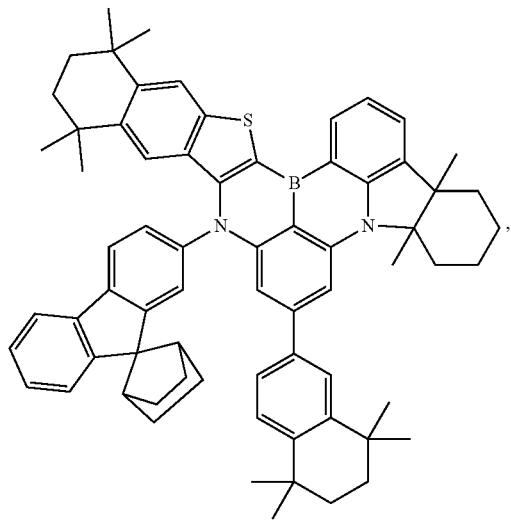
G-250
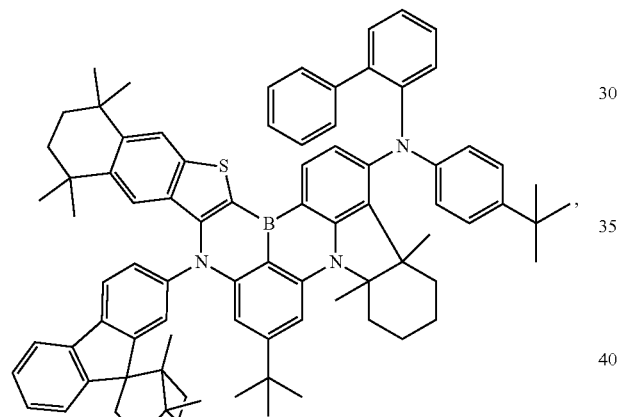
G-251
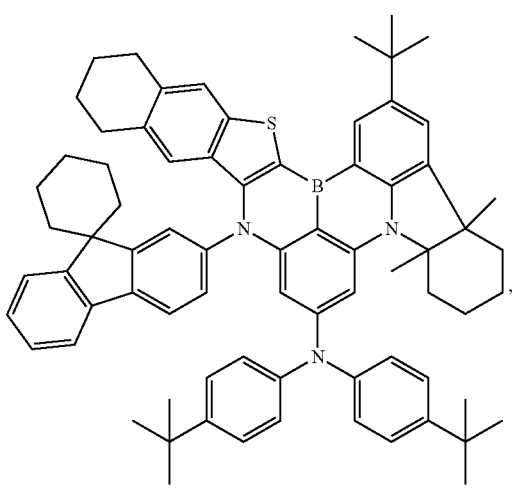
G-252
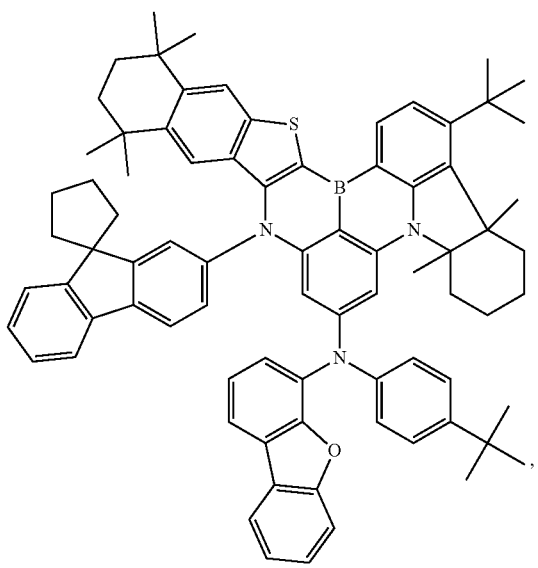
G-253
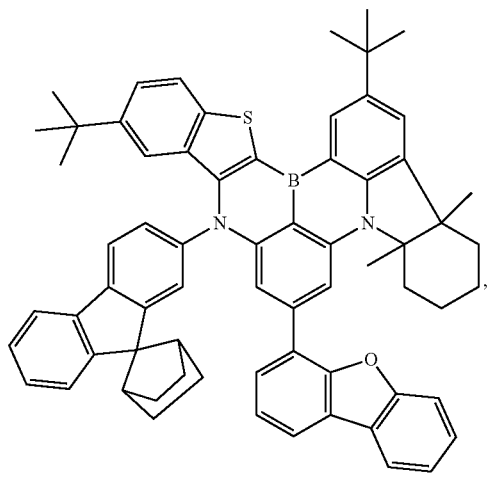
G-254
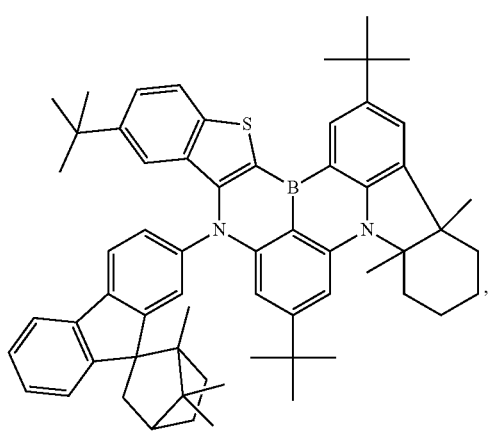

G-255
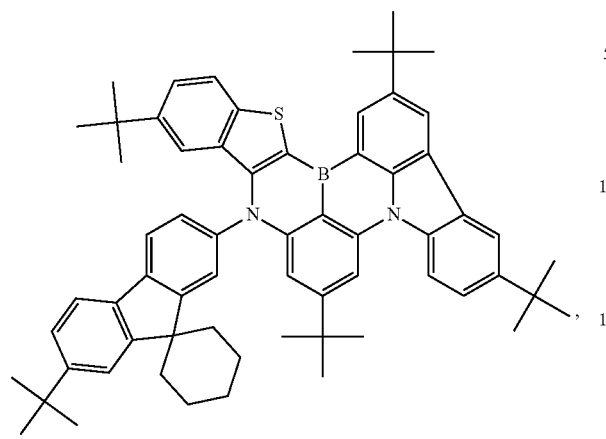
G-256
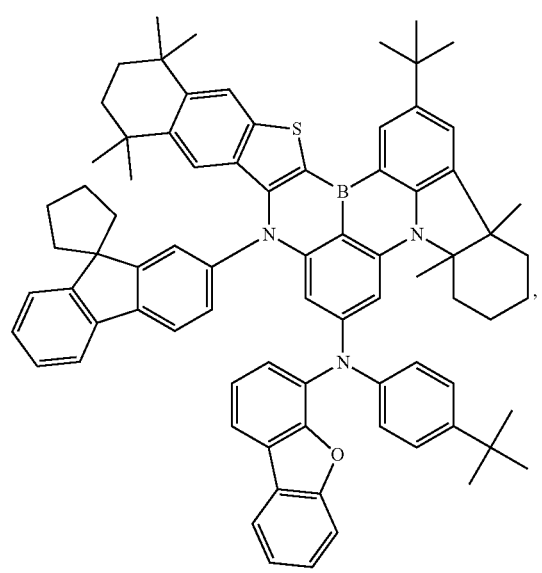
G-257
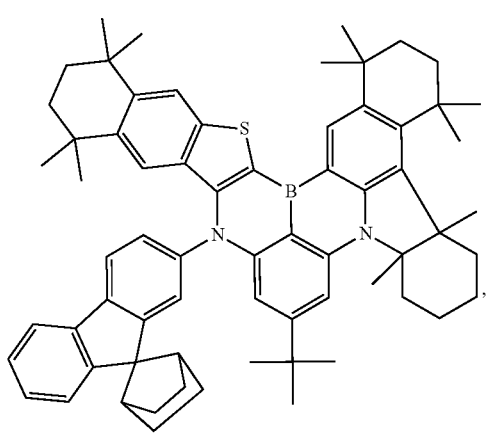
G-258
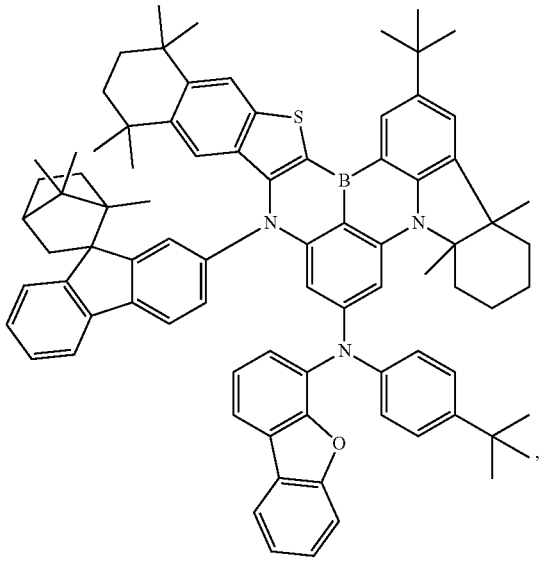
G-259
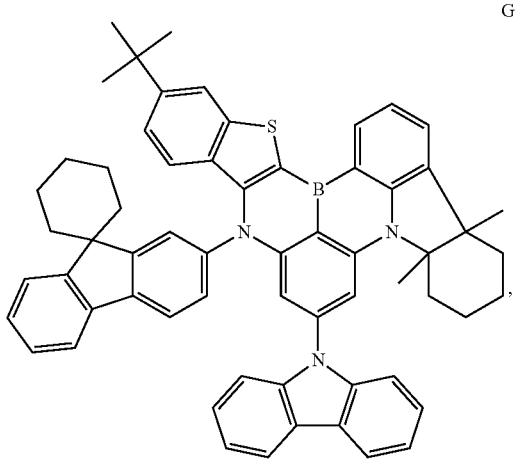
G-260
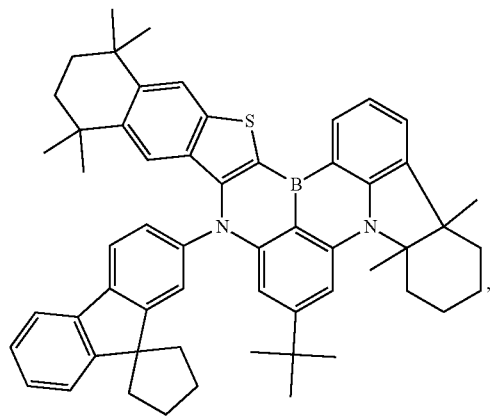

-continued
G-261
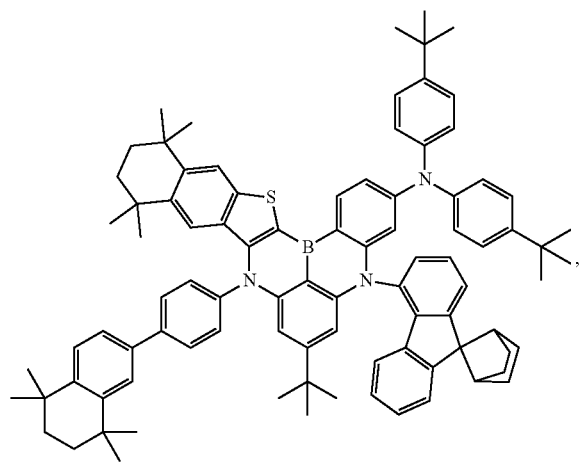
G-262
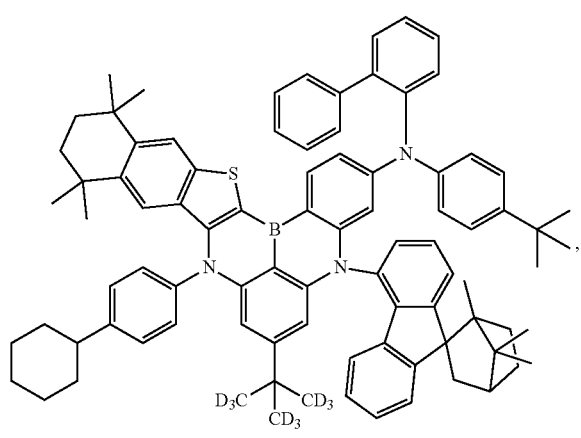
G-263
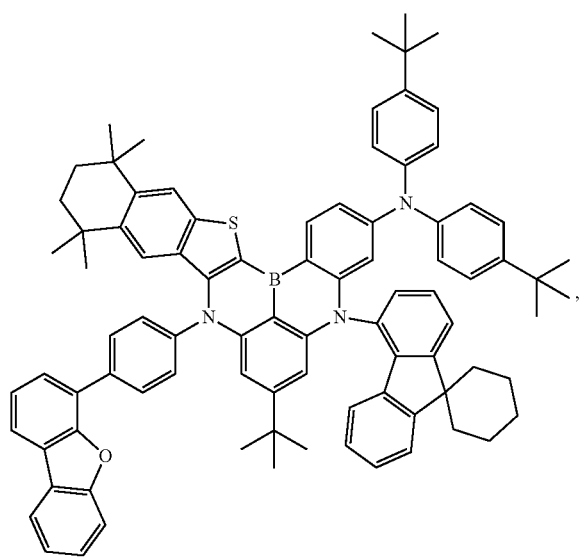
-continued
G-264
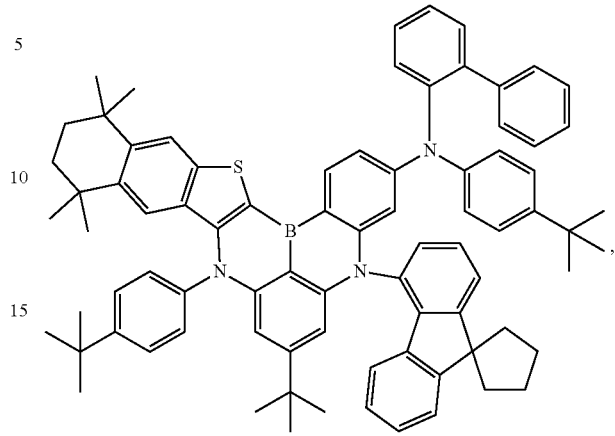
G-265
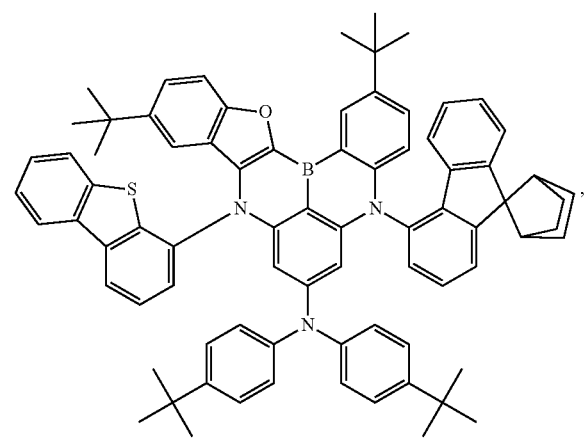
G-266
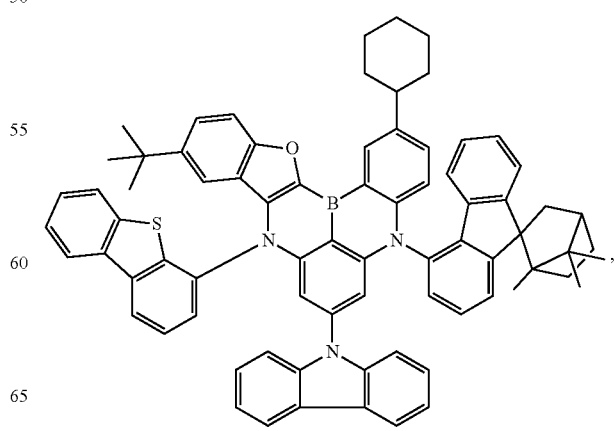

G-267
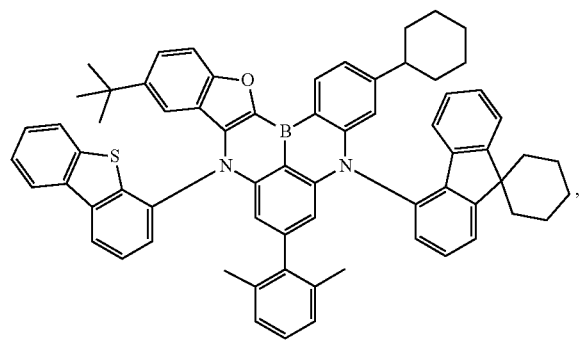
G-270
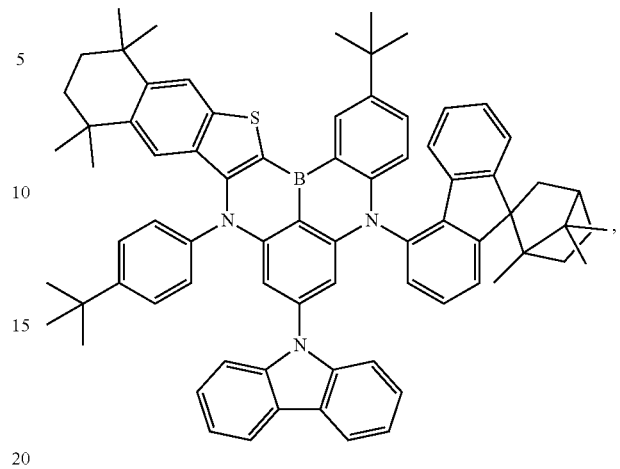
G-268
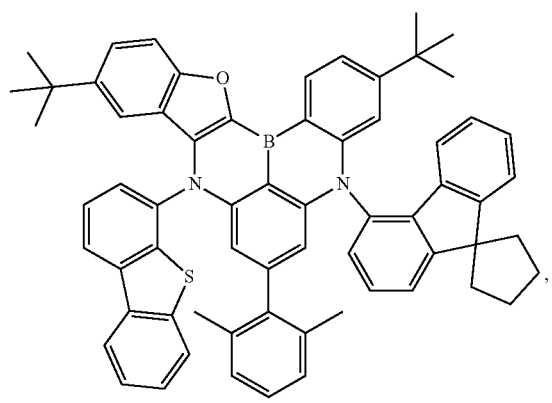
G-271
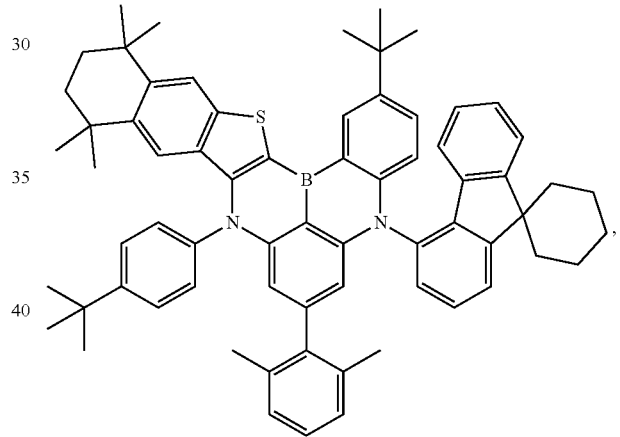
G-269
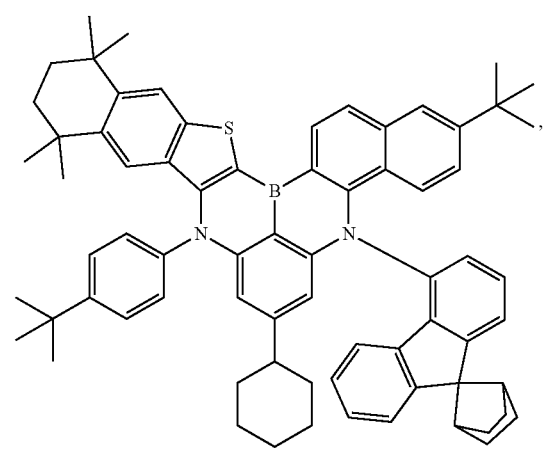
G-272
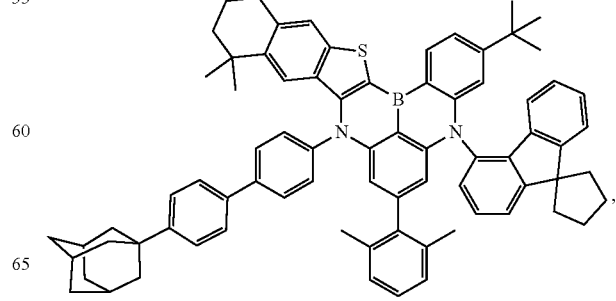

-continued
G-273
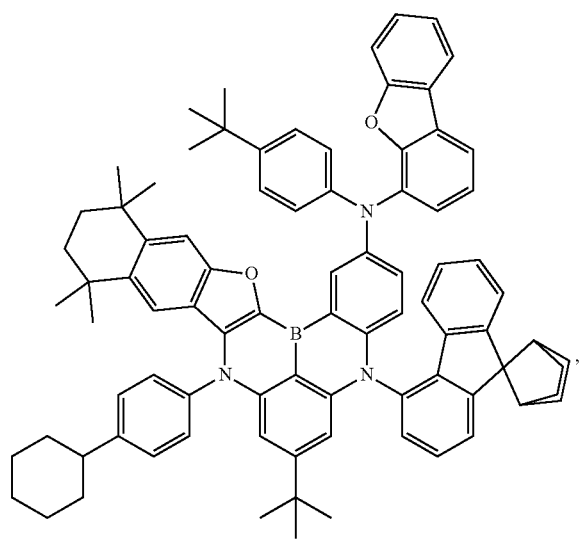
G-274
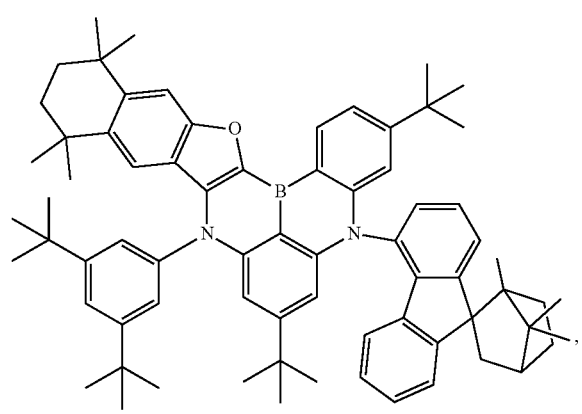
G-275
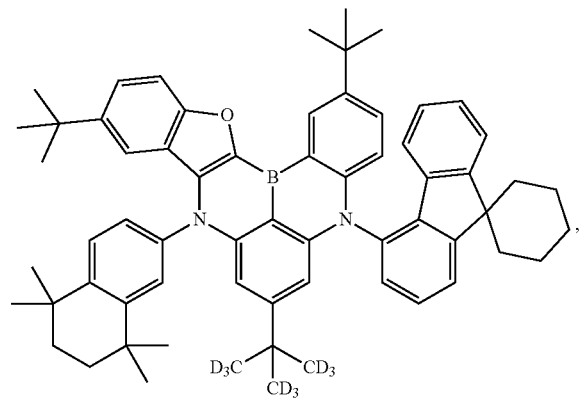
-continued
G-276
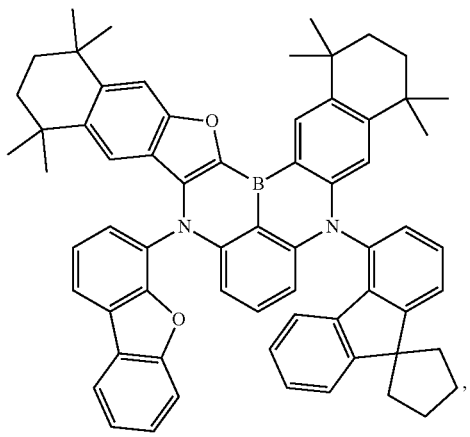
G-277
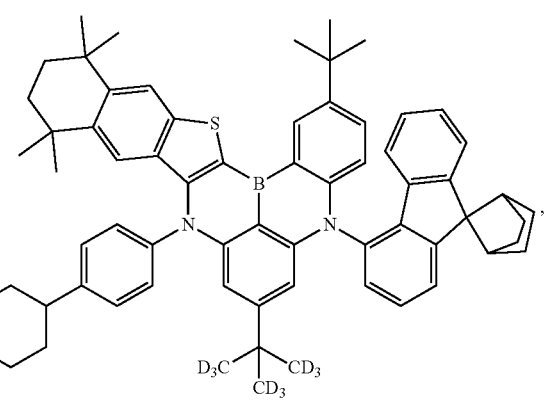
G-278
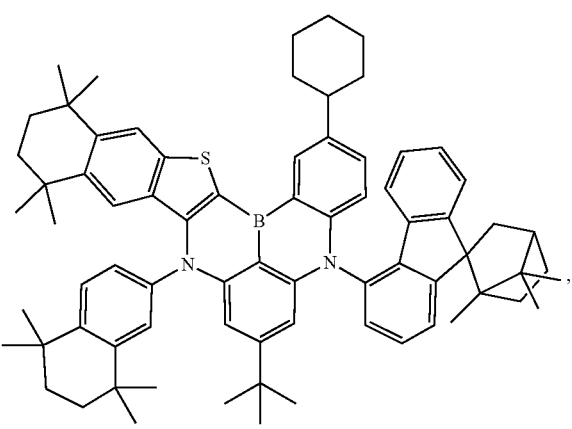

G-279
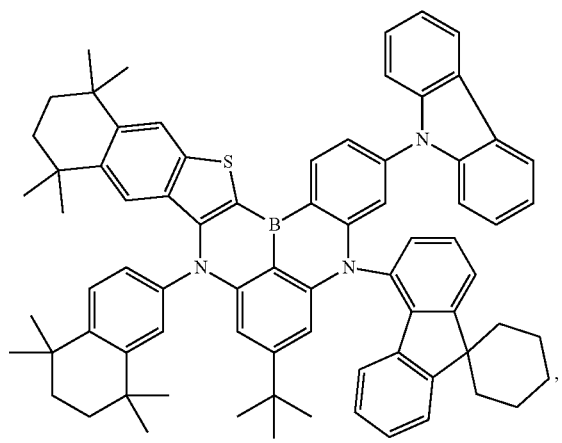
G-282
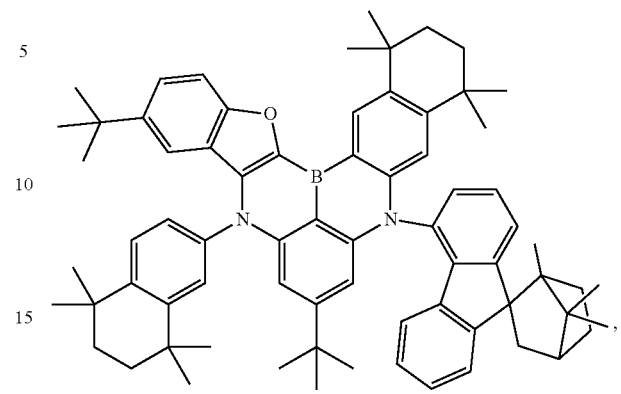
G-280
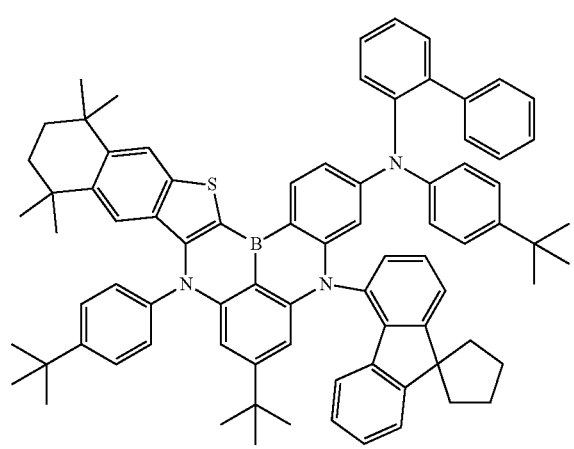
G-283
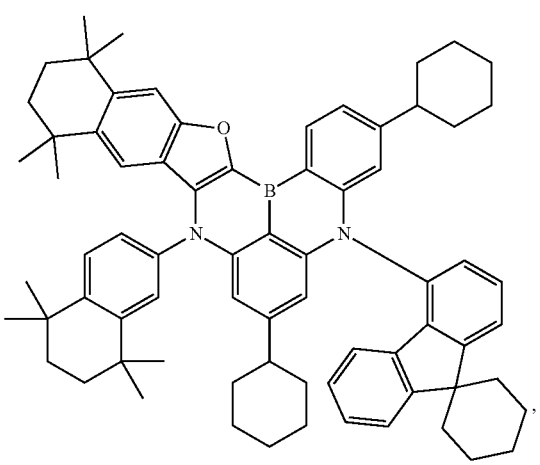
G-281
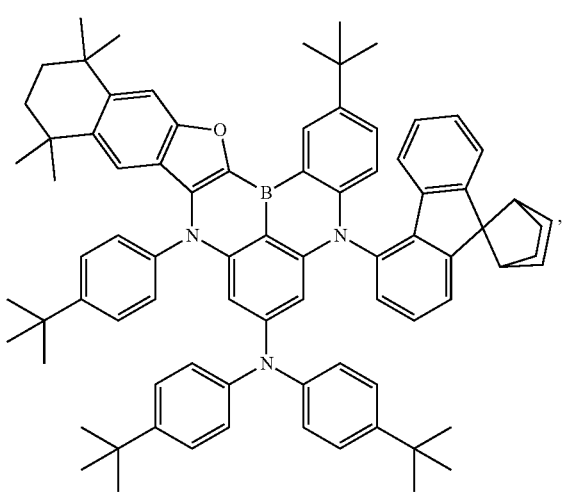
G-284
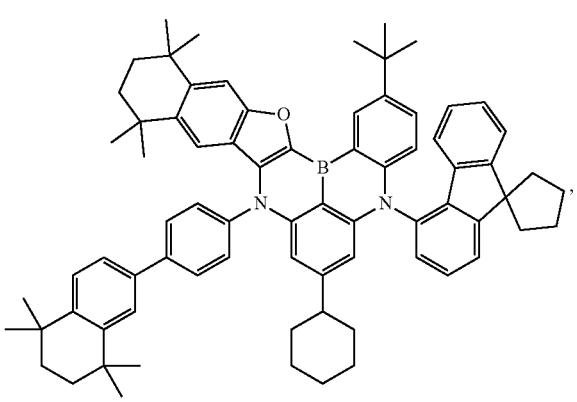

G-285
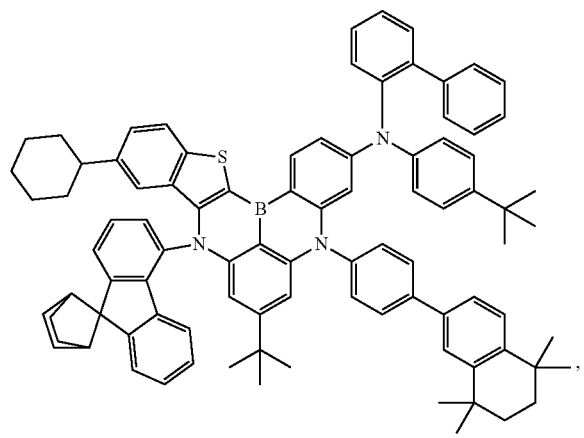
G-289
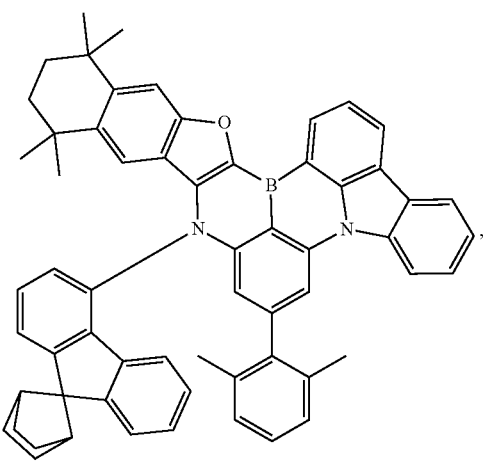
G-286
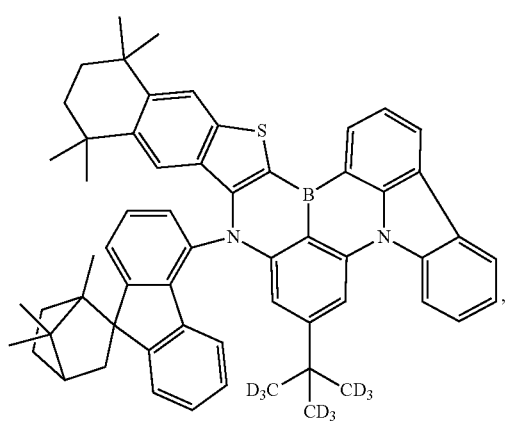
G-290
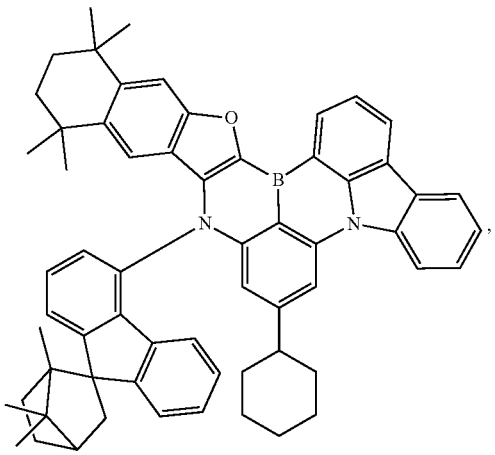
G-287
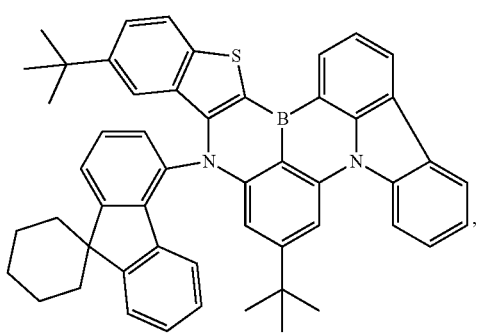
G-288
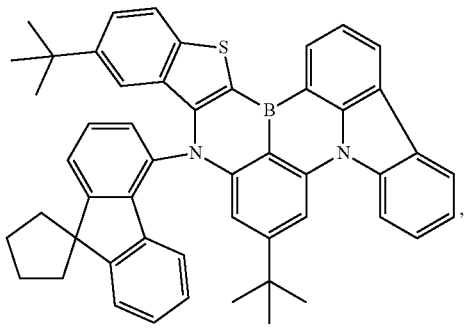
G-291
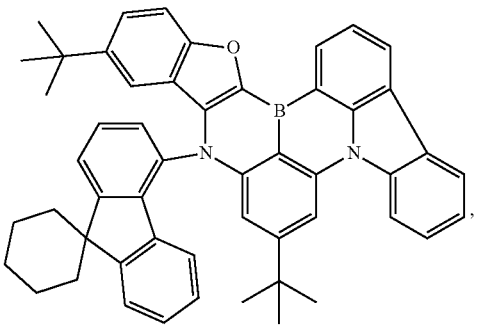

G-292
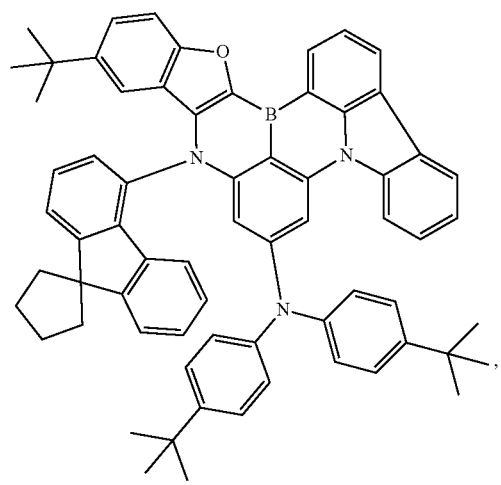
G-295
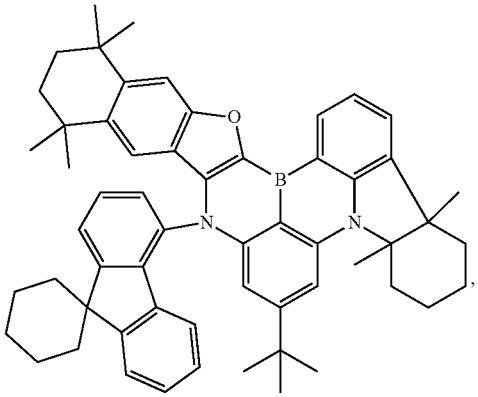
G-293
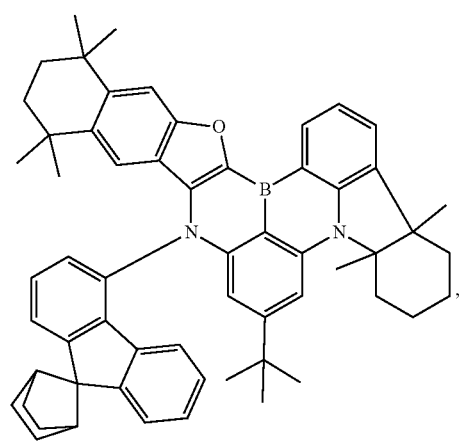
G-296
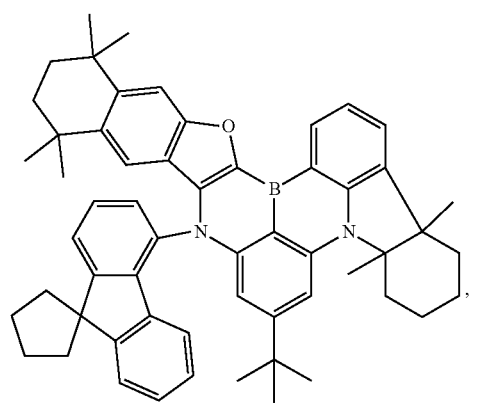
G-294
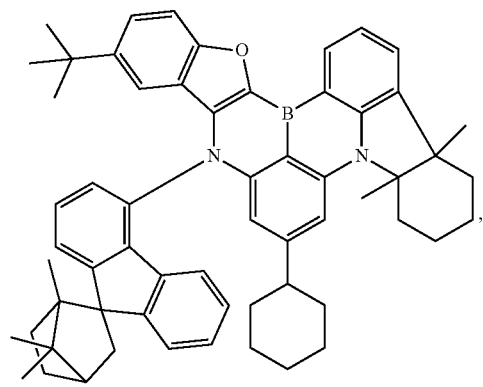
G-297
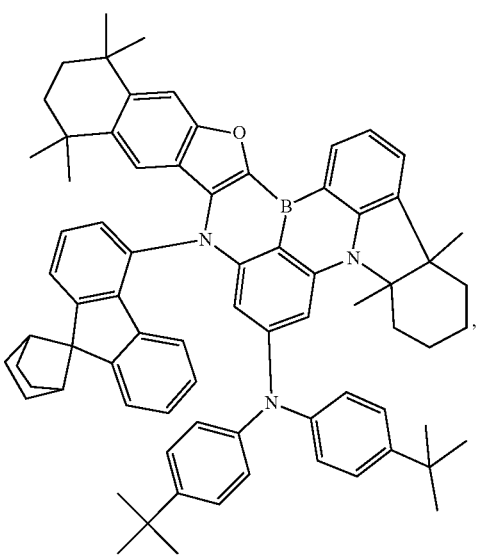

G-298
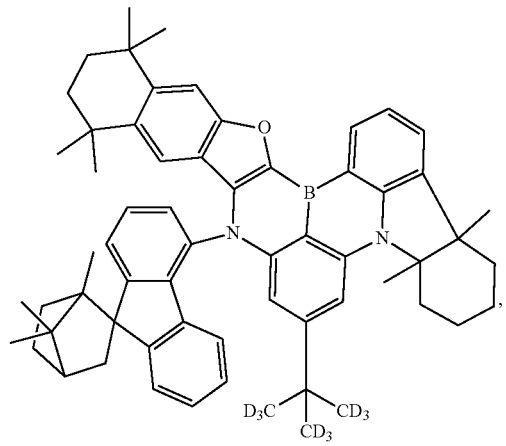
G-301
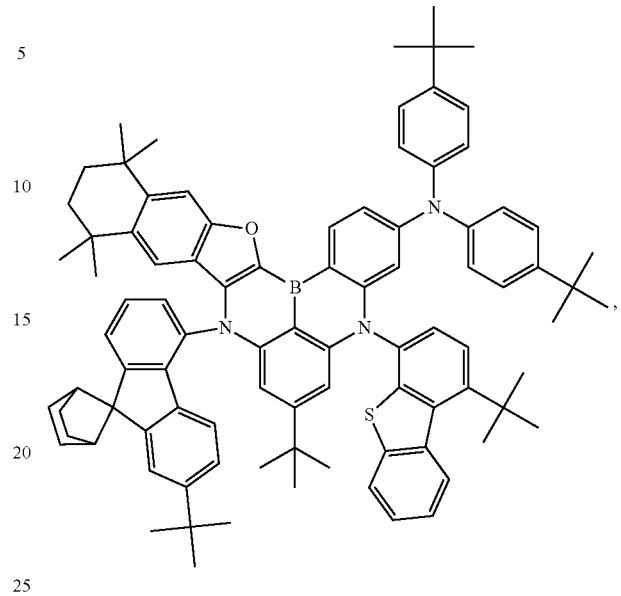
G-299
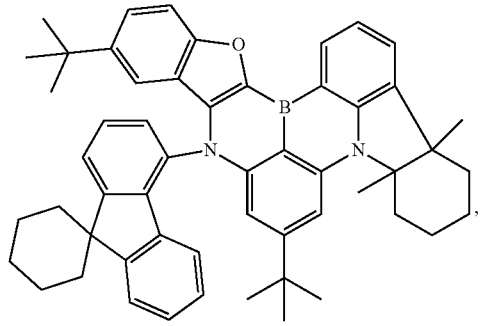
G-302
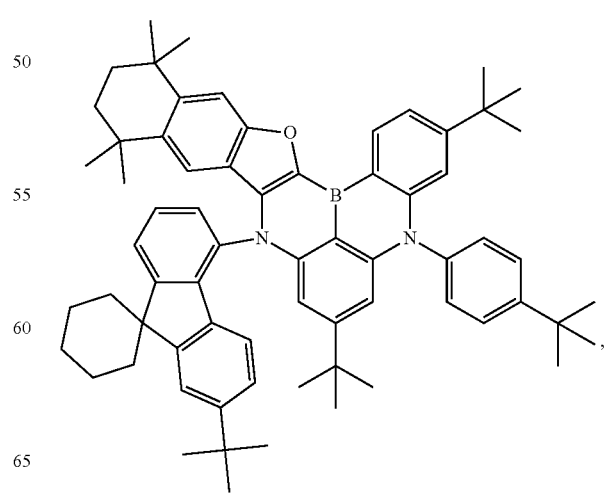
G-300
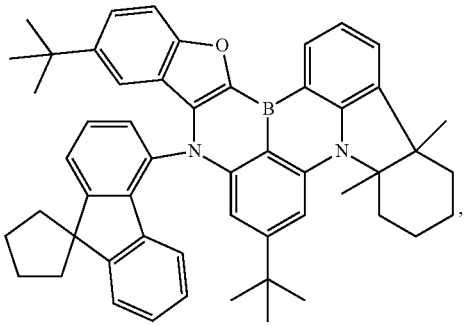
G-303

G-304
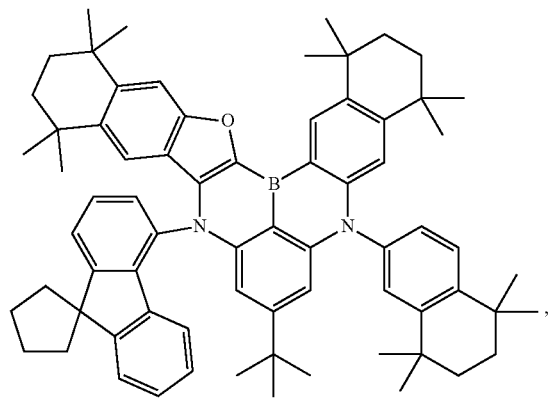
G-307
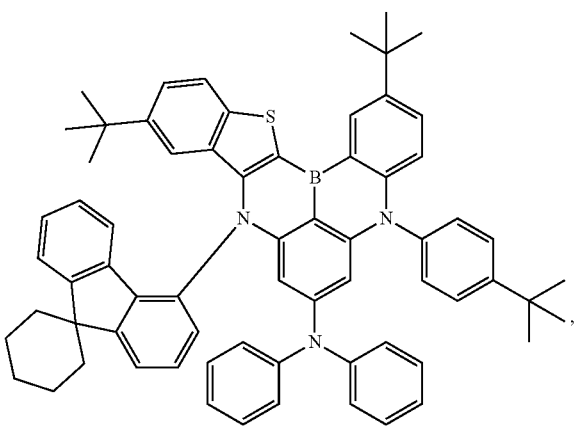
G-305
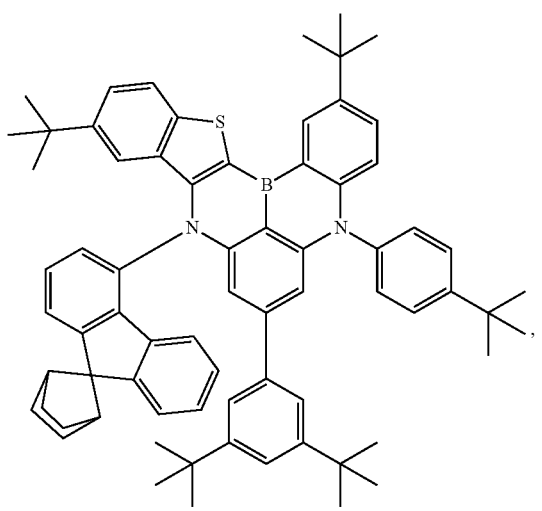
G-308
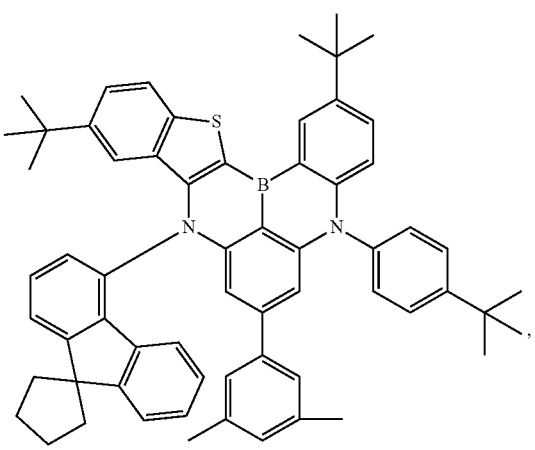
G-306
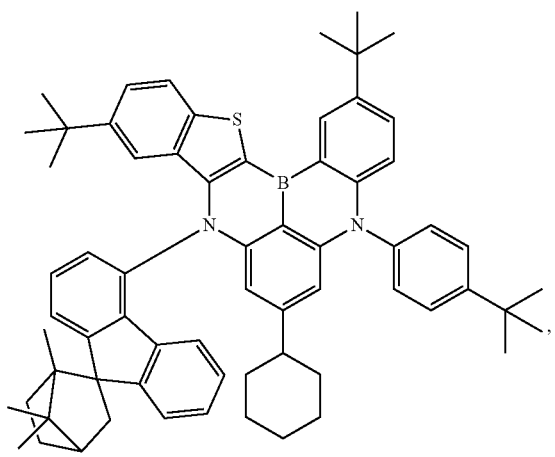
G-309
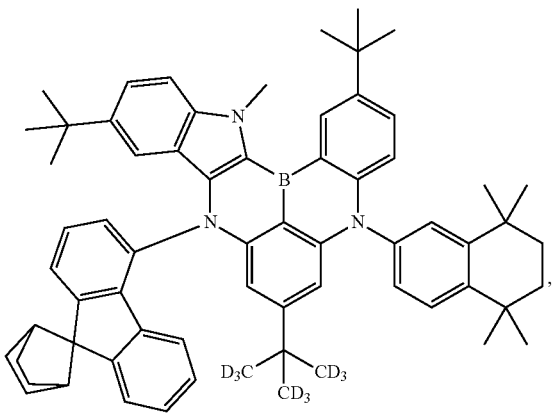

-continued

G-310
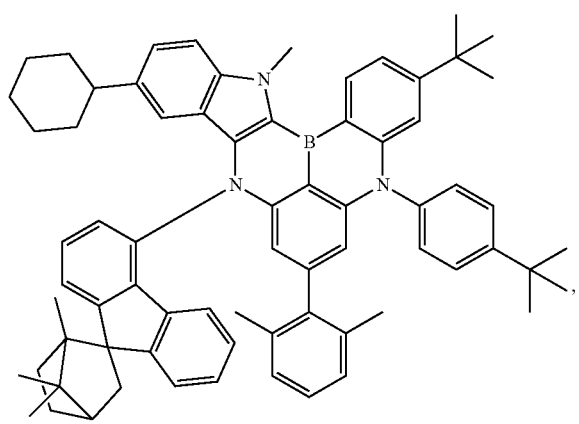

G-311
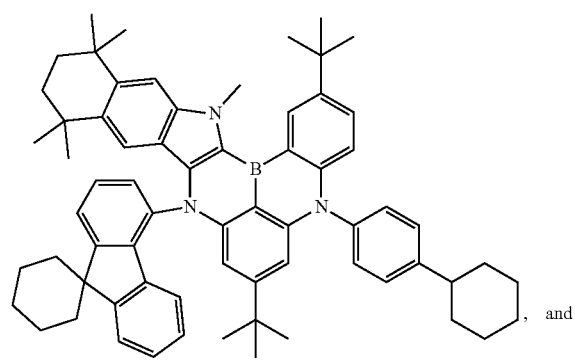
, and

G-312
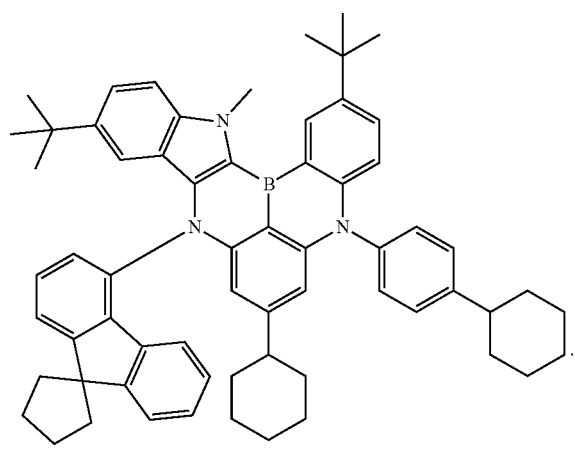

In a second aspect of the present invention, there is provided an organic electroluminescent device comprising an anode, a hole transport region, a luminescent layer, an electron transport region, and a cathode, which are arranged in this order on a substrate plate, wherein the luminescent layer comprises one or more of the organic compounds as mentioned above.

Furthermore, the luminescent layer comprises a host material and a doping material, wherein the doping material comprises one or more of the organic compounds as mentioned above.

Beneficial Effects of the Invention

The heteroatom- and cycloalkyl-containing organic compound of the present invention has a boron-nitrogen structure with multiple resonance effect, wherein a cycloalkyl-containing fluorenyl structure is introduced on the basis of the boron-nitrogen structure. The molecular size is greatly expanded by means of the cycloalkyl group, thereby effectively avoiding a concentration quenching effect, while the molecular orientation is enhanced due to the planarity of the fluorenyl group. In order to further improve the efficiency, a heteroatom is introduced to improve the spin coupling effect, and the oscillator strength is enhanced to improve the energy transfer between a host and a guest; furthermore, by means of the heavy atom effect, the conjugation of a luminous moiety is extended while the efficiency is further improved, avoiding excessive photochromic blue shift, so that the organic compound of the present invention has a good efficiency and lifetime performance.

Therefore, an organic electroluminescent device manufactured by using the heteroatom- and cycloalkyl-containing organic compound of the present invention has a good performance in terms of external quantum efficiency and lifetime.

In the Brief Description of the Drawings: 1—substrate, 2—anode, 3—hole injection layer, 4—hole transport layer, 5—luminescent auxiliary layer, 6—luminescent layer, 7—hole barrier layer, 8—electron transport layer, 9—electron injection layer, and 10—cathode.

DETAILED DESCRIPTION OF EMBODIMENTS

In order to understand the content of the present invention more clearly, the present invention will be described in detail in conjunction with the accompanying drawings and examples.

Figure 1:
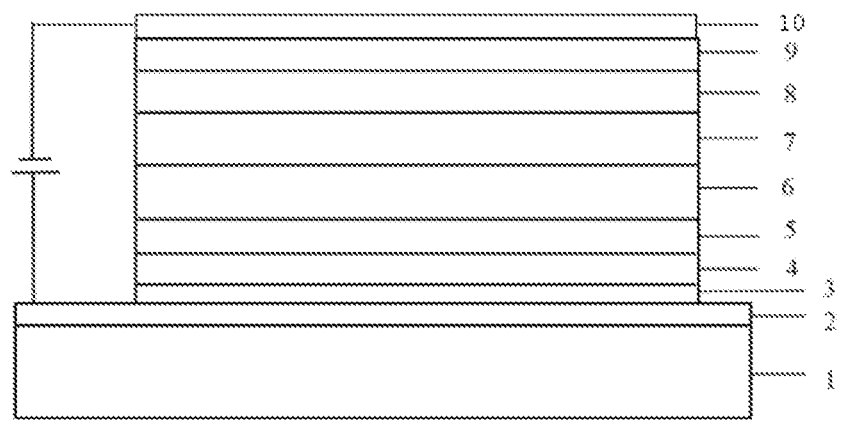
FIG. 1 is a schematic structural diagram of an organic electroluminescent device containing the heteroatom- and cycloalkyl-containing organic compound of the present invention.

The compound of the present invention is suitable for light-emitting elements, display panels, and electronic devices, especially for organic electroluminescent devices. The electronic device described in the present invention is a device that comprises a layer of at least one organic compound, and the device may also comprise an inorganic material or a layer formed entirely of an inorganic material. The electronic device is preferably an organic electroluminescent device (OLED), an organic integrated circuit (O-IC), an organic field-effect transistor (O-FET), an organic thin film transistor (O-TFT), an organic light-emitting transistor (O-LET), an organic solar cell (O-SC), an organic dye-sensitized solar cell (O-DSSC), an organic optical detector, an organic photosensor, an organic field-quenching device (O-FQD), a luminescent electrochemical cell (LEC), an organic laser diode (O-laser), and an organic plasma emitting device. The electronic device is preferably an organic electroluminescent device (OLED). The structural diagram of an exemplary organic electroluminescent device is as shown in FIG. 1.

EXPERIMENTAL PART

In order to understand the content of the present invention more clearly, the polycyclic compound, the preparation method for the compound, and the luminescent characteristics of the device will be explained in detail in conjunction with examples. Various chemical reactions can be applied to the synthesis method for a compound according to one embodiment of the present invention. However, it should be noted that the synthesis method for the compound according to one embodiment of the present invention is not limited to the synthesis method described below. Unless otherwise specified, the subsequent synthesis is carried out in an anhydrous solvent in a protective gas atmosphere. Solvents and reagents can be purchased from conventional reagent suppliers.

Compound
Synthesis of Intermediate
Synthesis of Key Structure
Intermediate I:

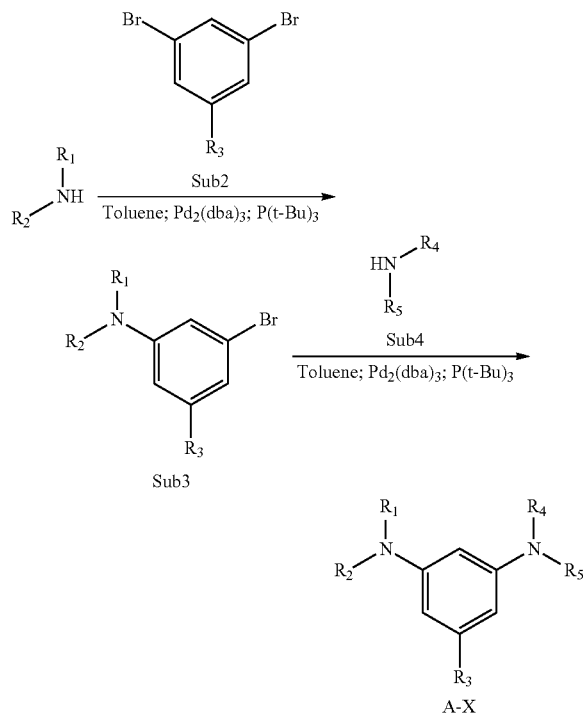

The general formula of intermediate synthesis was as above. The target intermediate could be obtained by means of a common two-step Buchwald-Hartwig coupling synthesis method. A specific example was as follows:

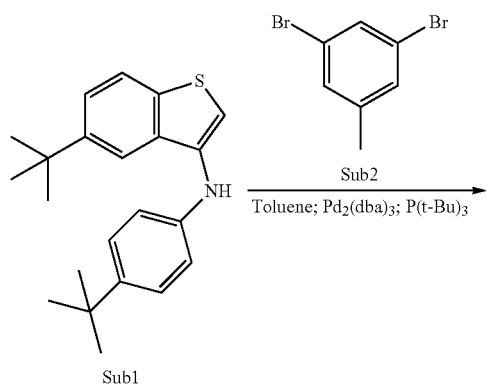

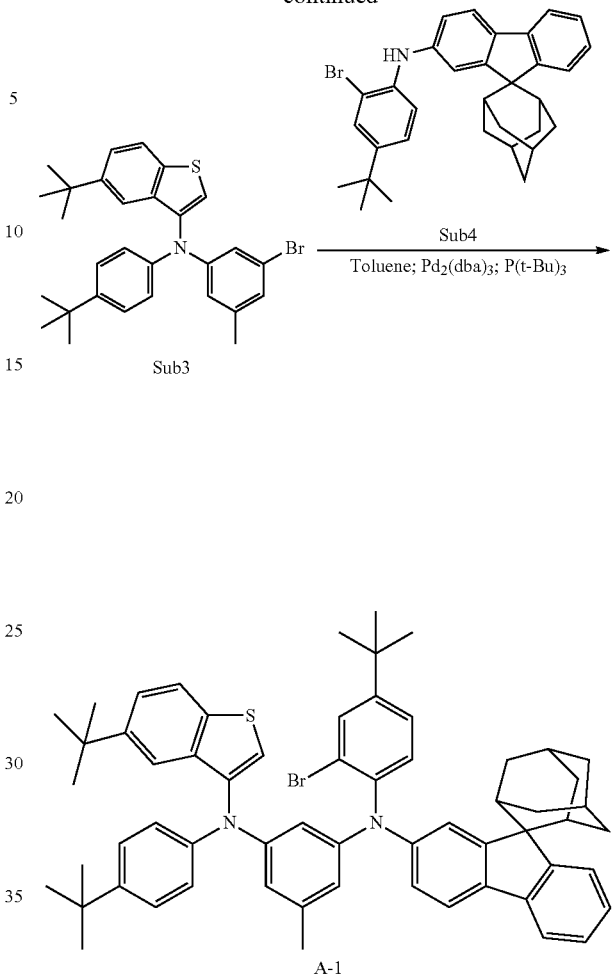

Sub1 (3.38 g, 10 mmol), Sub2 (2.25 g, 9 mmol), and sodium tert-butoxide (1.05 g, 11 mmol) were added to toluene (50 ml), bis(dibenzylideneacetone)palladium (274.28 mg, 0.30 mmol) and tri-tert-butylphosphine (121.2 mg, 0.6 mmol) were then introduced under nitrogen protection, the reaction system was then heated to reflux and maintained for 10 hours, cooled to room temperature, then quenched by adding water, and separated, the organic phase was filtered, then dried with anhydrous sodium sulfate, and subjected to rotary evaporation to remove the solvent, and the crude product was purified by column chromatography. Sub3 was finally obtained: 3.74 g (yield: 82%), MS (m/z) (M+): 507.

Sub3 (5.07 g, 10 mmol), Sub4 (5.13 g, 10 mmol), and sodium tert-butoxide (1.05 g, 11 mmol) were added to toluene (100 ml), bis(dibenzylideneacetone)palladium (274.28 mg, 0.30 mmol) and tri-tert-butylphosphine (121.2 mg, 0.6 mmol) were then introduced under nitrogen protection, the reaction system was then heated to reflux and maintained for 10 hours, cooled to room temperature, then quenched by adding water, and separated, the organic phase was filtered, then dried with anhydrous sodium sulfate, and subjected to rotary evaporation to remove the solvent, and the crude product was purified by column chromatography. Product A-1 was finally obtained: 5.16 g (yield: 55%), MS (m/z) (M+): 938.

Intermediate II:

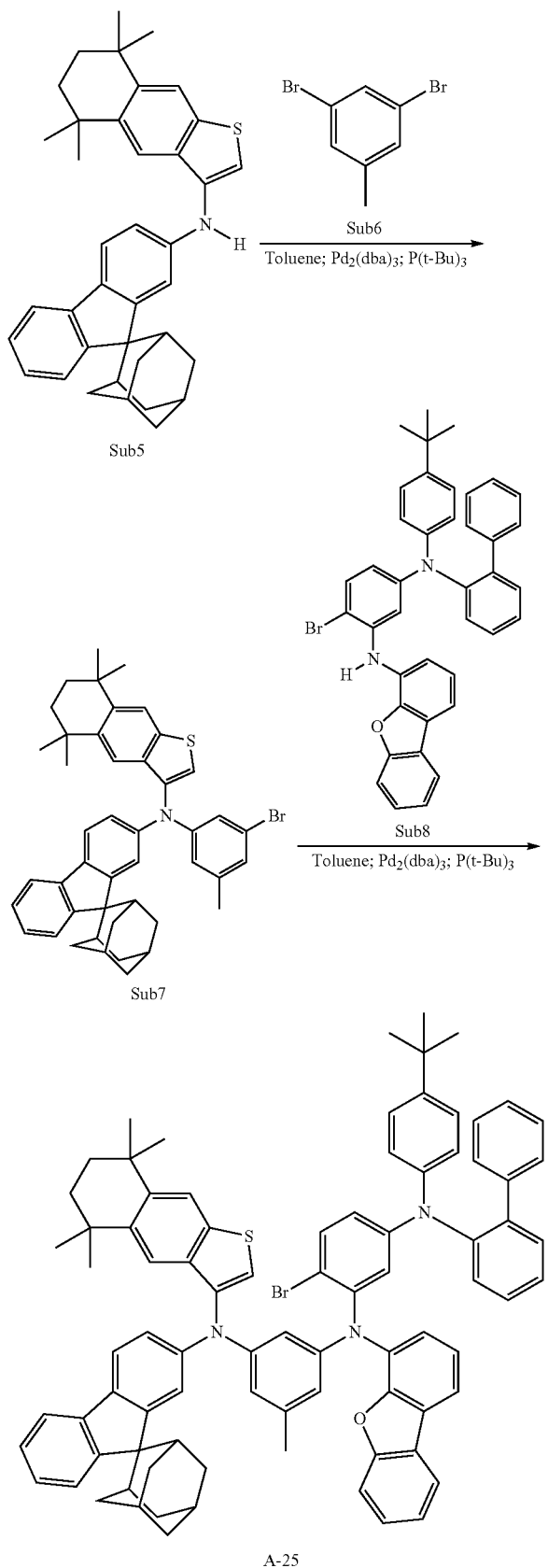

Sub5 (5.44 g, 10 mmol), Sub6 (2.25 g, 9 mmol), and sodium tert-butoxide (1.05 g, 11 mmol) were added to toluene (50 ml), bis(dibenzylideneacetone)palladium (274.28 mg, 0.30 mmol) and tri-tert-butylphosphine (121.2 mg, 0.6 mmol) were then introduced under nitrogen protection, the reaction system was then heated to reflux and maintained for 10 hours, cooled to room temperature, then quenched by adding water, and separated, the organic phase was filtered, then dried with anhydrous sodium sulfate, and subjected to rotary evaporation to remove the solvent, and the crude product was purified by column chromatography. Sub3 was finally obtained: 4.81 g (yield: 75%), MS (m/z) (M+): 713.

Sub7 (7.13 g, 10 mmol), Sub8 (6.38 g, 10 mmol), and sodium tert-butoxide (1.05 g, 11 mmol) were added to toluene (100 ml), bis(dibenzylideneacetone)palladium (274.28 mg, 0.30 mmol) and tri-tert-butylphosphine (121.2 mg, 0.6 mmol) were then introduced under nitrogen protection, the reaction system was then heated to reflux and maintained for 10 hours, cooled to room temperature, then quenched by adding water, and separated, the organic phase was filtered, then dried with anhydrous sodium sulfate, and subjected to rotary evaporation to remove the solvent, and the crude product was purified by column chromatography. Product A-25 was finally obtained: 6.73 g (yield: 53%), MS (m/z) (M+): 1270.

By means of the above process, other intermediates could be obtained in a similar way to A-1 or A-25.

Synthesis Example 1

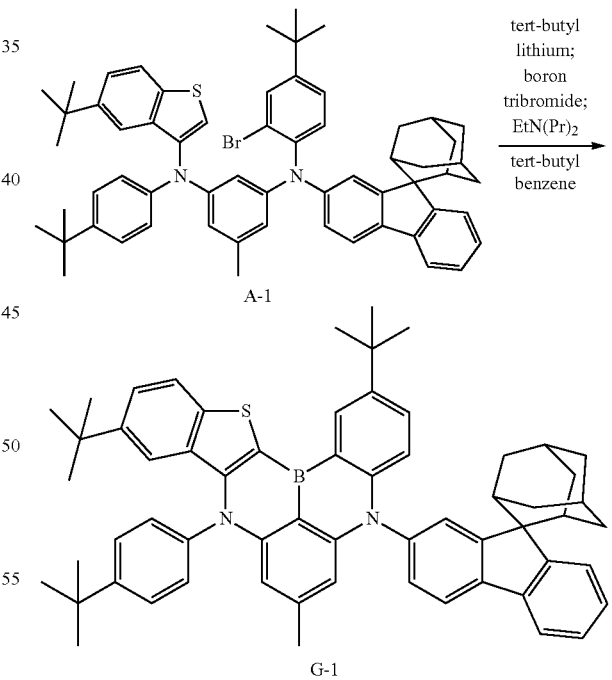

A-1 (9.38 g, 10 mmol) was added to tert-butyl benzene (125 ml), the mixture was then cooled to 0° C. under nitrogen protection, and 12.4 ml of a solution of 1.7 M tert-butyl lithium (21 mmol) in pentane was added; the mixture was heated to 60° C., stirred for 2 hours, and then cooled to 0° C., and 2.0 ml (21 mmol) of boron tribromide was added and stirred for 0.5 h; the mixture was then cooled to 0° C., and 3.65 ml (21 mmol) of N,N-diisopropylethylamine was added; the mixture was heated to 60° C., stirred for 2 h, cooled to room temperature, quenched by adding ice water, and separated, the organic phase was filtered, and anhydrous magnesium sulfate was then used to remove water; and after rotary evaporation to remove the organic solvent, the crude product was purified by recrystallization from dichloromethane and n-heptane. Product G-1 was finally obtained: 1.04 g (yield: 12%), MS (m/z) (M+): 867.

Synthesis Example 2

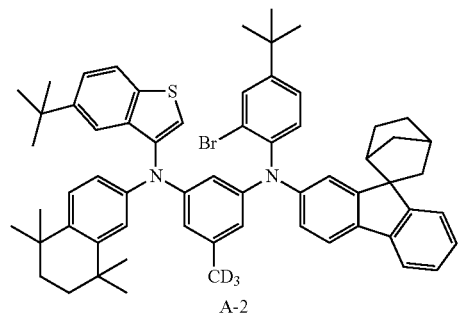

A-2

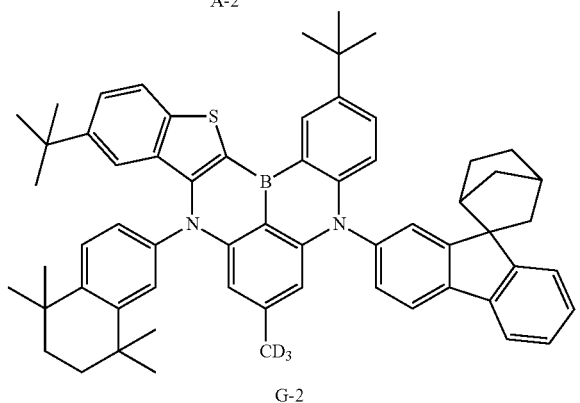

G-2

This method was the same as in Example 1, except that A-2 (9.55 g, 10 mmol) was used instead of A-1 to finally obtain product G-2: 1.06 g (yield: 12%), MS (m/z) (M+): 884.

Synthesis Example 3

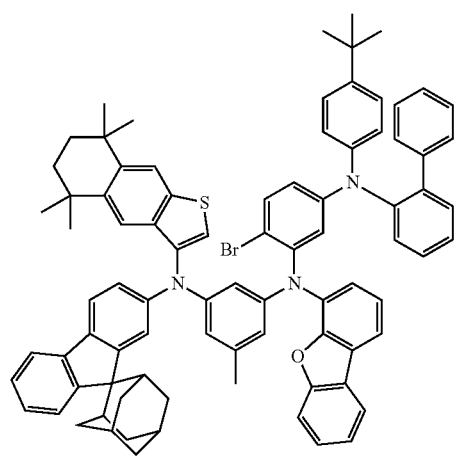

A-25

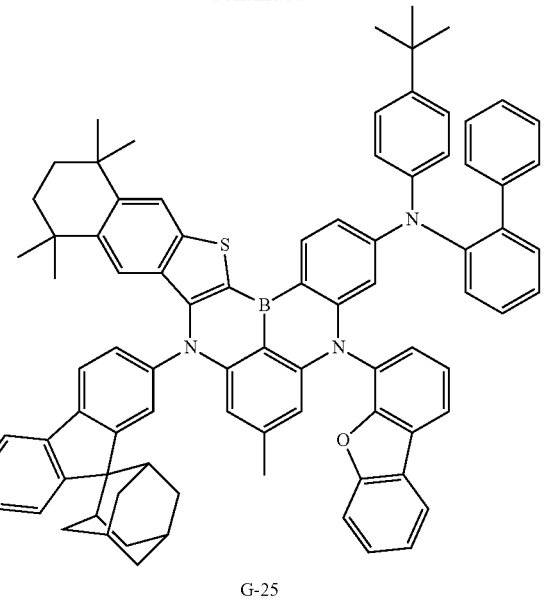

G-25

This method was the same as in Example 1, except that A-25 (12.7 g, 10 mmol) was used instead of A-1 to finally obtain product G-25: 0.96 g (yield: 8%), MS (m/z) (M+): 1198.

Synthesis Example 4

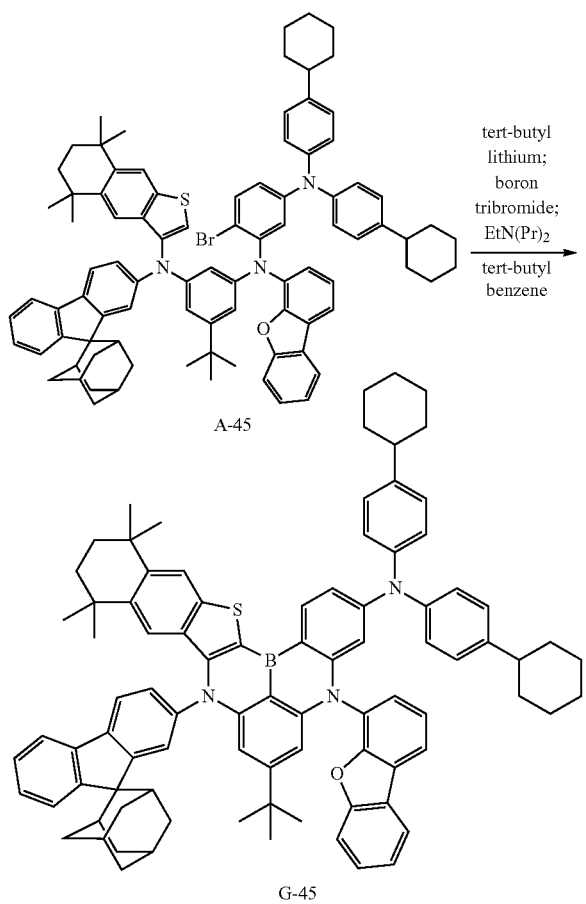

A-45

G-45

This method was the same as in Example 1, except that A-45 (13.44 g, 10 mmol) was used instead of A-1 to finally obtain product G-45: 1.4 g (yield: 11%), MS (m/z) (M+): 1273.

Synthesis Example 5

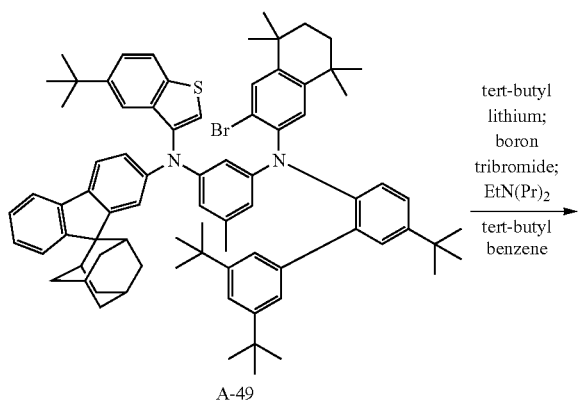

A-49

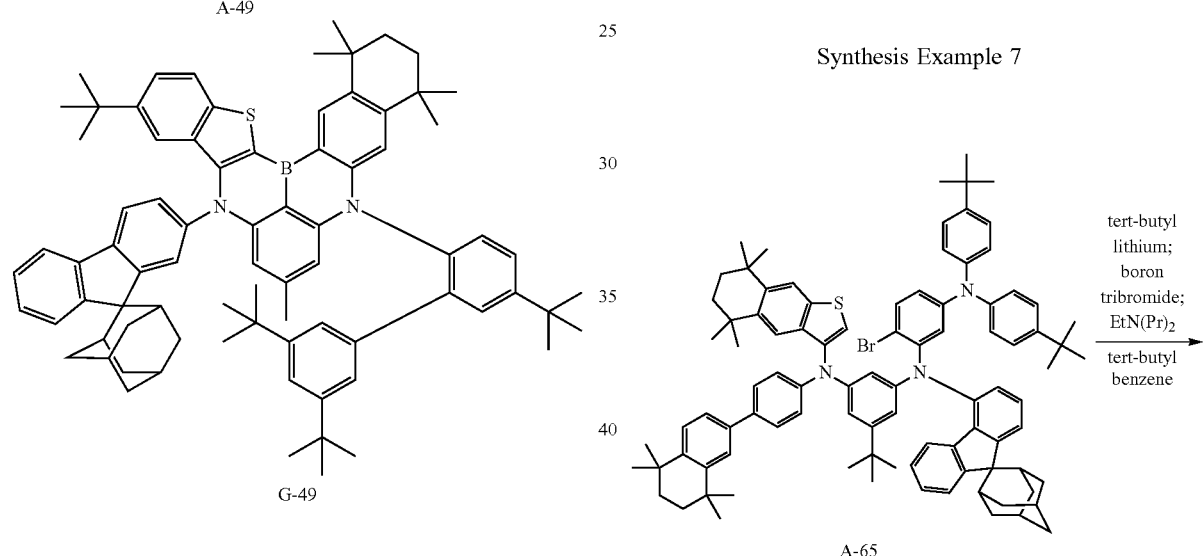

G-49

This method was the same as in Example 1, except that A-49 (11.18 g, 10 mmol) was used instead of A-1 to finally obtain product G-49: 1.05 g (yield: 10%), MS (m/z) (M+): 1047.

Synthesis Example 6

A-57

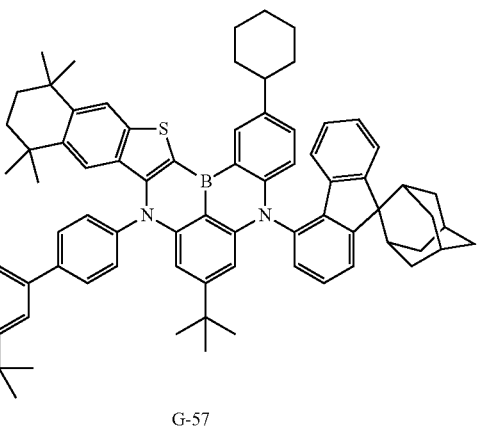

G-57

This method was the same as in Example 1, except that A-57 (11.81 g, 10 mmol) was used instead of A-1 to finally obtain product G-57: 1.22 g (yield: 11%), MS (m/z) (M+): 1109.

Synthesis Example 7

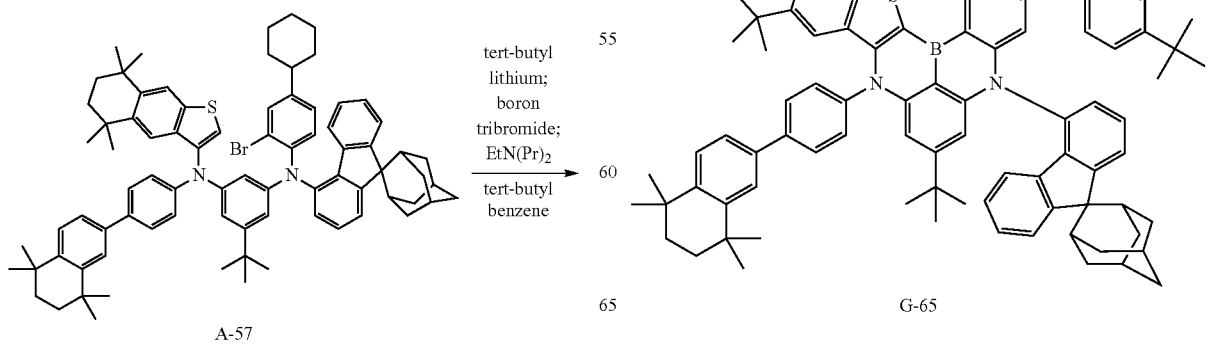

A-65

G-65

This method was the same as in Example 1, except that A-65 (11.91 g, 10 mmol) was used instead of A-1 to finally obtain product G-65: 1.57 g (yield: 14%), MS (m/z) (M+): 1119.
Synthesis Example 8
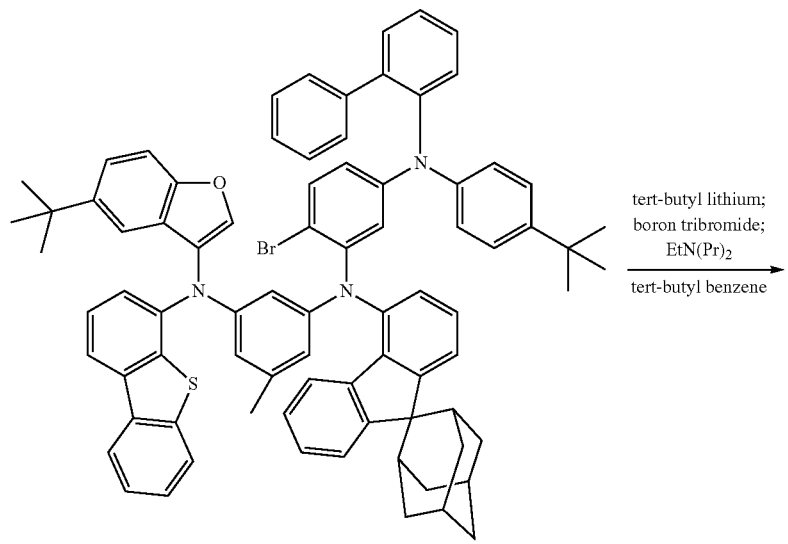
A-73
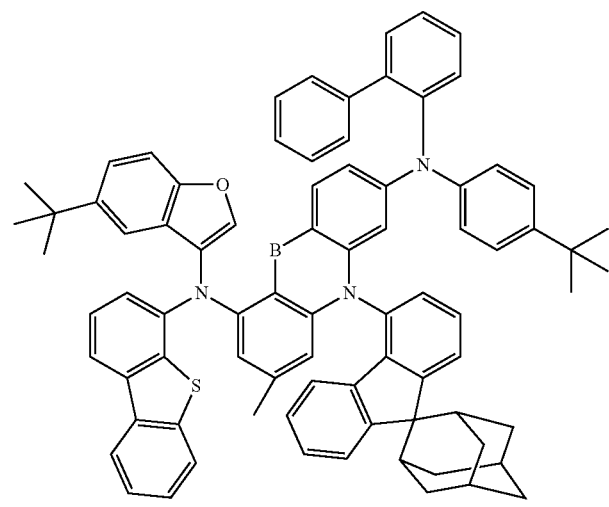
G-73

This method was the same as in Example 1, except that A-73 (13.88 g, 10 mmol) was used instead of A-1 to finally obtain product G-73: 1.58 g (yield: 12%), MS (m/z) (M+): 1317.
Synthesis Example 9
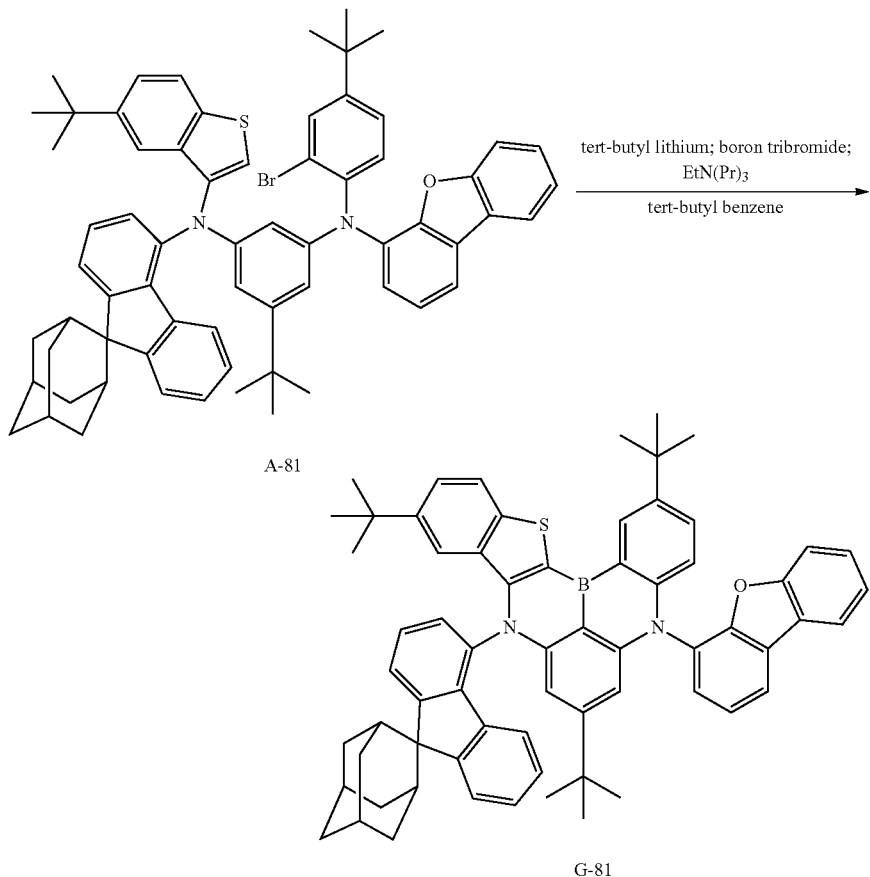
This method was the same as in Example 1, except that A-81 (12.15 g, 10 mmol) was used instead of A-1 to finally obtain product G-81: 1.37 g (yield: 12%), MS (m/z) (M+): 1144.
Synthesis Example 10
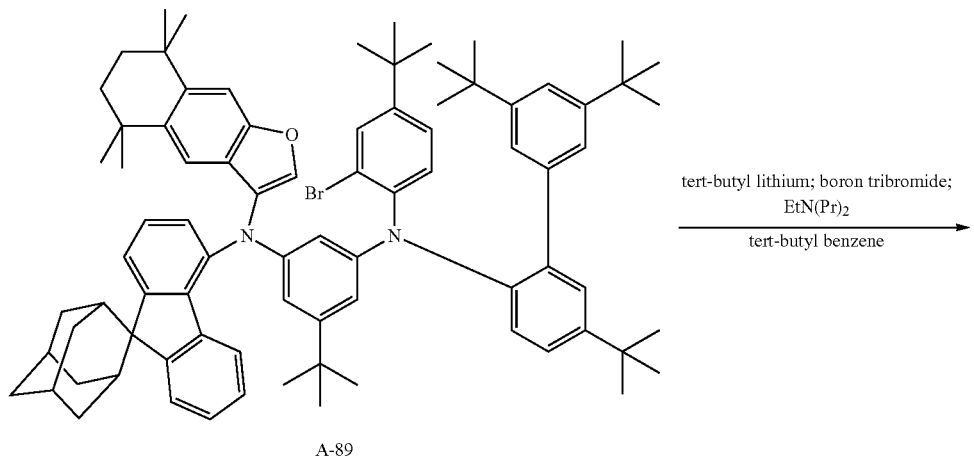

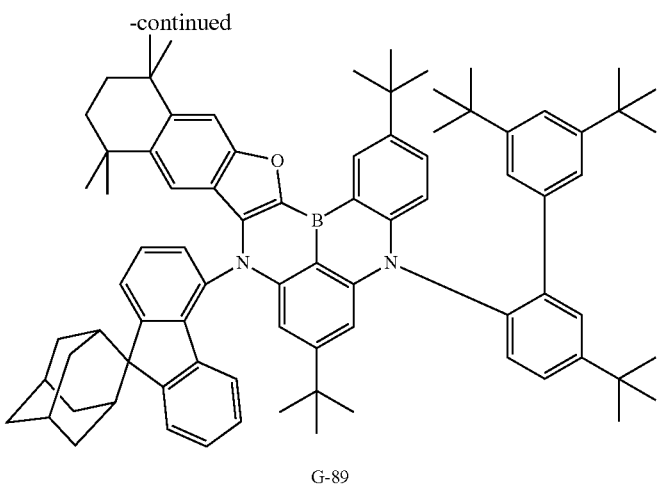
G-89
This method was the same as in Example 1, except that A-89 (10.14 g, 10 mmol) was used instead of A-1 to finally obtain product G-89: 1.23 g (yield: 13%), MS (m/z) (M+): 943.
Synthesis Example 11
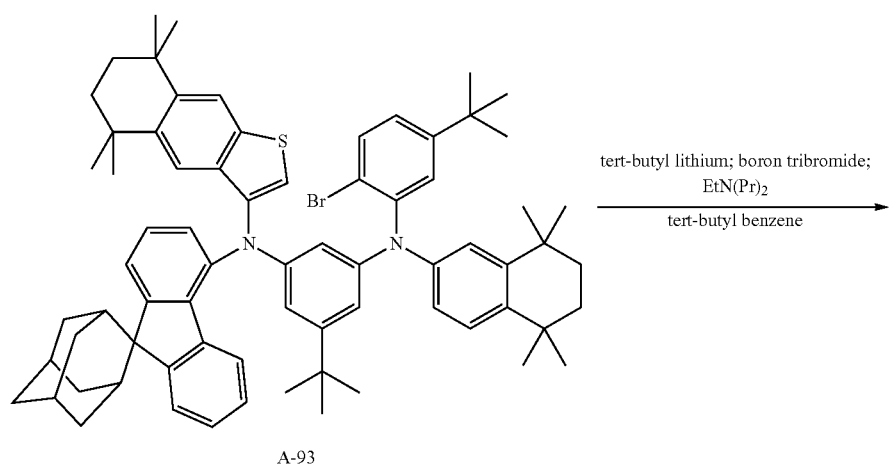
A-93
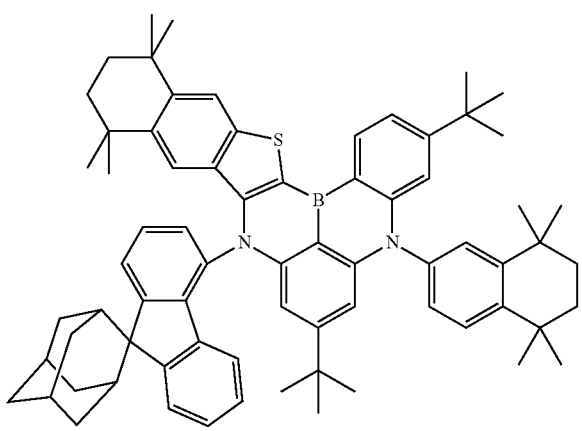
G-93

This method was the same as in Example 1, except that A-93 (10.88 g, 10 mmol) was used instead of A-1 to finally obtain product G-93: 1.42 g (yield: 14%), MS (m/z) (M+): 1017.

Synthesis Example 12

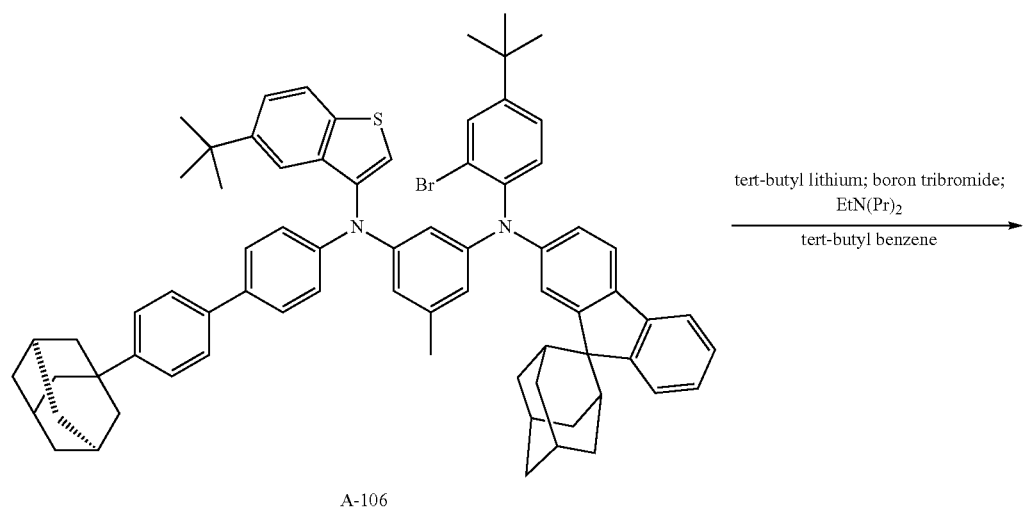

A-106

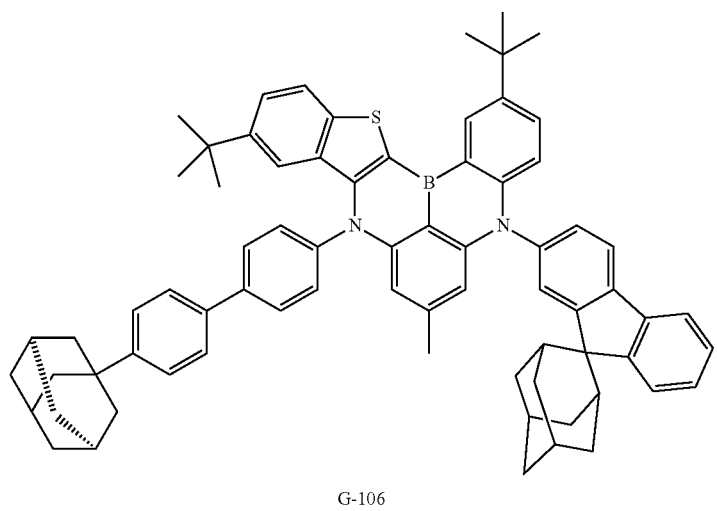

G-106

Figure 2:
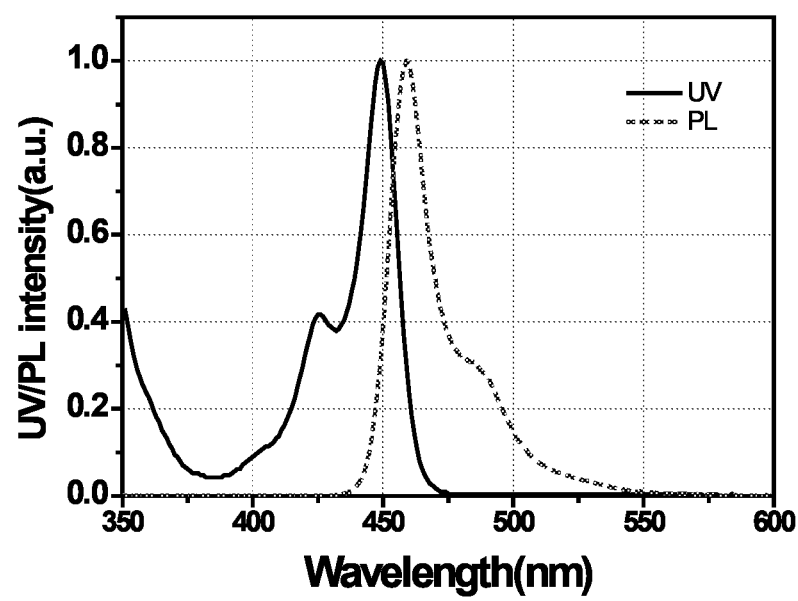
FIG. 2 is a UV-PL diagram of Example 12.

This method was the same as in Example 1, except that A-106 (12.48 g, 10 mmol) was used instead of A-1 to finally obtain product G-106: 0.94 g (yield: 8%), MS (m/z) (M+): 1176. As shown in FIG. 2, Compound G-106 had a peak width at half height of 20 nm and a peak value at 459 nm, and this compound had an extremely narrow peak width at half height and a sharp peak shape. The compound could significantly improve the luminous efficiency when applied to an organic electroluminescent device.

Synthesis Example 13
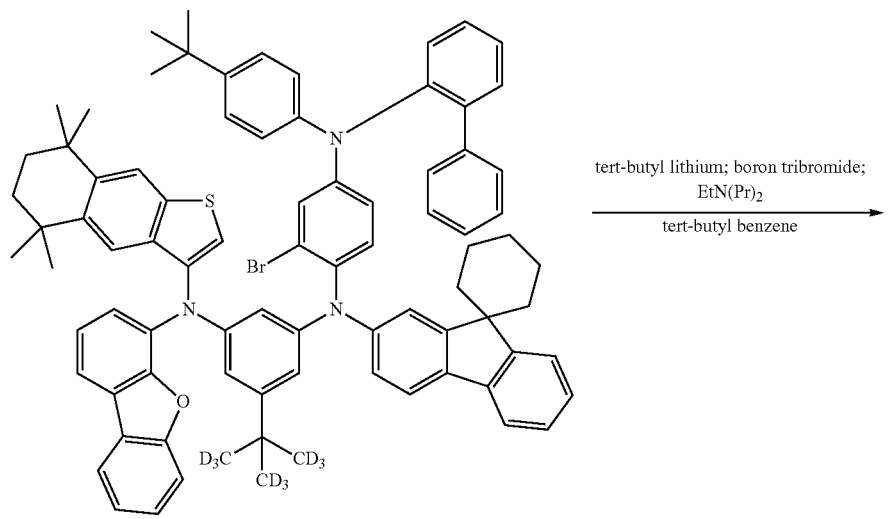
A-113
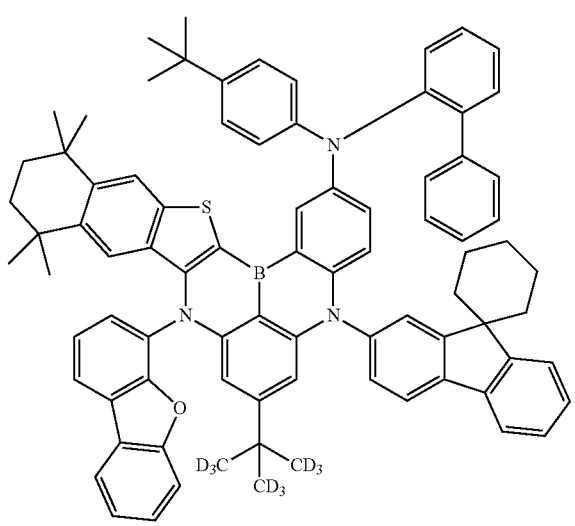
G-113
This method was the same as in Example 1, except that A-113 (12.69 g, 10 mmol) was used instead of A-1 to finally obtain product G-113: 1.32 g (yield: 11%), MS (m/z) (M+): 1197.

Synthesis Example 14
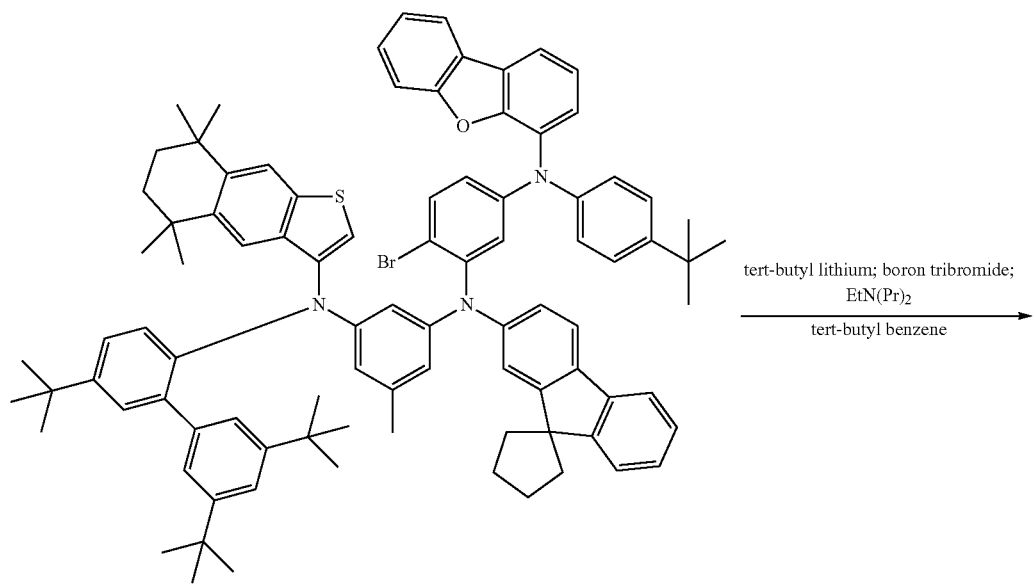
A-118
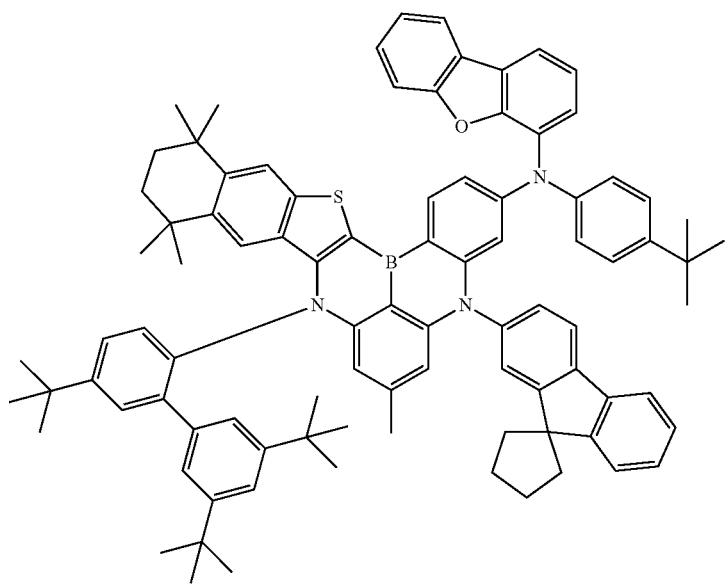
G-118
This method was the same as in Example 1, except that A-118 (13.72 g, 10 mmol) was used instead of A-1 to finally obtain product G-118: 1.3 g (yield: 10%), MS (m/z) (M+): 1301.

Synthesis Example 15
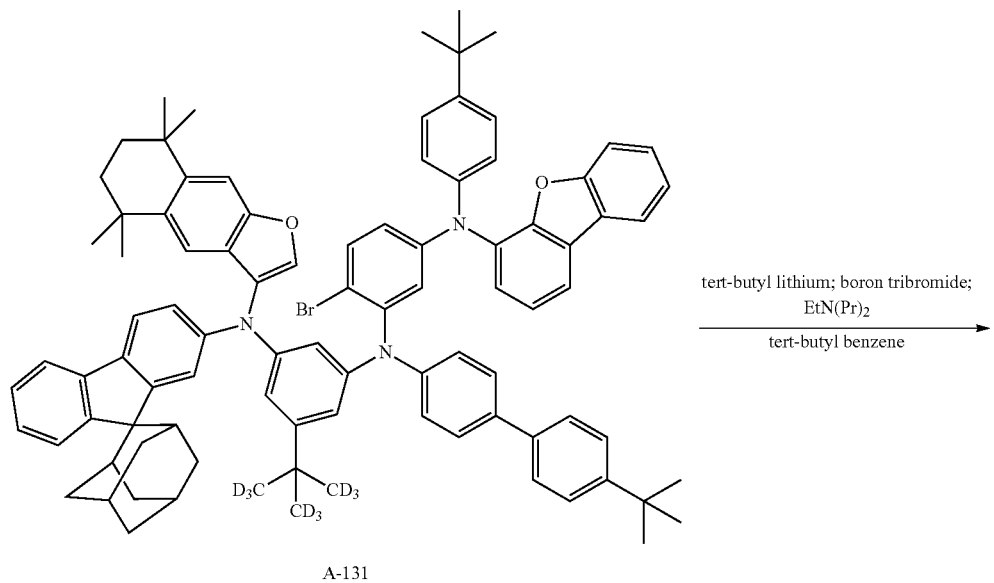
A-131
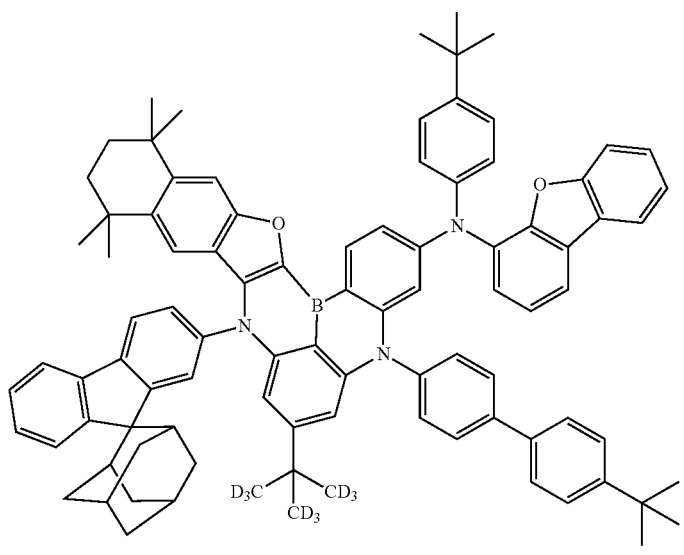
G-131
This method was the same as in Example 1, except that A-131 (13.61 g, 10 mmol) was used instead of A-1 to finally obtain product G-131: 1.42 g (yield: 11%), MS (m/z) (M+): 1290.

Synthesis Example 16
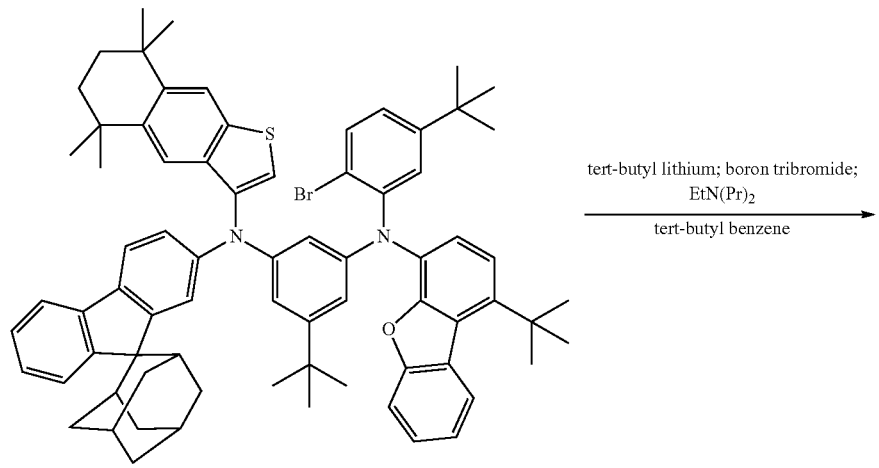
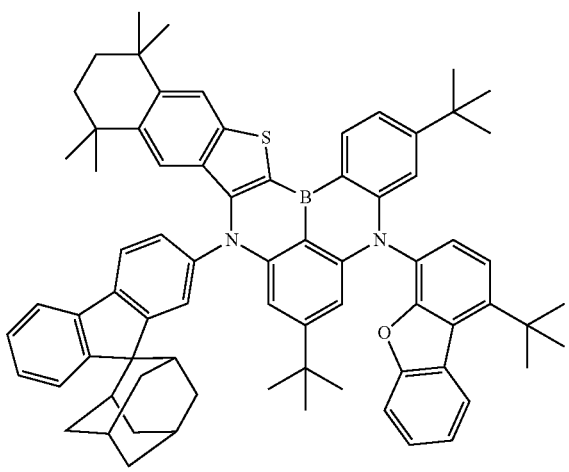
This method was the same as in Example 1, except that A-143 (11.24 g, 10 mmol) was used instead of A-1 to finally obtain product G-143: 1.47 g (yield: 14%), MS (m/z) (M+): 1053.

Synthesis Example 17
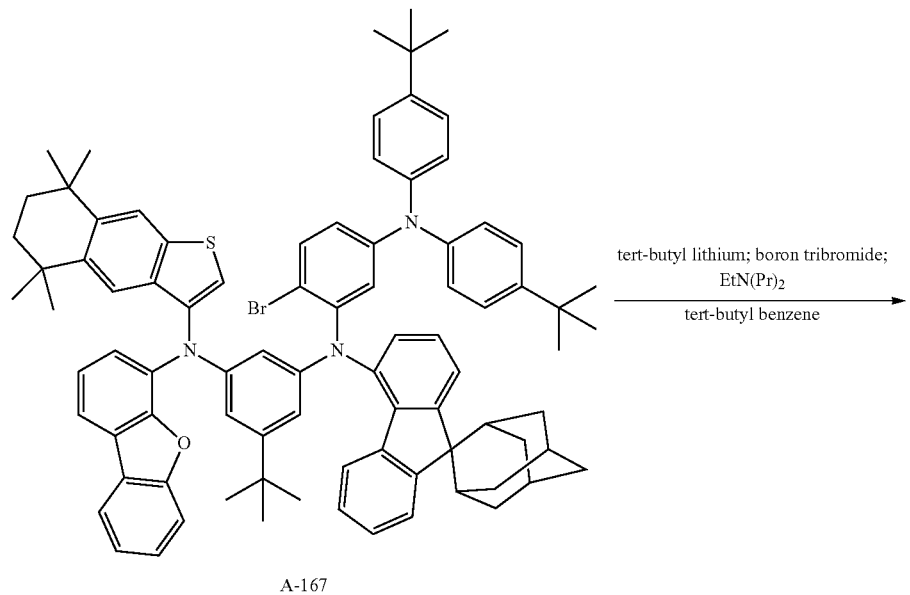
A-167
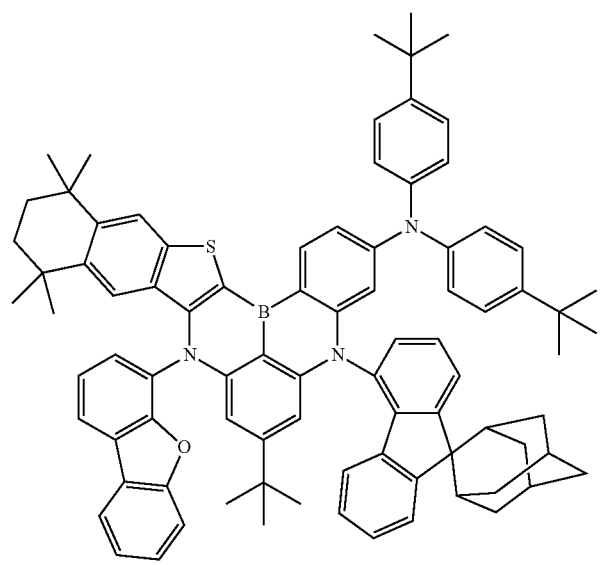
G-167
This method was the same as in Example 1, except that A-167 (12.92 g, 10 mmol) was used instead of A-1 to finally obtain product G-167: 0.98 g (yield: 8%), MS (m/z) (M+): 1221.

Synthesis Example 18
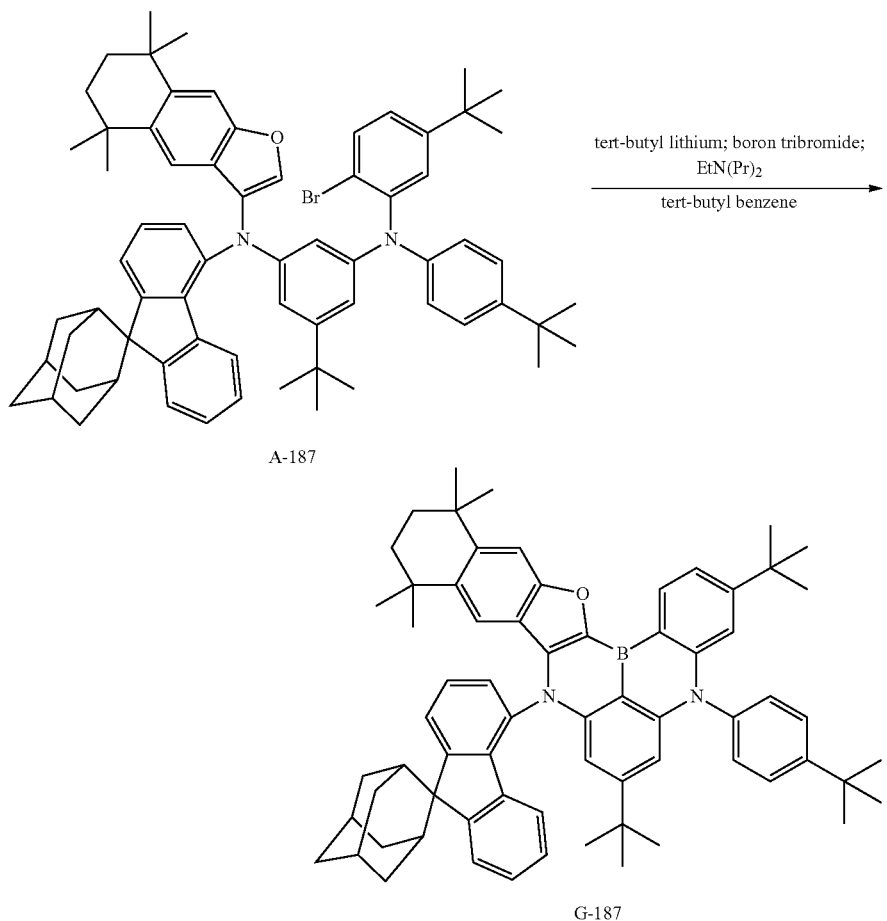
This method was the same as in Example 1, except that A-187 (10.18 g, 10 mmol) was used instead of A-1 to finally obtain product G-187: 1.42 g (yield: 15%), MS (m/z) (M+): 947.
Synthesis Example 19
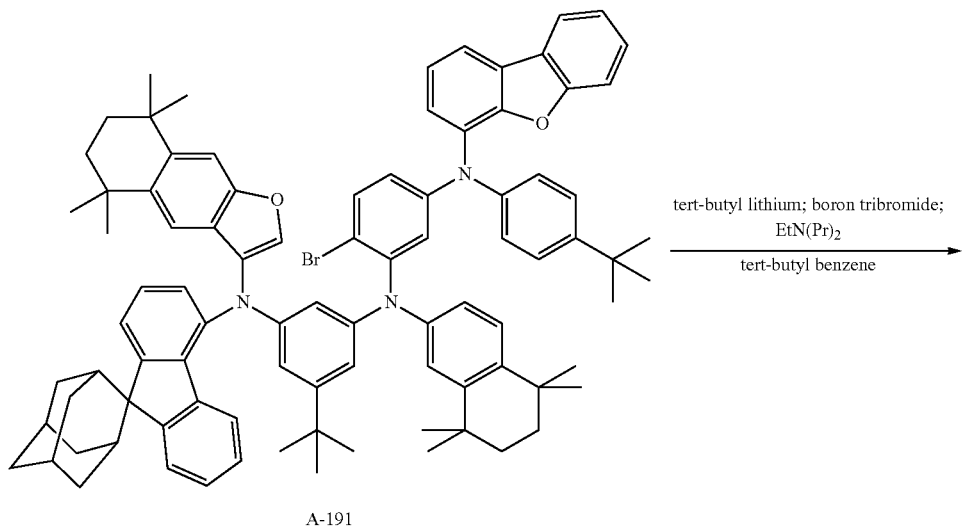

-continued
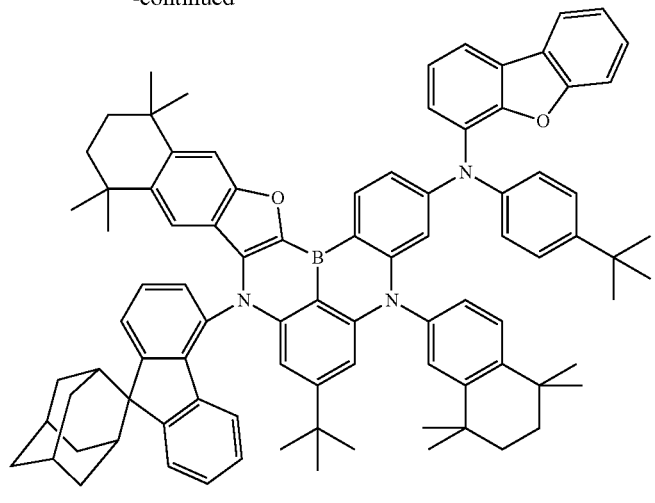
G-191
This method was the same as in Example 1, except that A-191 (13.3 g, 10 mmol) was used instead of A-1 to finally obtain product G-191: 1.76 g (yield: 14%), MS (m/z) (M+): 1259.
Synthesis Example 20
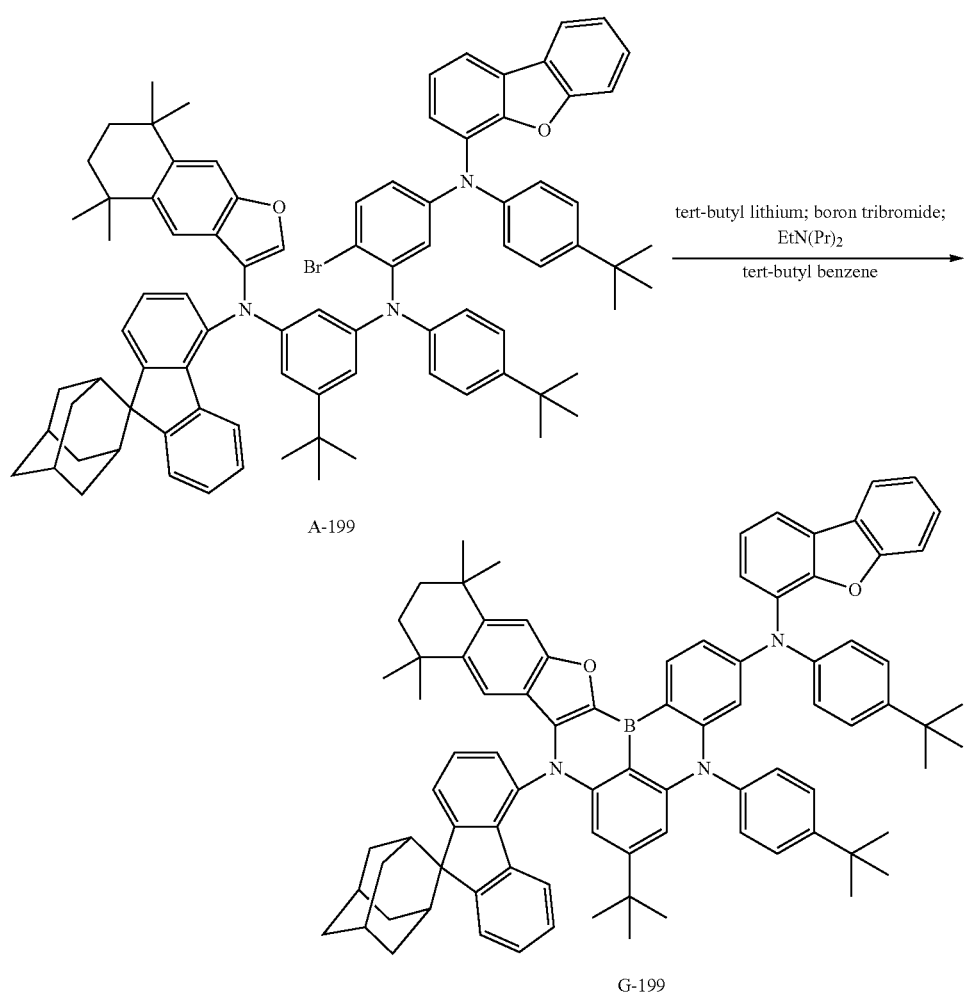

This method was the same as in Example 1, except that A-199 (12.76 g, 10 mmol) was used instead of A-1 to finally obtain product G-199: 1.2 g (yield: 10%), MS (m/z) (M+): 1204.

Manufacturing and Characterization of OLEDs

DEVICE EXAMPLES

The organic electroluminescent device provided by the present invention comprised an anode, a hole transport region, a luminescent layer, an electron transport region, and a cathode, which were arranged in this order on a substrate plate.

Furthermore, the hole transport region comprised a hole injection layer, a hole transport layer, and a luminescent auxiliary layer; and the electron transport region comprised an electron transport layer and an electron injection layer.

Furthermore, the luminescent layer was composed of a host material and a doping material, wherein the host material of the luminescent layer could be composed of one molecular material or a plurality of molecular materials.

The polycyclic compound of the present invention could be used for one or more layers of the above-mentioned organic electroluminescent devices, preferably for the doping material in the luminescent layer of the devices.

The anode in the example was an anode material commonly used in the art, such as ITO, Ag or a multilayer structure thereof. The hole injection layer was made of a hole injection material commonly used in the art and was doped with F4TCNQ, HATCN, NDP-9, etc. The hole transport layer was made of a hole transport material commonly used in the art. The luminescent layer was made of a luminescent material commonly used in the art. For example, it could be made of a host material and a doping material, wherein the doping material was a heteroatom- and cycloalkyl-containing organic compound provided by the present invention. The electron transport layer was made of an electron transport material commonly used in the art. The electron injection layer was made of an electron injection material commonly used in the art, such as Liq, LiF, and Yb. The cathode was made of a material commonly used in the art, such as the metals Al and Ag or metal mixtures (Ag-doped Mg, Ag-doped Ca, etc.).

The electrode preparation method and the deposition method for each functional layer in this example were both conventional methods in the art, such as vacuum thermal evaporation or ink-jet printing. No more detailed repetition would be given here, and only some process details and test methods in the preparation process were supplemented as follows:

Device Example 1

This example provided a blue-light organic electroluminescent device, the preparation method of which was as follows: firstly, on an ITO layer (anode) formed on a substrate, HTL and p-dopant (at a mass ratio of HTL to p-dopant of 97:3) were deposited in vacuo to a thickness of 10 nm to form a hole injection layer; secondly, on the above hole injection layer, HTL was deposited in vacuo to a thickness of 120 nm to form a hole transport layer; thirdly, on the above hole transport layer, B prime was deposited in vacuo to a thickness of 5 nm to form a luminescent auxiliary layer; again, on the above luminescent auxiliary layer, a mixture of BH and G-1 was deposited in vacuo to a thickness of 20 nm to form a luminescent layer, wherein BH acted as a host, G-1 acted as a dopant, and the mass ratio of the host to the dopant was 98:2; next, on the above luminescent layer, HBL was deposited in vacuo to a thickness of 5 nm to form a hole barrier layer; a mixture of ET and Liq (1:1) was deposited in vacuo to a thickness of 30 nm to form an electron transport layer; then, on the above electron transport layer, LiF was deposited to a thickness of 0.2 nm to form an electron injection layer; and finally, on the above electron injection layer, aluminum (Al) was deposited to a thickness of 150 nm to form a cathode, thereby preparing a blue-light organic electroluminescent device.

Except for the dopant in the luminescent layer, the molecular structural formulas of the materials in the other layers were as follows:

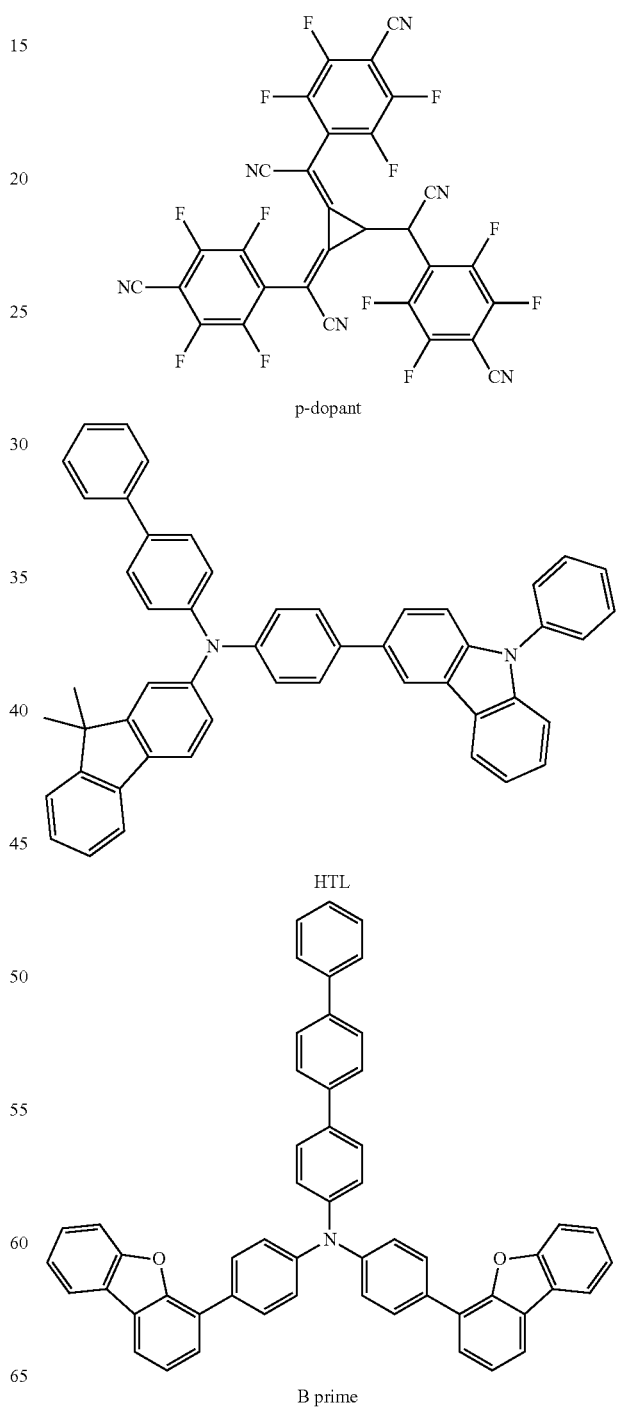

p-dopant

HTL

B prime

-continued

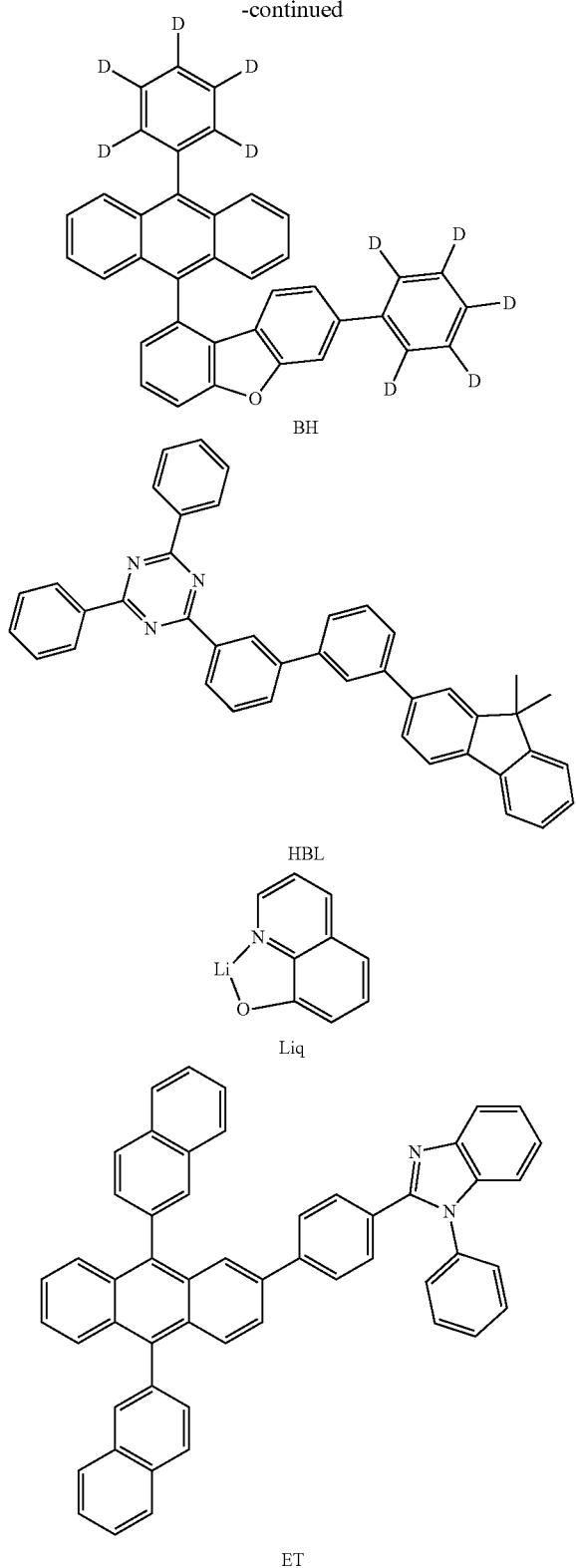

BH

HBL

Liq

ET

By means of the above method, the compounds described in the other examples were manufactured into organic electroluminescent devices, in which G-2, G-25, G-45, G-49, G-57, G-65, G-73, G-81, G-89, G-93, G-106, G-113, G-118, G-131, G-143, G-167, G-187, G-191, and G-199 were respectively used instead of G-1 to manufacture blue-light organic electroluminescent devices of Examples 2-20.

Comparative Device Examples

Using the above method, Comparative Compounds BD1-BD4 were manufactured into organic electroluminescent devices as Comparative Device Examples 1-4. In these comparative device examples, BD1-BD4 were respectively used instead of G-1 to manufacture blue-light organic electroluminescent devices as Comparative Device Examples 1-4, and the structures of BD1-BD4 were as shown below:

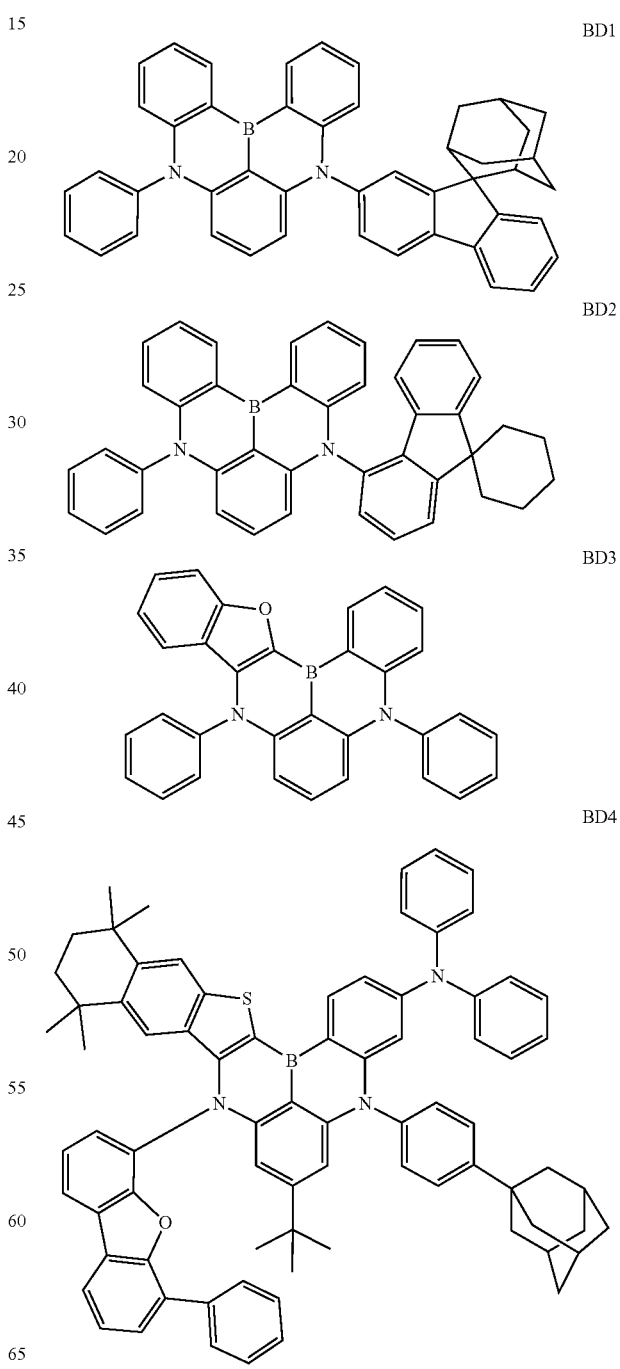

The OLED devices described above were tested by means of a standard method. In this regard, the organic electroluminescent devices were measured at a current density of $J=10$ mA/cm$^2$ for the driving voltage, brightness, electroluminescent current efficiency (measured as cd/A), and external quantum efficiency (EQE, measured by percentage). The lifetime LT was defined as the time for the brightness to decrease from the initial luminous brightness $L_0$, which was obtained at the time when it worked at a constant current J, to a specific proportion $L_1$. For example, the expressions $J=50$ mA/cm$^2$ and $L_1=90\%$ meant that during working at 50 mA/cm$^2$, the luminous brightness decreased to 90% of the initial value $L_0$ thereof after the time LT. Similarly, the expressions $J=20$ mA/cm$^2$ and $L_1=80\%$ meant that during working at 20 mA/cm$^2$, the luminous brightness decreased to 80% of the initial value $L_0$ thereof after the time LT.

The data of these OLED devices were summarized in Table 1. The parameters of the examples were compared with those of the comparative examples, and the performance data of these OLED devices were exhibited.

The test instruments and methods for testing the performance of the OLED devices of the above examples and comparative examples were as follows:

the brightness was tested by means of spectrum scanner PhotoResearch PR-635;

the current density and turn-on voltage were tested by digital SourceMeter Keithley 2400; and lifetime test: LT-96ch lifetime test device was used.

The performance test results of the above devices were listed in Table 1.

TABLE 1

Performance test results of blue-light devices

| No. | Vop (V) | EQE (%) | @ J = 10 mA/cm$^2$ LT95 (h) | Color |
|---|---|---|---|---|
| G-1 | 3.98 | 8.88 | 192 | Blue |
| G-2 | 4.06 | 8.68 | 216 | Blue |
| G-25 | 4.01 | 8.41 | 214 | Blue |
| G-45 | 4.04 | 8.41 | 191 | Blue |
| G-49 | 4.09 | 8.13 | 216 | Blue |
| G-57 | 4.10 | 8.72 | 212 | Blue |
| G-65 | 3.99 | 8.52 | 197 | Blue |
| G-73 | 3.94 | 8.66 | 195 | Blue |
| G-81 | 3.99 | 8.16 | 205 | Blue |
| G-89 | 3.96 | 9.48 | 218 | Blue |
| G-93 | 3.97 | 9.22 | 201 | Blue |
| G-106 | 4.10 | 8.15 | 202 | Blue |
| G-113 | 3.93 | 8.93 | 193 | Blue |

TABLE 1-continued

Performance test results of blue-light devices

| No. | Vop (V) | EQE (%) | @ J = 10 mA/cm$^2$ LT95 (h) | Color |
|---|---|---|---|---|
| G-118 | 4.06 | 9.48 | 213 | Blue |
| G-131 | 3.94 | 8.29 | 183 | Blue |
| G-143 | 4.07 | 8.13 | 209 | Blue |
| G-167 | 3.95 | 8.07 | 213 | Blue |
| G-187 | 3.99 | 8.58 | 193 | Blue |
| G-191 | 3.99 | 8.89 | 188 | Blue |
| G-199 | 3.99 | 9.10 | 202 | Blue |
| BD1 | 4.08 | 4.28 | 108 | Blue |
| BD2 | 4.13 | 4.30 | 104 | Blue |
| BD3 | 3.90 | 4.17 | 105 | Blue |
| BD4 | 4.02 | 4.08 | 103 | Blue |

From the device performance test results in Table 1 above, it could be seen that when the organic compound of the present invention was used in an organic electroluminescent device, the efficiency and lifetime of the organic electroluminescent device were significantly improved as compared with the comparative examples. This was because the organic compound of the present invention incorporated a fluorene structure containing a cycloalkyl group having a large steric hindrance, by which the horizontal orientation of the material was increased due to the large-plane fluorene structure; moreover, the cycloalkyl group with a large steric hindrance could effectively avoid reduced efficiency and lifetime caused by concentration quenching effect; furthermore, the introduced heteroatom-containing five-membered heteroaromatic ring structure further improved the luminous efficiency due to the heavy atom effect; hence, as compared with the comparative examples, the material of the present invention had an excellent efficiency and lifetime performance. Therefore, it could be proved that the compounds provided by the present invention were well-performed blue luminescent materials and had practical value.

Obviously, the above examples of the present invention are only examples for clearly explaining the present invention and are not intended to limit the embodiments of the present invention. For those of ordinary skill in the art, other changes or variations in different forms may also be made on the basis of the above description. It is impossible to exhaust all the embodiments herein, and all derived obvious changes or variations that belong to the technical solution of the present invention still fall within the scope of protection of the present invention.

The invention claimed is:

1. An organic compound selected from any one of the following compounds:

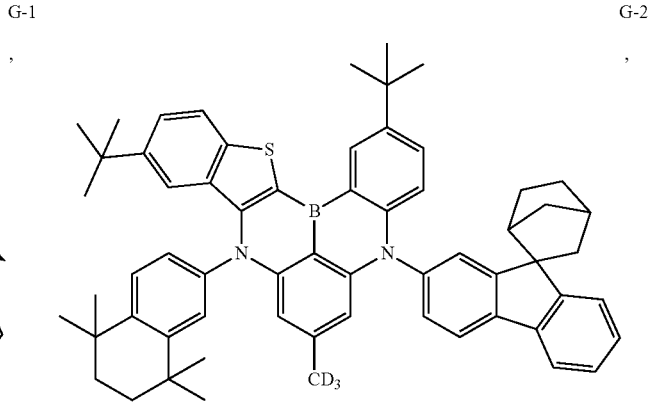

-continued
G-9
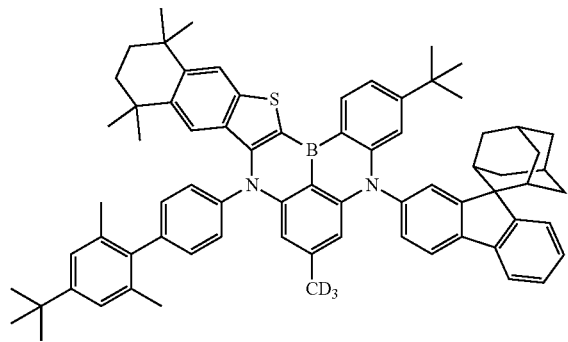
G-10
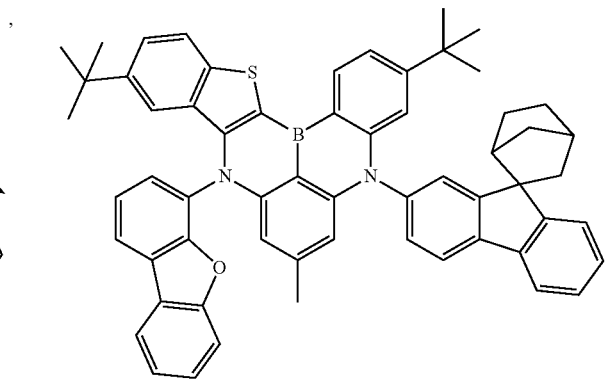
G-13
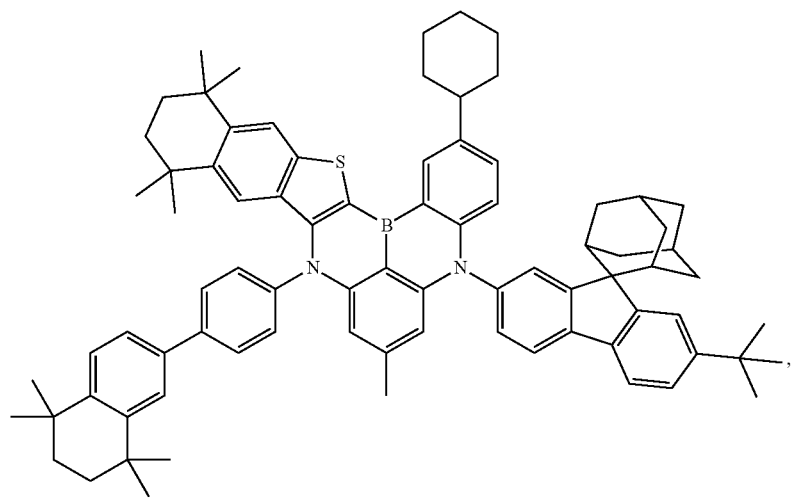
G-26
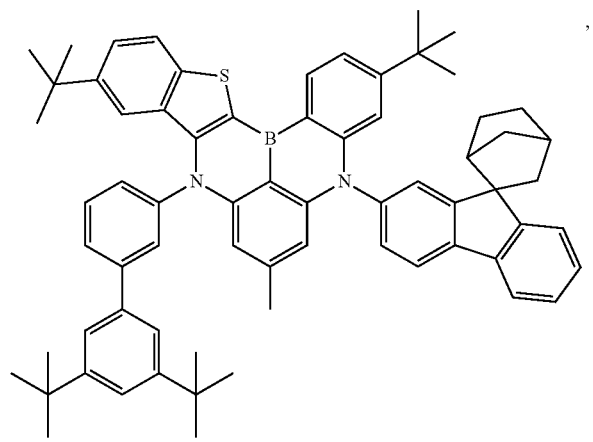
G-49
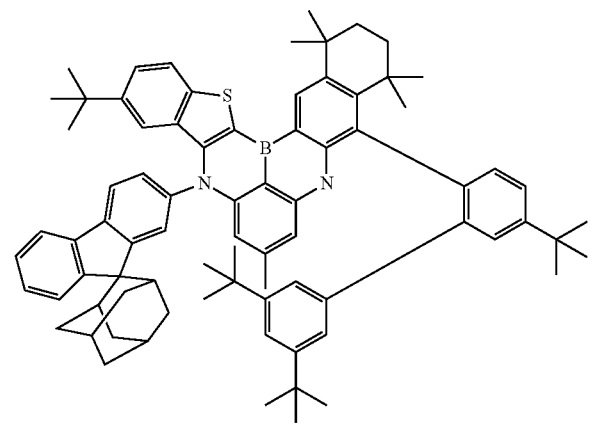

-continued
G-57
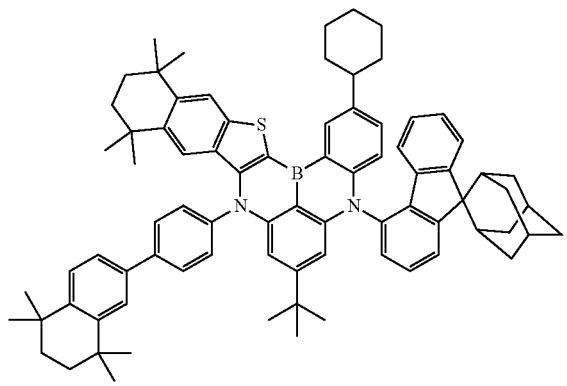
G-58
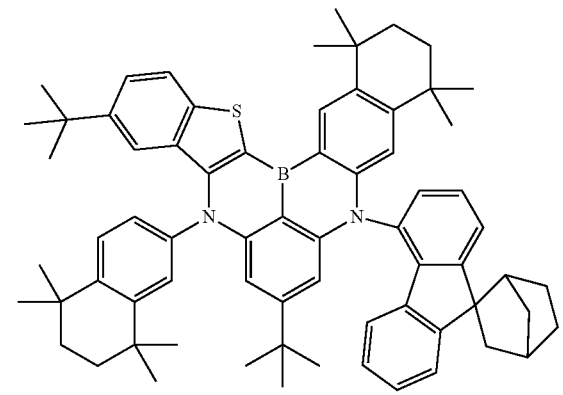
G-61
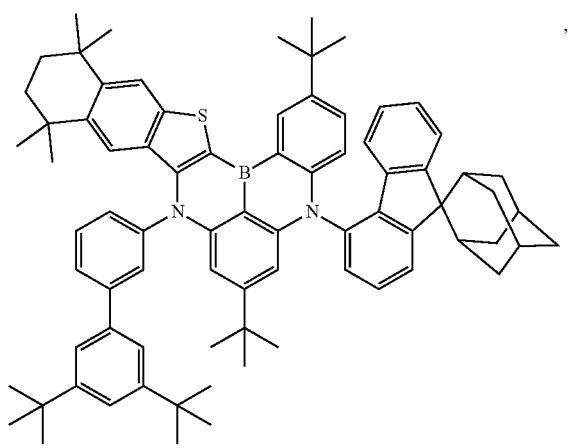
G-66
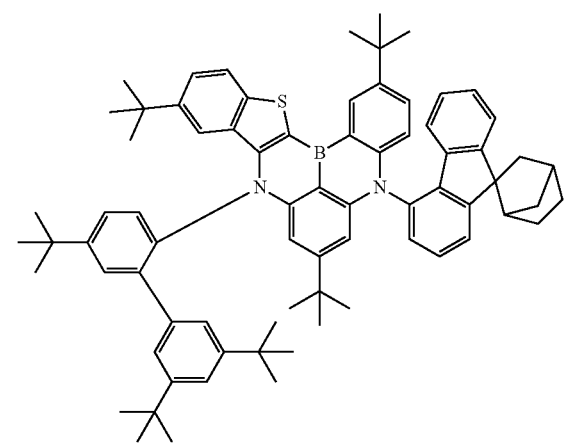
G-69
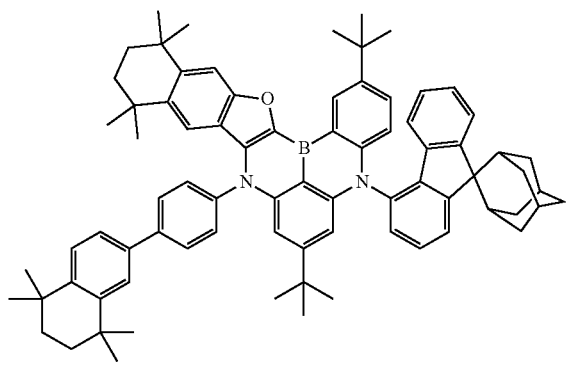
G-78
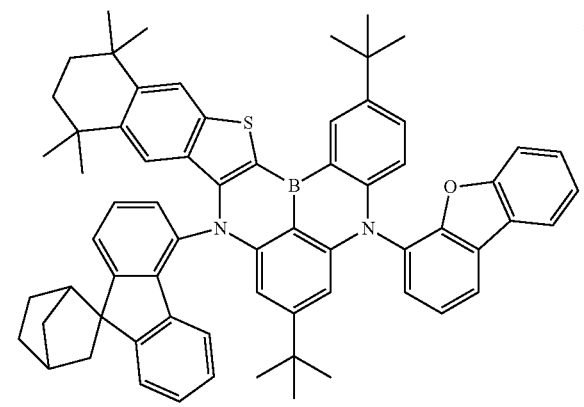

-continued
G-81
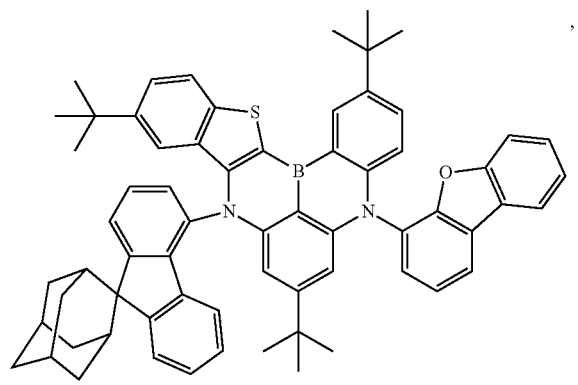
G-89
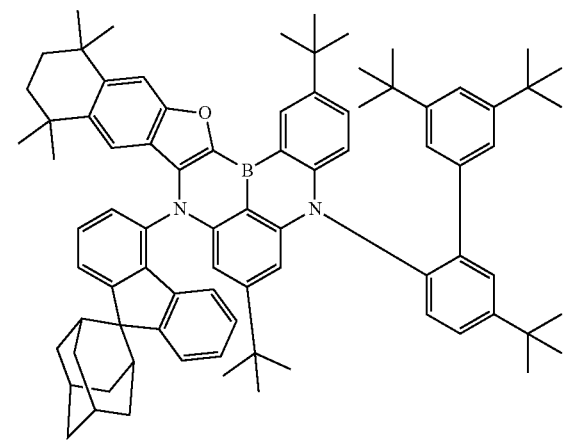
G-90
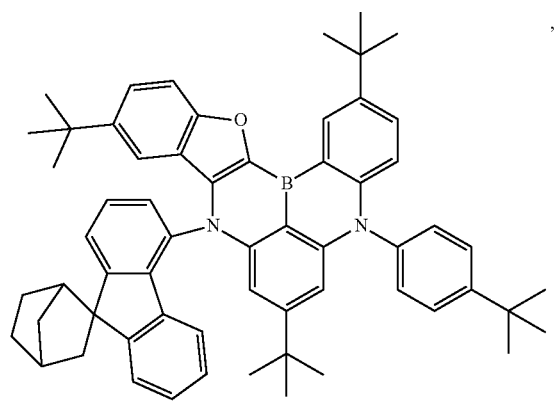
G-93
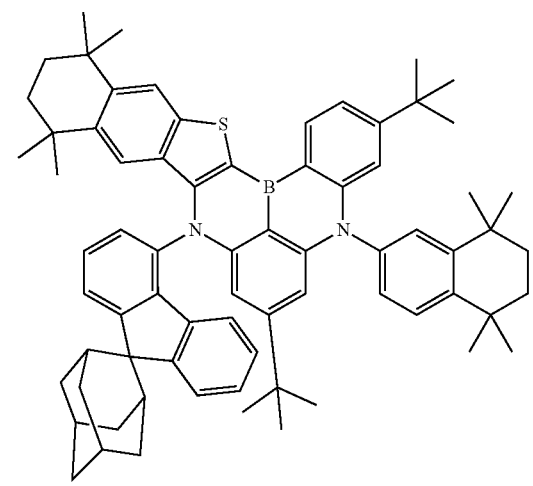
G-106
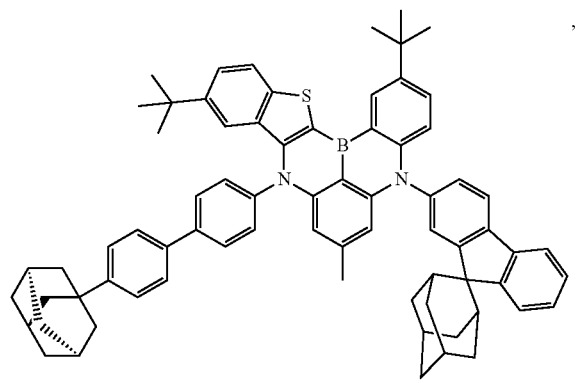
G-108
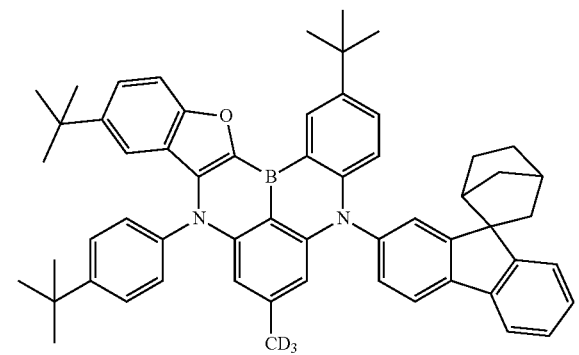

-continued
G-112
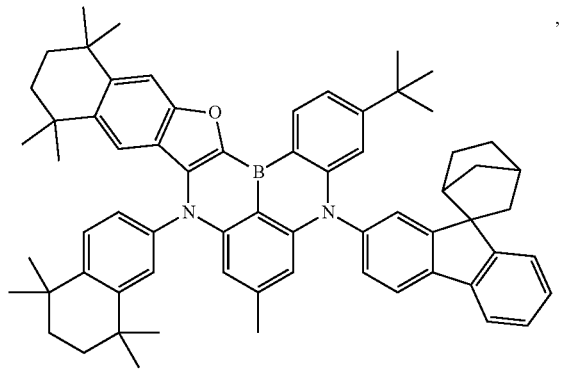
G-114
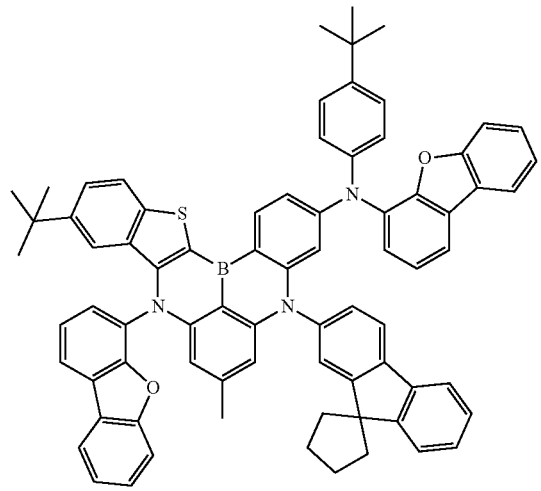
G-115
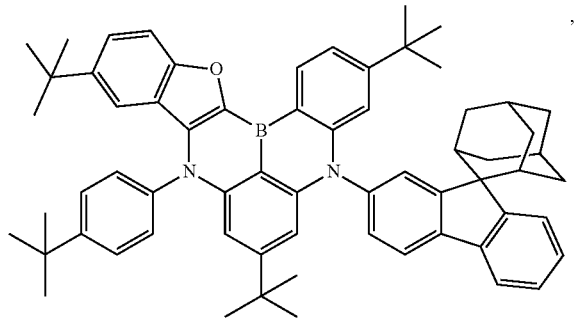
G-116
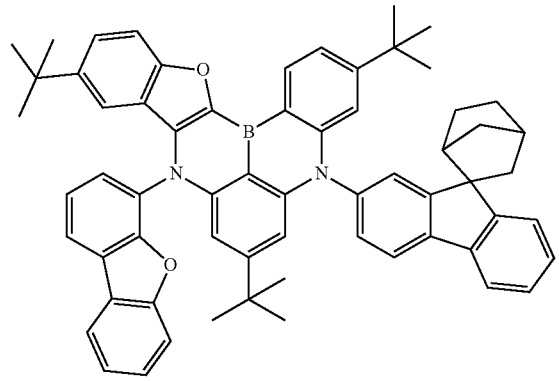
G-120
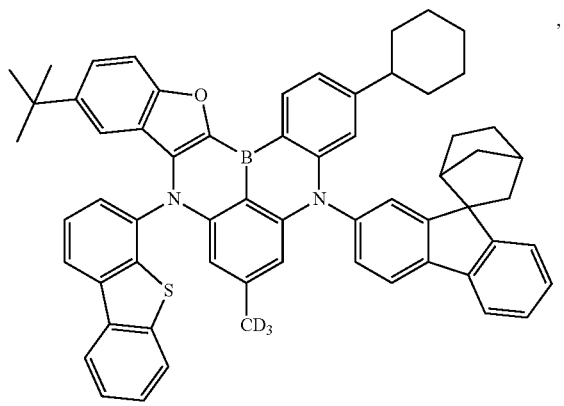
G-121
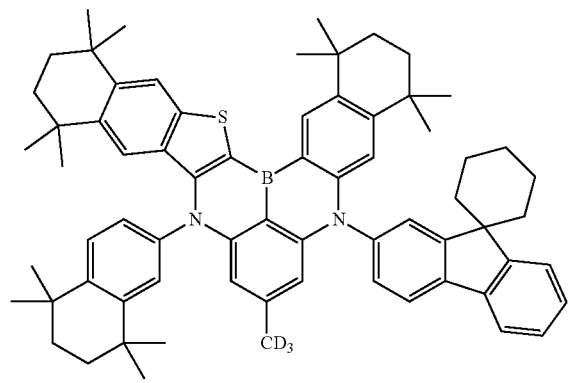

-continued
G-129
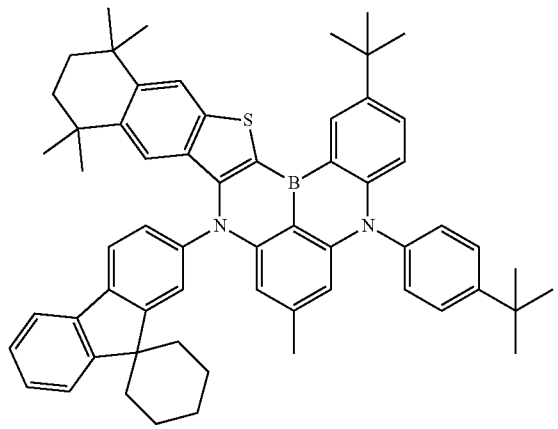,
G-132
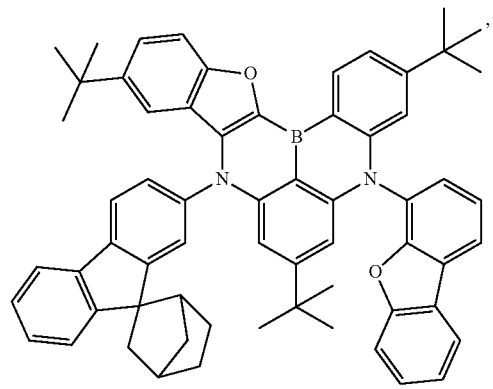,
G-134
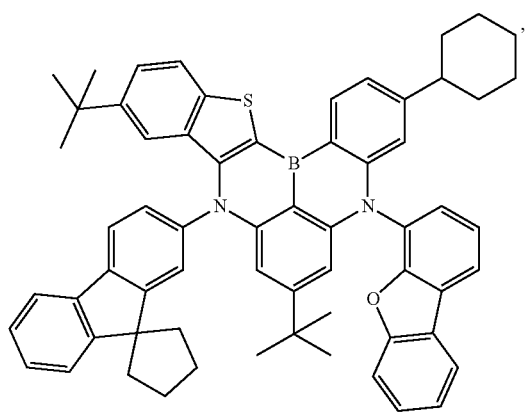,
G-136
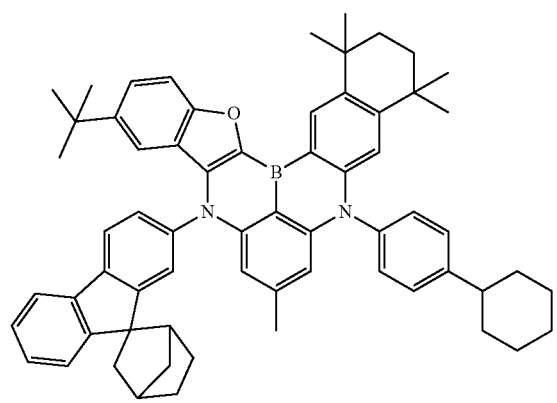,
G-143
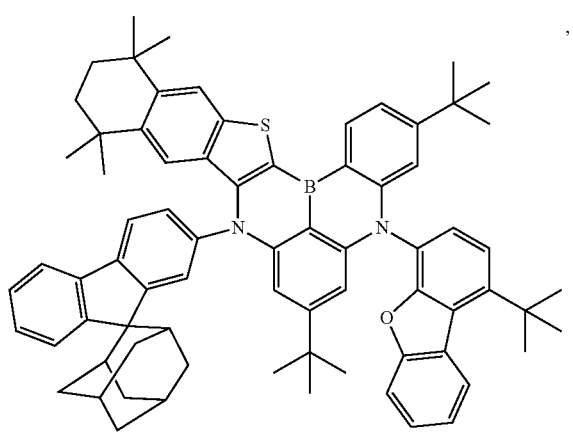,
G-160
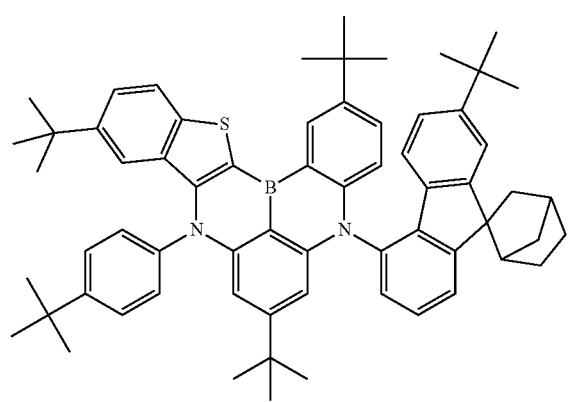, -continued
G-168
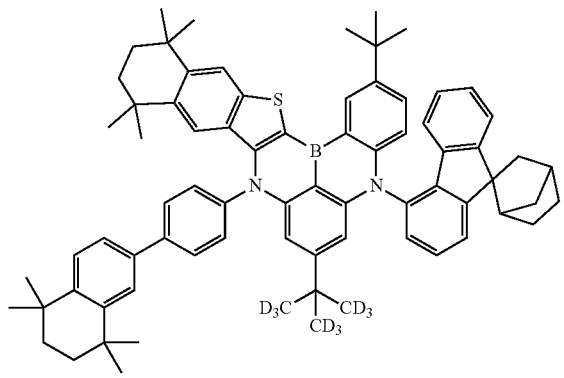
G-169
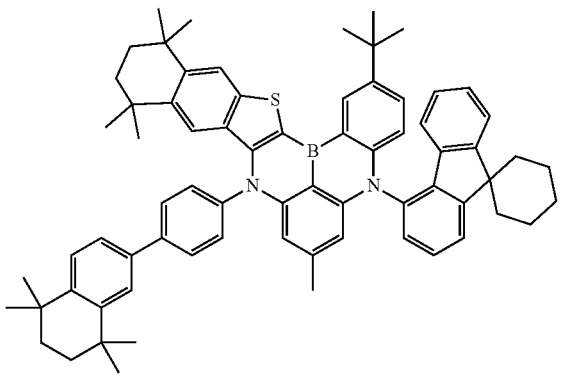
G-170
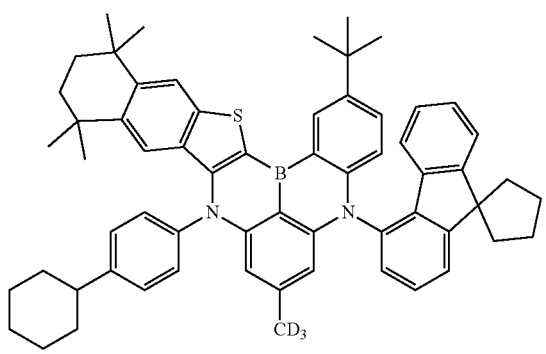
G-181
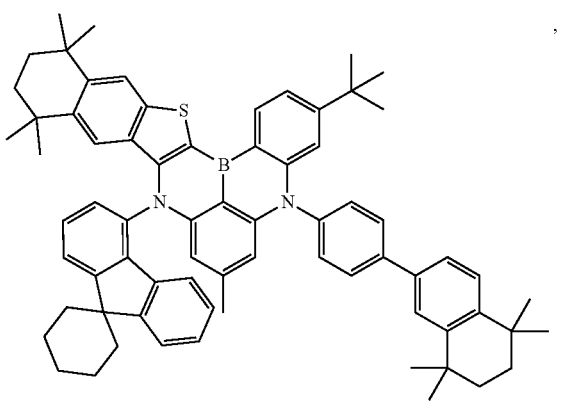
G-182
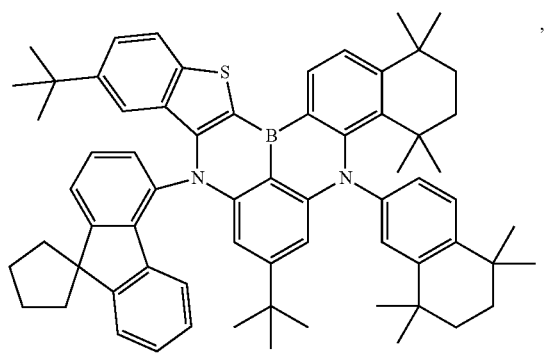
G-184
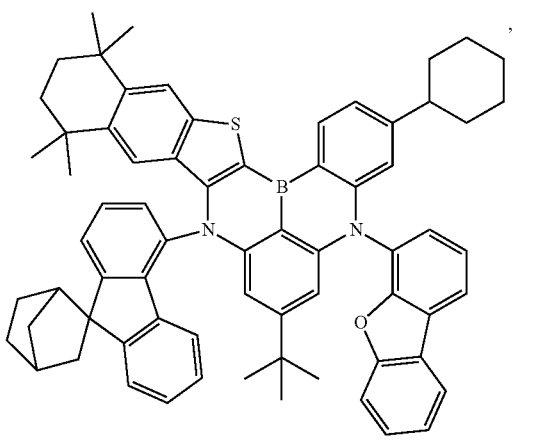

-continued
G-186
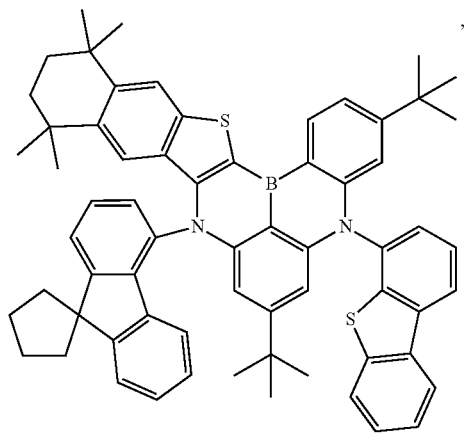
G-187
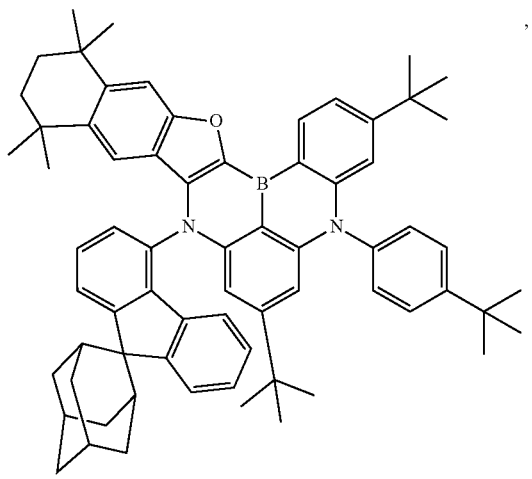
G-188
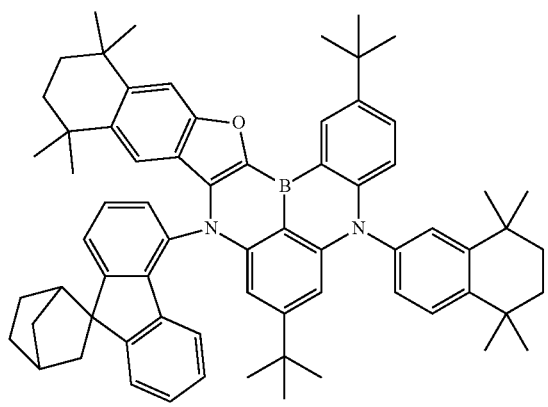
G-198
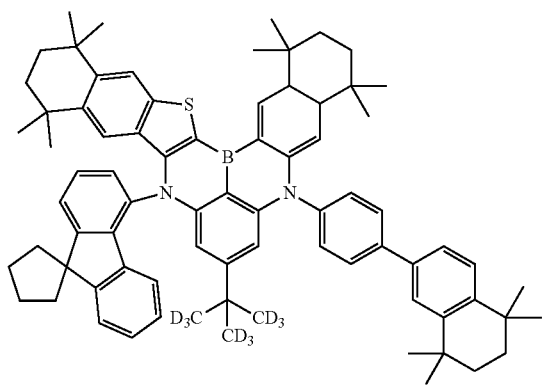
G-201
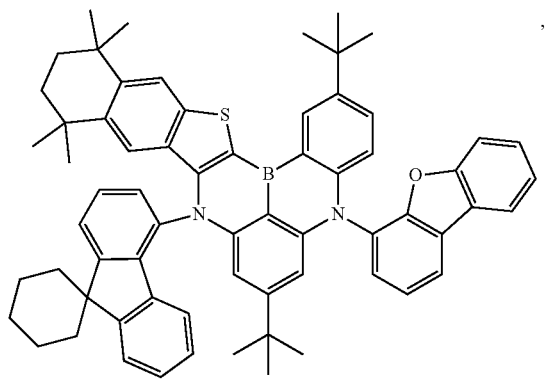
G-223
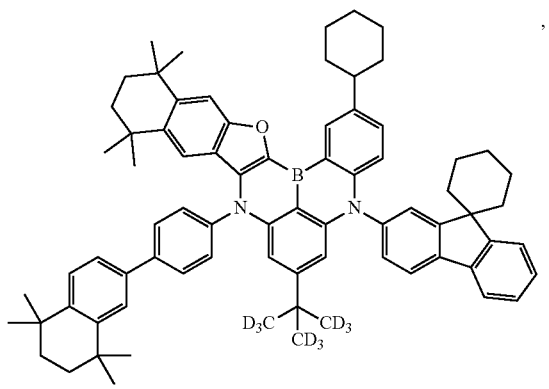

-continued

G-243

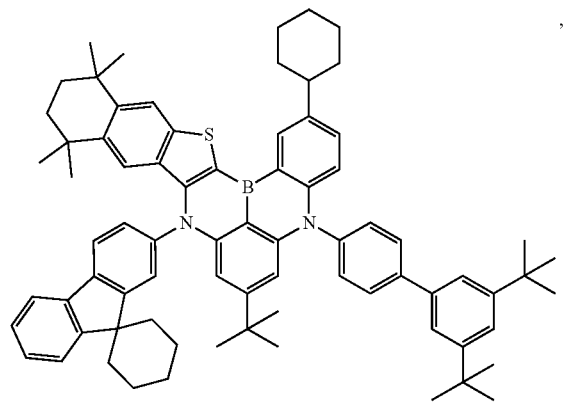

G-275

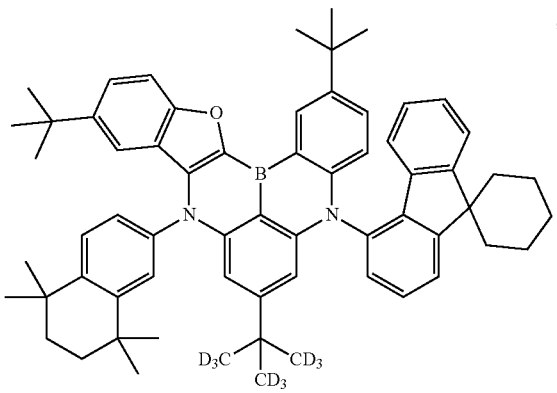

G-303

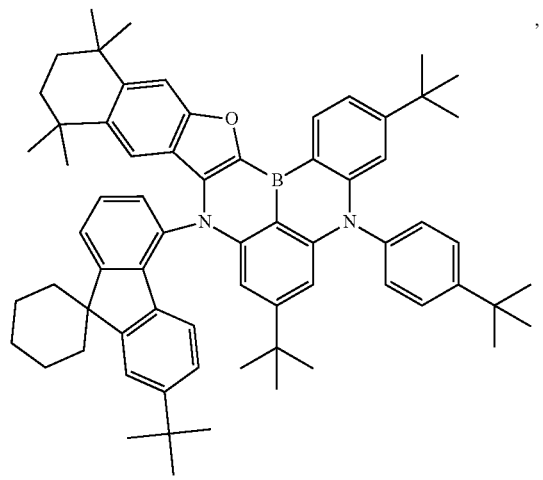

, and

G-304

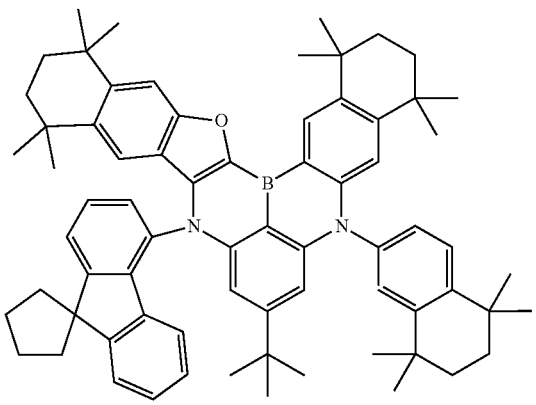

2. An organic electroluminescent device, characterized by comprising an anode, a hole transport region, a luminescent layer, an electron transport region, and a cathode, which are arranged in this order on a substrate plate, wherein the luminescent layer comprises one or more organic compounds according to claim 1.

3. An organic electroluminescent device, characterized by comprising an anode, a hole transport region, a luminescent layer, an electron transport region, and a cathode, which are arranged in this order on a substrate plate, and characterized in that the luminescent layer comprises a host material and a doping material, wherein the doping material comprises one or more organic compounds according to claim 1.

* * * * *